United States Patent
Mizuta et al.

(10) Patent No.: US 10,153,424 B2
(45) Date of Patent: Dec. 11, 2018

(54) SEMICONDUCTOR DEVICE AND MOUNTING STRUCTURE OF SEMICONDUCTOR DEVICE

(71) Applicant: ROHM CO., LTD., Kyoto-shi, Kyoto (JP)

(72) Inventors: Shinsei Mizuta, Kyoto (JP); Satohiro Kigoshi, Kyoto (JP); Takaaki Masaki, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 15/671,925

(22) Filed: Aug. 8, 2017

(65) Prior Publication Data

US 2018/0053891 A1 Feb. 22, 2018

(30) Foreign Application Priority Data

Aug. 22, 2016 (JP) .................. 2016-162013
Aug. 3, 2017 (JP) .................. 2017-150970

(51) Int. Cl.
*H01L 43/04* (2006.01)
*H01L 23/00* (2006.01)
(Continued)

(52) U.S. Cl.
CPC .......... *H01L 43/04* (2013.01); *H01L 21/4828* (2013.01); *H01L 21/561* (2013.01); *H01L 21/568* (2013.01); *H01L 24/48* (2013.01); *H01L 24/97* (2013.01); *H01L 43/065* (2013.01); *H01L 2221/68372* (2013.01);
(Continued)

(58) Field of Classification Search
CPC ... H01L 43/04; H01L 21/4828; H01L 21/561; H01L 21/568; H01L 24/48; H01L 24/97; H01L 43/065; H01L 2221/68372; H01L 2224/48091; H01L 2224/48101; H01L 2224/48175; H01L 2224/95001;
(Continued)

(56) References Cited

U.S. PATENT DOCUMENTS 5,157,475 A * 10/1992 Yamaguchi ............. H01L 21/56
257/679
6,605,866 B1 * 8/2003 Crowley ............. H01L 23/3107
257/692
(Continued)

FOREIGN PATENT DOCUMENTS

JP 2005-277034 A 10/2005
JP 2014-86677 A 5/2014

*Primary Examiner* — Karen Kusumakar
(74) *Attorney, Agent, or Firm* — Hamre, Schumann, Mueller & Larson, P.C.

(57) ABSTRACT

The present disclosure provides a semiconductor device. The semiconductor device includes a semiconductor element, a plurality of terminals, and a sealing resin. The semiconductor element has a front surface and a back surface. The front surface and the back surface face in opposite directions to each other in a thickness direction of the semiconductor element. The plurality of terminals are disposed at a distance from the semiconductor element and are electrically connected to the front surface. The sealing resin has a first surface facing in a same direction as the direction in which the front surface faces. Each of the plurality of terminals has a main surface exposed from the first surface.

35 Claims, 56 Drawing Sheets

(51) Int. Cl.
*H01L 21/56* (2006.01)
*H01L 21/48* (2006.01)
*H01L 43/06* (2006.01)

(52) U.S. Cl.
CPC .......... *H01L 2224/48091* (2013.01); *H01L 2224/48101* (2013.01); *H01L 2224/48175* (2013.01); *H01L 2224/95001* (2013.01); *H01L 2924/10329* (2013.01); *H01L 2924/1711* (2013.01); *H01L 2924/17151* (2013.01); *H01L 2924/182* (2013.01)

(58) Field of Classification Search
CPC ... H01L 2924/10329; H01L 2924/1711; H01L 2924/1715; H01L 2924/18
See application file for complete search history.

(56) References Cited

U.S. PATENT DOCUMENTS

| | | | | |
|---|---|---|---|---|
| 7,691,674 | B1* | 4/2010 | Bathan | H01L 23/3107 438/109 |
| 7,709,935 | B2* | 5/2010 | Islam | H01L 21/4832 257/666 |
| 8,018,036 | B2* | 9/2011 | Goh | H01L 21/561 257/676 |
| 8,643,166 | B2* | 2/2014 | Camacho | H01L 23/49582 257/692 |
| 8,766,428 | B2* | 7/2014 | Camacho | H01L 23/3107 257/684 |
| 2002/0027273 | A1* | 3/2002 | Huang | H01L 23/3107 257/678 |
| 2008/0174981 | A1* | 7/2008 | Chan | H01L 21/4828 361/813 |
| 2012/0074544 | A1* | 3/2012 | Masuda | H01L 21/4832 257/673 |

* cited by examiner

SEMICONDUCTOR DEVICE AND MOUNTING STRUCTURE OF SEMICONDUCTOR DEVICE

FIELD

The present disclosure relates to a semiconductor device and a mounting structure of a semiconductor.

BACKGROUND

Semiconductor devices in which semiconductor elements are Hall elements, for example, are applied to various electronic devices such as mobile phones. For example, in the case of controlling the light source of the display of a mobile phone, application of such a semiconductor device enables control for turning the light source on and off to be performed, by opening and closing the main body of the mobile phone.

SUMMARY

A first aspect of the present disclosure provides a semiconductor device. The semiconductor device includes a semiconductor element, a plurality of terminals, and a sealing resin. The semiconductor element has a front surface and a back surface. The front surface and the back surface face in opposite directions to each other in a thickness direction of the semiconductor element. The plurality of terminals are disposed at a distance from the semiconductor element and are electrically connected to the front surface. The sealing resin has a first surface facing in a same direction as the direction in which the front surface faces. Each of the plurality of terminals has a main surface exposed from the first surface.

A second aspect of the present disclosure provides a mounting structure of a semiconductor device. The mounting structure includes the semiconductor device provided by the first aspect of the present disclosure, a wiring board, and a conductive joining layer. The semiconductor device is mounted on the wiring board. The conductive joining layer joins the semiconductor device to the wiring board. The insulation film opposes the wiring board. The conductive joining layer contacts the external conductive layer.

A third aspect of the present disclosure provides a mounting structure of a semiconductor device. The mounting structure includes the semiconductor device provided by the first aspect of the present disclosure, a wiring board, and a conductive joining layer. The semiconductor device is mounted on the wiring board. The conductive joining layer joins the semiconductor device to the wiring board. The first surface opposes the wiring board. The conductive joining layer contacts the external conductive layer.

Other features and advantages of the present disclosure are discussed in detail descriptions below with reference to the attached drawings.

DRAWINGS

EMBODIMENTS

First Embodiment

Figure 1:
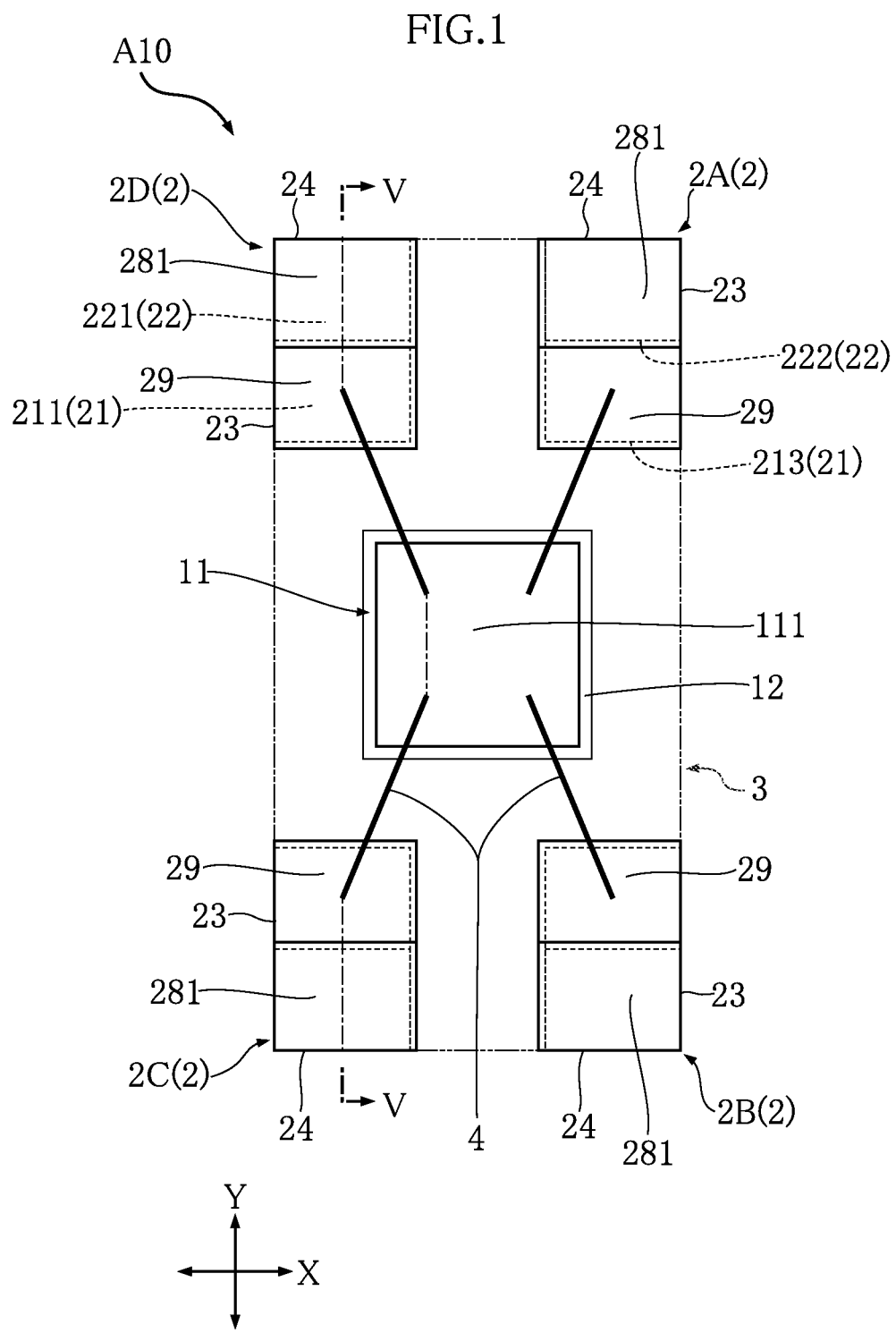
FIG. 1 is a plan view (sealing resin shown as see-through) of a semiconductor device according to a first embodiment of the present disclosure.

A semiconductor device A10 according to a first embodiment of the present disclosure will be described, based on FIG. 1 to FIG. 5. The semiconductor device A10 includes a semiconductor element 11, an insulation layer 12, a plurality of terminals 2, a sealing resin 3, and a wire 4.

FIG. 1 is a plan view of the semiconductor device A10, with the sealing resin 3 being shown as see-through, for convenience of understanding. In FIG. 1, the outer shape of the see-through sealing resin 3 is shown with an imaginary line (two-dot chain line). FIG. 5 is a cross-sectional view along a V-V line (one-dot chain line shown in FIG. 1) of FIG. 1. Also, in FIG. 1 to FIG. 5, the reference signs of similar constituent elements that are duplicated with regard to the terminals 2 are omitted.

The semiconductor device A10 shown in these diagrams is for being surface mounted on the wiring board of various electronic devices such as mobile phones. The semiconductor device A10 is rectangular when viewed in a thickness direction Z (hereinafter, "plan view") of the semiconductor element 11. Here, for convenience of description, the short direction of the semiconductor device A10 that is orthogonal to the thickness direction Z of the semiconductor element 11 (hereinafter, simply "the thickness direction Z") will be referred to as a first direction X, and the long direction of the semiconductor device A10 that is orthogonal to both the thickness direction Z and the first direction X will be referred to as a second direction Y.

The semiconductor element 11 is a portion that serves as the center of the functions of the semiconductor device A10. As shown in FIG. 1, the semiconductor element 11 is rectangular in plan view. The semiconductor element 11 is a Hall element. The semiconductor device A10 is thus a magnetic sensor (Hall IC). Also, the Hall element according to the present embodiment is a GaAs Hall element. A GaAs Hall element has the advantage of not being readily affected by temperature change, as well as having excellent Hall voltage linearity with respect to change in magnetic flux density. As shown in FIG. 5, the semiconductor element 11 has a front surface 111 and a back surface 112 that face in opposite directions to each other in the thickness direction Z. The front surface 111 is a surface that is covered by the sealing resin 3. In the present embodiment, a plurality of electrode pads (illustration omitted) that are constituted from Al, for example, are formed on the front surface 111. The wire 4 is connected to each of the electrode pads. The back surface 112 is a surface that contacts the insulation layer 12. Also, in the present embodiment, a magnetosensitive layer 113 that is in proximity to the back surface 112 of the semiconductor element 11 and detects change in magnetic flux density is formed.

The insulation layer 12, as shown in FIG. 1 and FIG. 5, is a portion that is disposed in contact with the back surface 112 of the semiconductor element 11, and that is an electrical insulator. The upper edge of the insulation layer 12 shown in FIG. 5 contacts the back surface 112, and the lower edge of the insulation layer 12 shown in FIG. 5 is exposed from the sealing resin 3. The insulation layer 12 is constituted from an epoxy resin or a polyimide, for example. The length (thickness) of the insulation layer 12 in the thickness direction Z is shorter than the length (thickness) of abase part 21 which will be discussed later.

The plurality of terminals 2 are, as shown in FIG. 1 to FIG. 5, conductive bodies that constitute a conductive path between the semiconductor element 11 and the wiring board on which the semiconductor device A10 is mounted. The plurality of terminals 2 are constituted by four terminals 2A, 2B, 2C and 2D. The terminal 2A is located on the upper right in FIG. 1. The terminal 2B is located on the lower right in FIG. 1. The terminal 2C is located on the lower left in FIG. 1. The terminal 2D is located on the upper left in FIG. 1. In semiconductor devices A20 to A90 which will be discussed later, the plurality of terminals 2 are also constituted by four terminals 2A, 2B, 2C and 2D, and the positions of the plurality of terminals 2 according to each of the embodiments are also the same as the semiconductor device A10. In the present embodiment, each of the terminals 2 are provided with a base part 21, a projecting part 22, a main surface conductive layer 281, a bottom surface conductive layer 282, and an internal conductive layer 29. Of these, the base part 21 and the projecting part 22 constitute a principal part of the terminal 2, and the base part 21 can be called a "first part" of the terminal 2 and the projecting part 22 can be called a "second part" of the terminal 2. The principal part of the terminal 2 is constituted from an alloy whose main component is Cu, for example. Also, the terminal 2 has a first side surface 23 and a second side surface 24 in the principal part. In the present embodiment, the terminal 2 is disposed so that both the first side surface 23 and the second side surface 24 contact the corner of the semiconductor device A10 where the first direction X and the second direction Y intersect in plan view.

Figure 2:
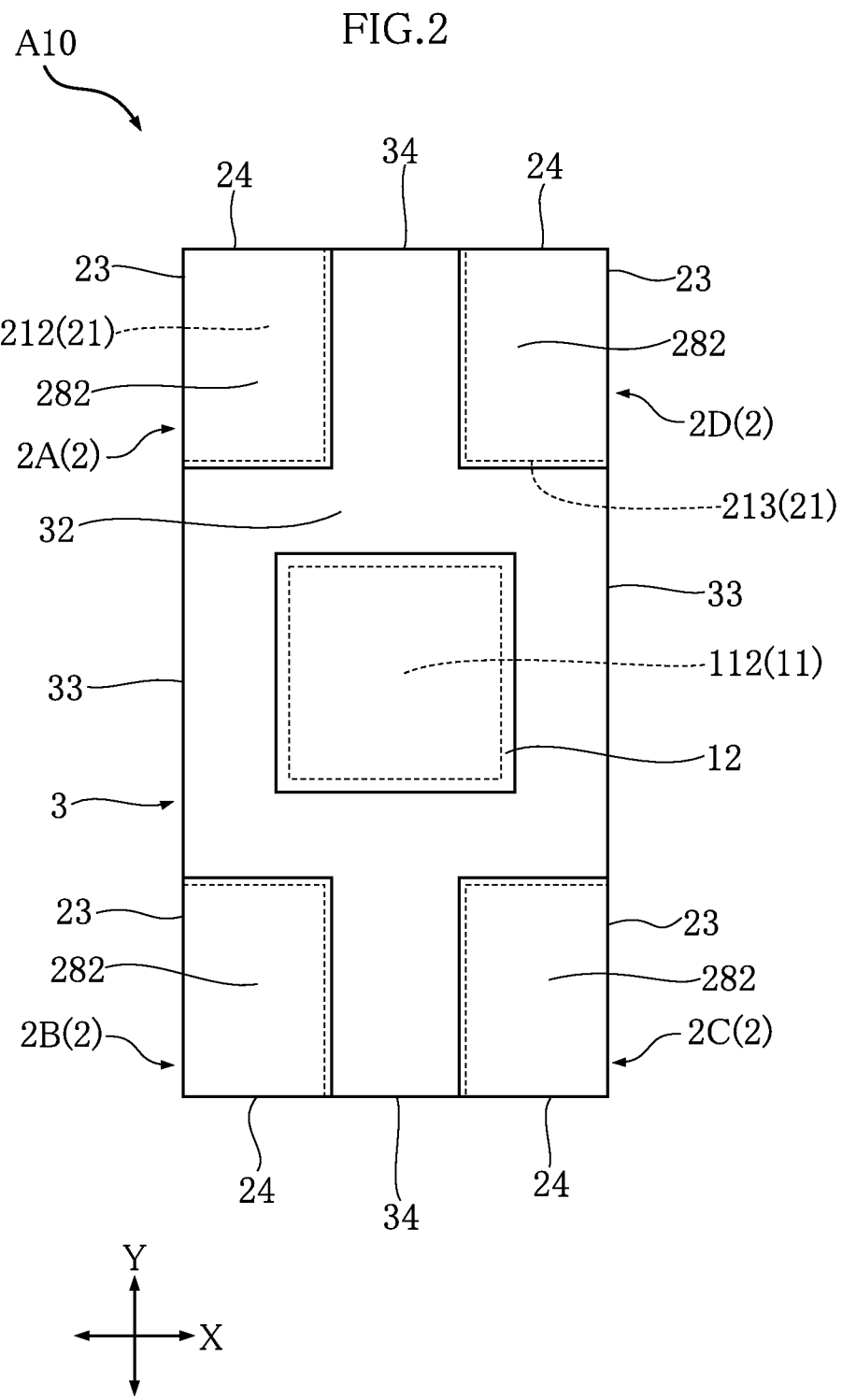
FIG. 2 is a bottom view of the semiconductor device shown in FIG. 1.
Figure 3:
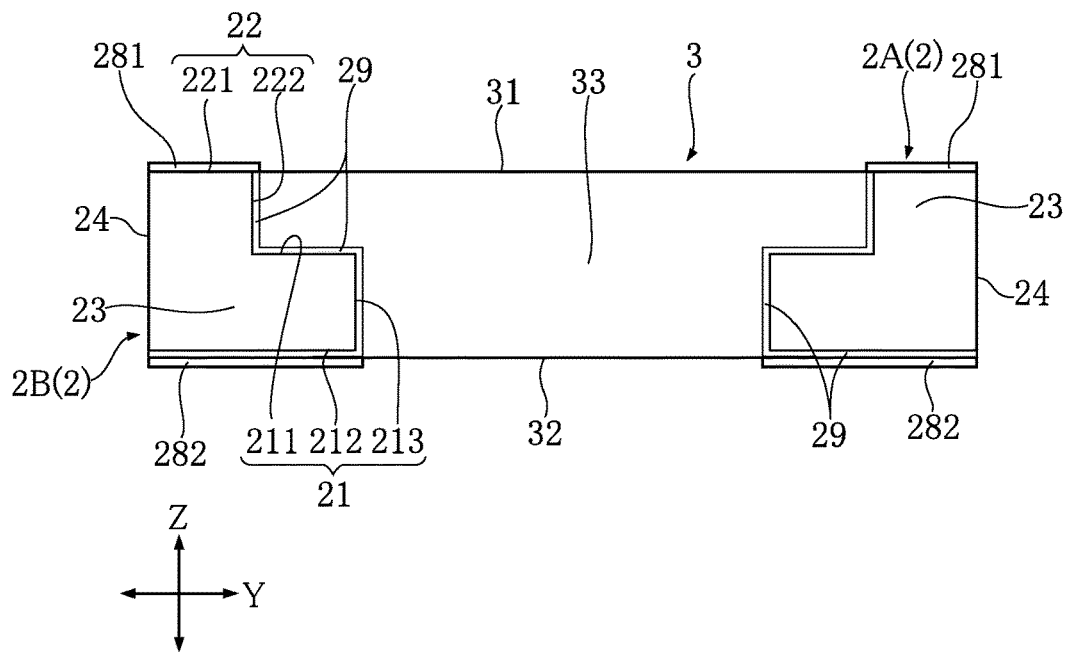
FIG. 3 is a right side view of the semiconductor device shown in FIG. 1.

The base part 21 is a principal part (first part) of the terminal 2 that is, as shown in FIG. 1, disposed at a distance from the semiconductor element 11, and is electrically connected to the front surface 111 of the semiconductor element 11. In the present embodiment, the base part 21 is electrically connected to the electrode pads formed in the front surface 111 of the semiconductor element 11 via the wire 4. The base part 21 according to the present embodiment is rectangular in plan view. The base part 21 has a terminal surface 211, a bottom surface 212, and a second inner surface 213. As shown in FIG. 1 and FIG. 5, the terminal surface 211 is a surface that faces in the same direction as the front surface 111 of the semiconductor element 11, and is covered by the sealing resin 3. In the present embodiment, the wire 4 is electrically connected to the terminal surface 211. As shown in FIG. 2 and FIG. 5, the bottom surface 212 is a surface that faces in the opposite direction to the terminal surface 211, and is exposed from the sealing resin 3. As shown in FIG. 3 and FIG. 5, the second inner surface 213 is a surface that faces to the inside of the semiconductor device A10 in the second direction Y, and that is formed in the thickness direction Z, as well as being connected to the terminal surface 211 and the bottom surface 212. The second inner surface 213 is covered by the sealing resin 3.

The projecting part 22 is, as shown in FIG. 1 and FIG. 5, a principal part (second part) of the terminal 2 that projects from the terminal surface 211 of the base part 21 in the direction in which the front surface 111 of the semiconductor element 11 faces. The projecting part 22 has a configuration supported by the terminal surface 211 of the base part 21. In plan view, the area of the projecting part 22 is smaller than the area of the base part 21. Also, the shape of the projecting part 22 according to the present embodiment is rectangular parallelepiped. The projecting part 22 has a main surface 221 and a first inner surface 222. As shown in FIG. 1 and FIG. 3 to FIG. 5, the main surface 221 is a surface that faces in the same direction as the front surface 111 of the semiconductor element 11, and is exposed from the sealing resin 3. As shown in FIG. 3 and FIG. 5, the first inner surface 222 is a surface that is formed parallel to the second inner surface 213 of the base part 21 in plan view, and is connected to the main surface 221 and to the terminal surface 211 of the base part 21. The first inner surface 222 thus faces in the same direction as the second inner surface 213 of the base part 21.

As shown in FIG. 1 to FIG. 4, the first side surface 23 is a surface that faces in the first direction X, and is exposed from the sealing resin 3. The first side surface 23 according to the present embodiment is L-shaped. As shown in FIG. 3, in the second direction Y, the first side surface 23 is connected to the second side surface 24, to the first inner surface 222 of the projecting part 22, and to the second inner surface 213 of the base part 21. Also, in the thickness direction Z, the first side surface 23 is connected to the main surface 221 of the projecting part 22, and to the terminal surface 211 and the bottom surface 212 of the base part 21.

Figure 4:
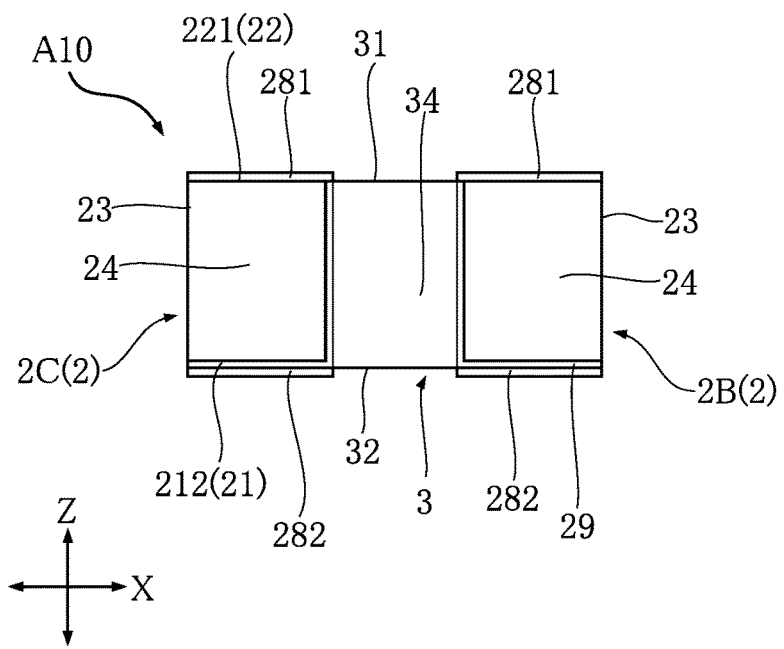
FIG. 4 is a front view of the semiconductor device shown in FIG. 1.
Figure 5:
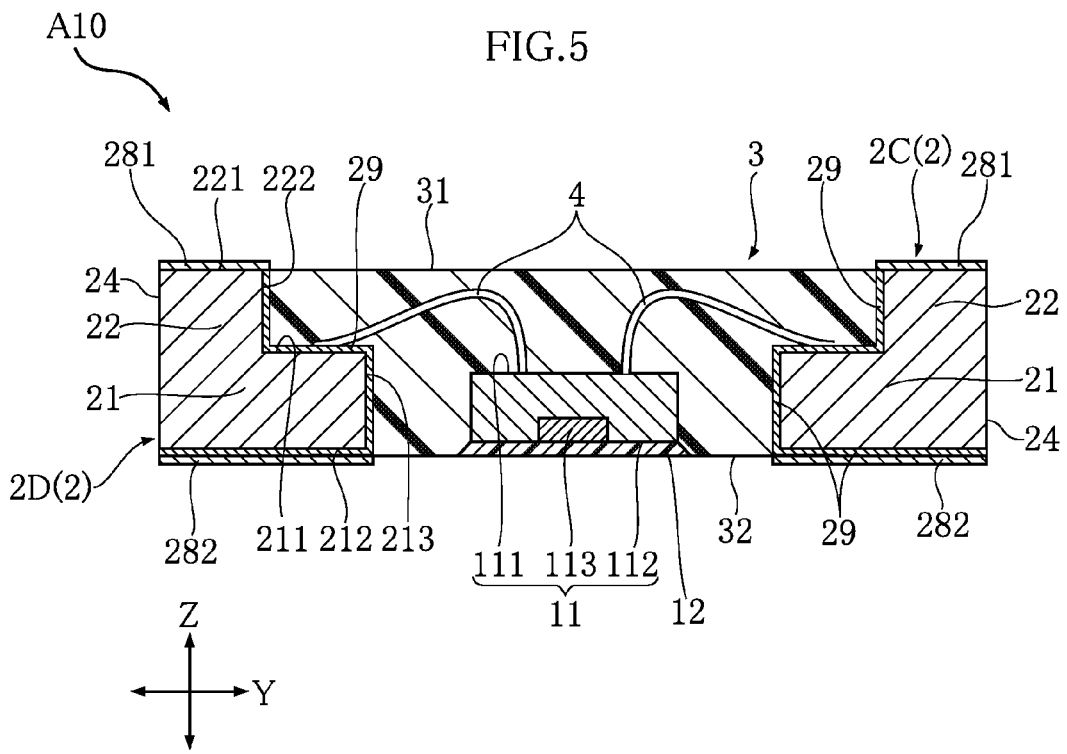
FIG. 5 is a cross-sectional view along a V-V line of FIG. 1.

As shown in FIG. 1 to FIG. 5, the second side surface 24 is a surface that faces to the outside of the semiconductor device A10 in the second direction Y, and is exposed from the sealing resin 3. The second side surface 24 according to the present embodiment is rectangular. The upper edge of the second side surface 24 shown in FIG. 4 is connected to the main surface 221 of the projecting part 22, and the lower edge of the second side surface 24 shown in FIG. 4 is connected to the bottom surface 212 of the base part 21. Accordingly, as shown in FIG. 1, the first side surface 23 and the second side surface 24 are formed along the corner of the semiconductor device A10 in plan view.

As shown in FIG. 1 and FIG. 3 to FIG. 5, the terminals 2 are provided with a main surface conductive layer 281 that covers the main surface 221 of the projecting part 22, and is exposed to the outside of the semiconductor device A10. The main surface conductive layer 281 according to the present embodiment is an alloy layer containing Sn. The alloy layer is a lead-free solder alloy such as a Sn—Sb alloy or a Sn—Ag alloy, for example. Here, the main surface conductive layer 281 may be constituted from a Ni layer and an alloy layer containing Sn laminated one on the other. Also, the main surface conductive layer 281 may be constituted from a Ni layer, a Pd layer and an Au layer laminated one on the other. Furthermore, the main surface conductive layer 281 may be configured to include a Pd layer and an Au layer laminated one on the other, or configured to include an Au layer. In these configurations of the main surface conductive layer 281 including an Au layer, the Au layer in each case will be in a state of being exposed to the outside.

As shown in FIG. 2 to FIG. 5, the terminals 2 are provided with a bottom surface conductive layer 282 that covers the bottom surface 212 of the base part 21. The configuration of the bottom surface conductive layer 282 is the same as the configuration (composition) of the main surface conductive layer 281. The bottom surface conductive layer 282 is thus a conductive body.

As shown in FIG. 1, FIG. 3 and FIG. 5, the terminals 2 are provided with an internal conductive layer 29 that covers the terminal surface 211 of the base part 21. The internal conductive layer 29 is an Ag layer. Also, as shown in FIG. 3 and FIG. 5, in the present embodiment, the internal conductive layer 29 covers the bottom surface 212 and the second inner surface 213 of the base part 21 and the first inner surface 222 of the projecting part 22, in addition to the terminal surface 211 of the base part 21.

The sealing resin 3, as shown in FIG. 2 to FIG. 5, is a portion that covers the semiconductor element 11 and part of the sealing resin 3. The sealing resin 3 is a thermosetting synthetic resin having insulating properties, and the synthetic resin is, for example, a black epoxy resin. Also, the epoxy resin according to the present embodiment contains glass frit. The sealing resin 3 has a first surface 31, a second surface 32, a third surface 33, and a fourth surface 34.

As shown in FIG. 3 to FIG. 5, the first surface 31 is a surface that faces in the same direction as the front surface 111 of the semiconductor element 11. In the present embodiment, the main surface 221 of the projecting part 22 is flush with the first surface 31.

As shown in FIG. 2 to FIG. 5, the second surface 32 is a surface that faces in the opposite direction to the first surface 31. In the present embodiment, the bottom surface 212 of the base part 21 is flush with the second surface 32. Also, the insulation layer 12 is exposed from the second surface 32.

As shown in FIG. 2 and FIG. 3, the third surface 33 is a pair of surfaces that are connected to both the first surface 31 and the second surface 32, and that face in the first direction X, as well as being separated from each other in the first direction X. In the present embodiment, the first side surface 23 of the terminals 2 is flush with the third surface 33.

As shown in FIG. 2 and FIG. 4, the fourth surface 34 is a pair of surfaces that are connected to both the first surface 31 and the second surface 32, and that face in the second direction Y, as well as being separated from each other in the second direction Y. Each of the fourth surfaces 34 are connected at both ends to the pair of third surfaces 33 in the first direction X. In the present embodiment, the second side surface 24 of the terminals 2 is flush with the fourth surface 34.

The wire 4, as shown in FIG. 1 and FIG. 5, electrically connects the front surface 111 of the semiconductor element 11 and the terminal surface 211 of the base part 21. In the present embodiment, there are four wires 4 in the semiconductor device A10, and the wires 4 respectively electrically connect the electrode pads formed on the front surface 111 and the terminal surfaces 211 to each other. The wires 4 are constituted from Au, for example.

Figure 6:
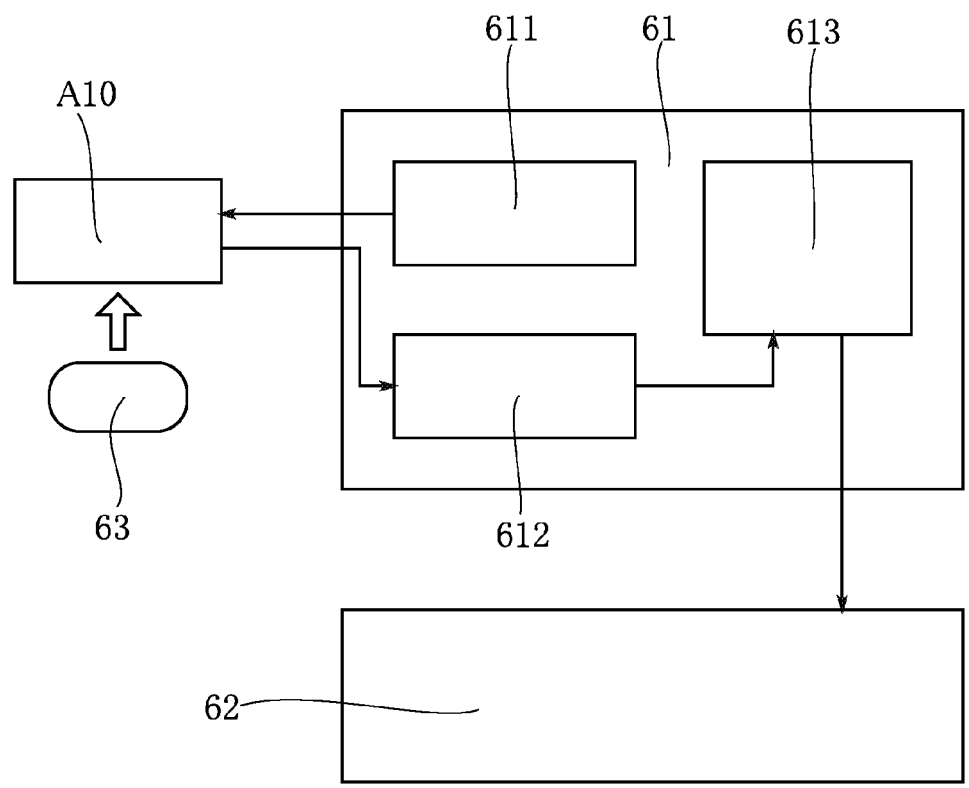
FIG. 6 is a block diagram of a circuit to which the semiconductor device shown in FIG. 1 is applied.

Next, an example of a circuit to which the semiconductor device A10 in which the semiconductor element 11 is a Hall element is applied will be described, based on FIG. 6. FIG. 6 is a block diagram of the circuit to which the semiconductor device A10 is applied.

As shown in FIG. 6, the circuit is constituted by the semiconductor device A10, an integrated circuit 61, and a control target 62. The control target 62 is given as the light source of the display of a mobile phone, a DC motor, or the like, for example. The integrated circuit 61 includes a device drive area 611, a voltage detection area 612, and a control area 613. The device drive area 611 is an area that causes Hall current to flow to the magnetosensitive layer 113 of the semiconductor element 11 of the semiconductor device A10. The voltage detection area 612 is an area that detects an electromotive force (Hall voltage) that appears in the magnetosensitive layer 113 of the semiconductor element 11 due to the Hall effect. The control area 613 is an area that controls the operations of the control target 62. Now, when a magnet 63 moves close the semiconductor device A10, the magnetosensitive layer 113 of the semiconductor element 11 detects a change in magnetic flux density, and an electromotive force appears in the magnetosensitive layer 113 of the semiconductor element 11 due to the Hall effect. The electromotive force is detected by the voltage detection area 612. The voltage detection area 612 transmits this detection result to the control area 613. The control area 613 controls (starts, stops, etc.) the operations of the control target 62, based on the transmitted detection result.

Next, an example of the manufacturing method of the semiconductor device A10 will be described, based on FIG. 7 to FIG. 20.

FIG. 7 to FIG. 11, FIG. 13 to FIG. 16 and FIG. 18 to FIG. 20 are cross-sectional views illustrating the manufacturing method of the semiconductor device A10, with the position of the cross-section being the same as FIG. 5. Note that the thickness direction Z, the first direction X and the second direction Y of the first base material 81 shown in FIG. 7 to FIG. 20 corresponds to the thickness direction Z, the first direction X, and the second direction Y shown in FIG. 1 to FIG. 5.

Initially, as shown in FIG. 7 to FIG. 10, a first base material 81 which is a conductive body having a front surface 811 and a back surface 812 that face in opposite directions to each other in the thickness direction Z and in which a base part 814, a projecting part 815, a through part 816 and an internal conductive layer 817 are formed is prepared. The first base material 81 is an aggregate of the terminals 2 of the semiconductor device A10. The first base material 81 is constituted from an alloy whose main component is Cu, and has a thickness of 200 to 300 μm. The front surface 811 and the back surface 812 are both uniformly flat surfaces. The first base material 81 is prepared using the following process.

Figure 7:
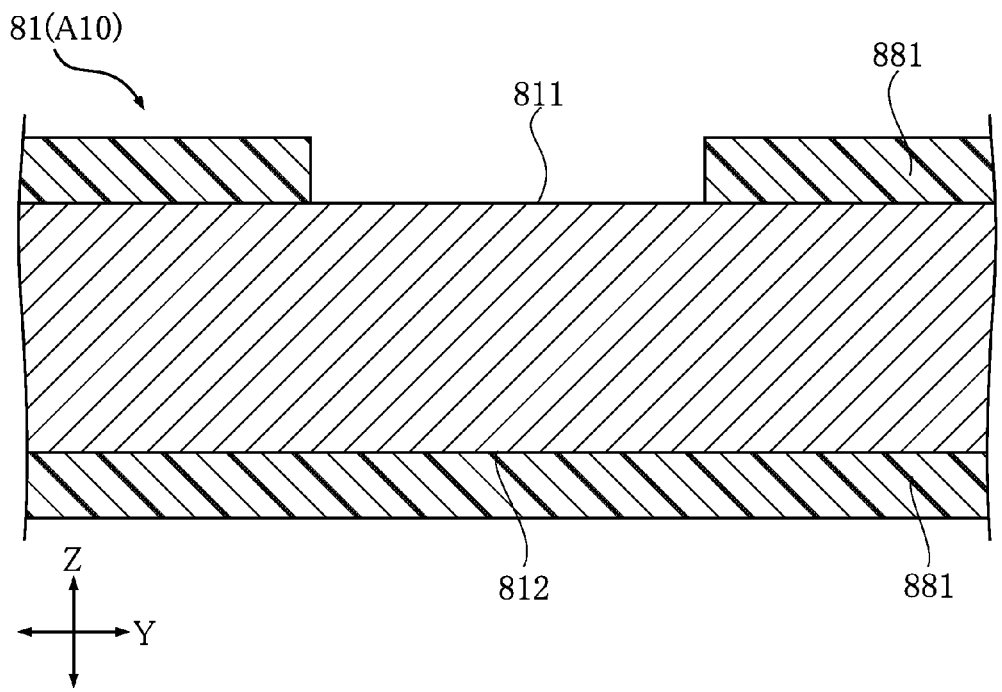
FIG. 7 is a cross-sectional view illustrating the manufacturing method of the semiconductor device shown in FIG. 1.

First, a mask is formed on the first base material 81. As shown in FIG. 7, after forming a first resist layer 881 so as to cover the entire front surface 811 and back surface 812 of the first base material 81, exposure and development are performed by photolithography on the first resist layer 881 covering the front surface 811. A mask is thereby formed on the first base material 81. The first resist layer 881 is formed by applying a photosensitive resist with a spin coater (rotary application apparatus) or the like. Since the first resist layer 881 according to the present embodiment is a positive resist layer, a portion of the exposed first resist layer 881 is removed using a developing solution, and the front surface 811 is exposed from the removed portion.

Figure 8:
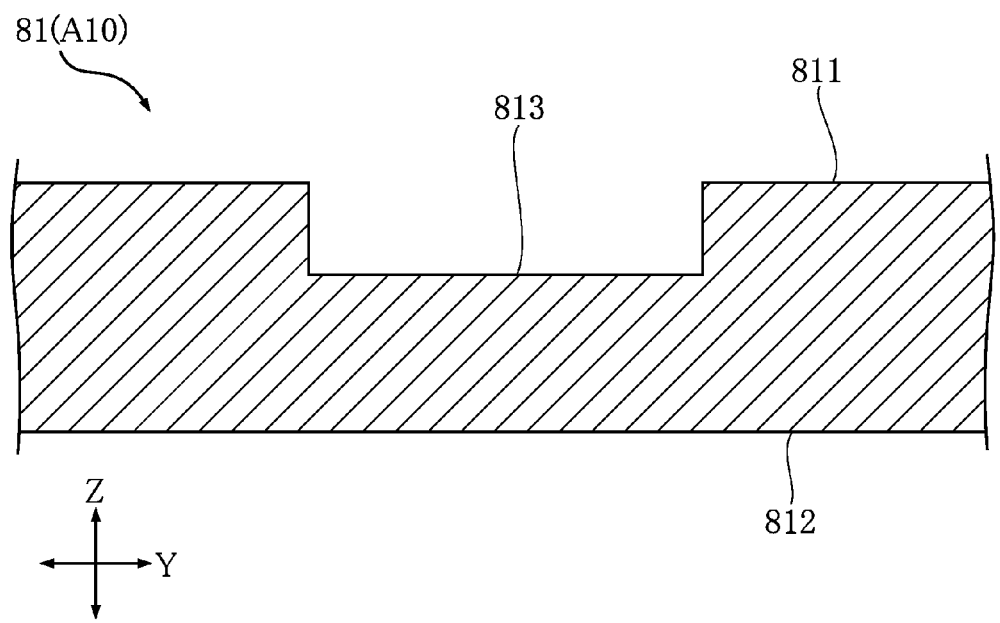
FIG. 8 is a cross-sectional view illustrating the manufacturing method of the semiconductor device shown in FIG. 1.

Next, as shown in FIG. 8, a recessed part 813 that is recessed from the front surface 811 by primary removal is formed in the first base material 81. The recessed part 813 is formed in the front surface 811 that is not covered by the first resist layer 881. Primary removal according to the present embodiment is performed by wet etching. The etching solution that is used in primary removal is a mixed solution of sulfuric acid ($H_2SO_4$) and hydrogen peroxide ($H_2O_2$), for example.

Figure 9:
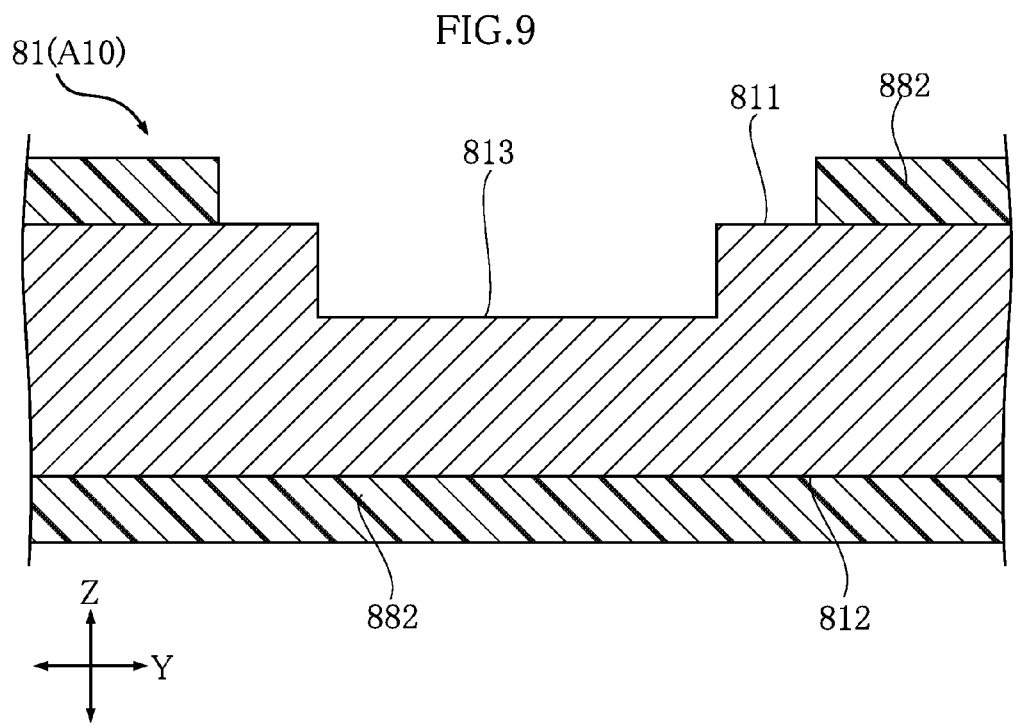
FIG. 9 is a cross-sectional view illustrating the manufacturing method of the semiconductor device shown in FIG. 1.

Next, a mask is again formed on the first base material 81 in which the recessed part 813 was formed. As shown in FIG. 9, after forming a second resist layer 882 so as to cover the entire front surface 811 and back surface 812 of the first base material 81, exposure and development are performed by photolithography on the second resist layer 882 covering the front surface 811. A mask is thereby again formed on the first base material 81. Both the material and formation method of the second resist layer 882 are the same as the first resist layer 881. At this time, the recessed part 813 is exposed from the second resist layer 882.

Figure 10:
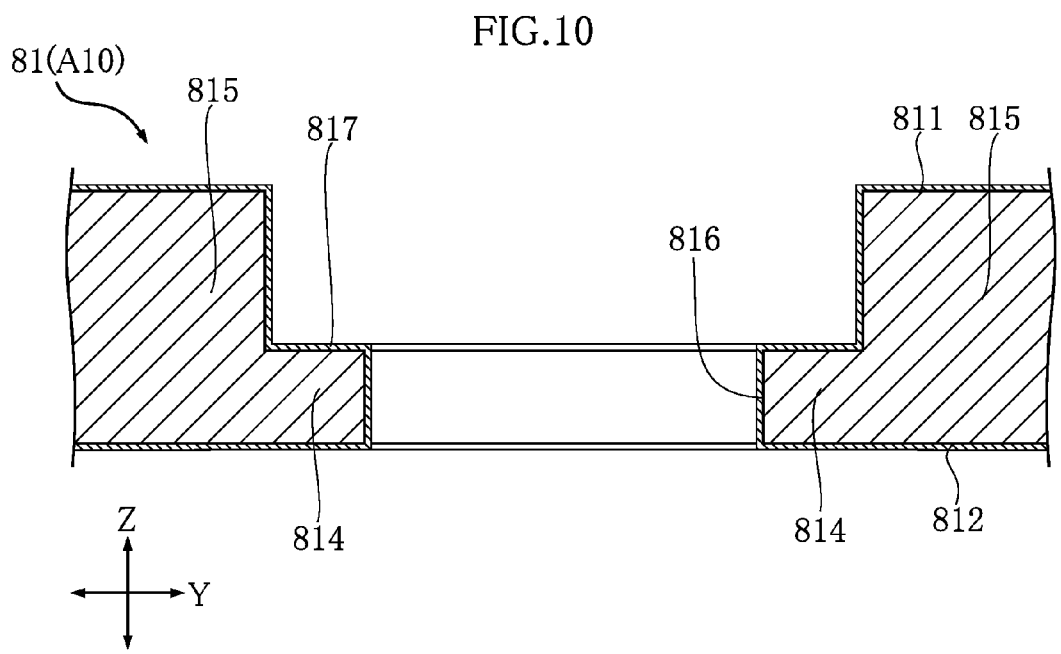
FIG. 10 is a cross-sectional view illustrating the manufacturing method of the semiconductor device shown in FIG. 1.

Next, as shown in FIG. 10, the base part 814, the projecting part 815 and the through part 816 are formed in the first base material 81 by secondary removal. The base part 814, the projecting part 815 and the through part 816 are formed in the recessed part 813 that is not covered by the second resist layer 882 and in the vicinity thereof. Secondary removal according to the present embodiment is performed by wet etching, the same as the aforementioned primary removal. The etching solution that is used in secondary removal is the same as the etching solution that is used in primary removal.

As shown in FIG. 10, the base part 814 is a portion that has part of the back surface 812. The projecting part 815 is a portion that projects from the base part 814 in the direction in which the front surface 811 faces, and that has part of the front surface 811. The through part 816 is a portion that passes through the first base material 81 from the front surface 811 to the back surface 812. After forming the base part 814, the projecting part 815 and the through part 816 in the first base material 81, the internal conductive layer 817 is formed on the first base material 81 by electrolytic plating. The internal conductive layer 817 corresponds to the internal conductive layer 29 of the semiconductor device A10. The internal conductive layer 817 according to the present embodiment is an Ag layer. At this time, the front surface 811, the back surface 812, the base part 814 and the projecting part 815 of the first base material 81 are covered by the internal conductive layer 817. The first base material 81 is prepared by the above process.

Figure 11:
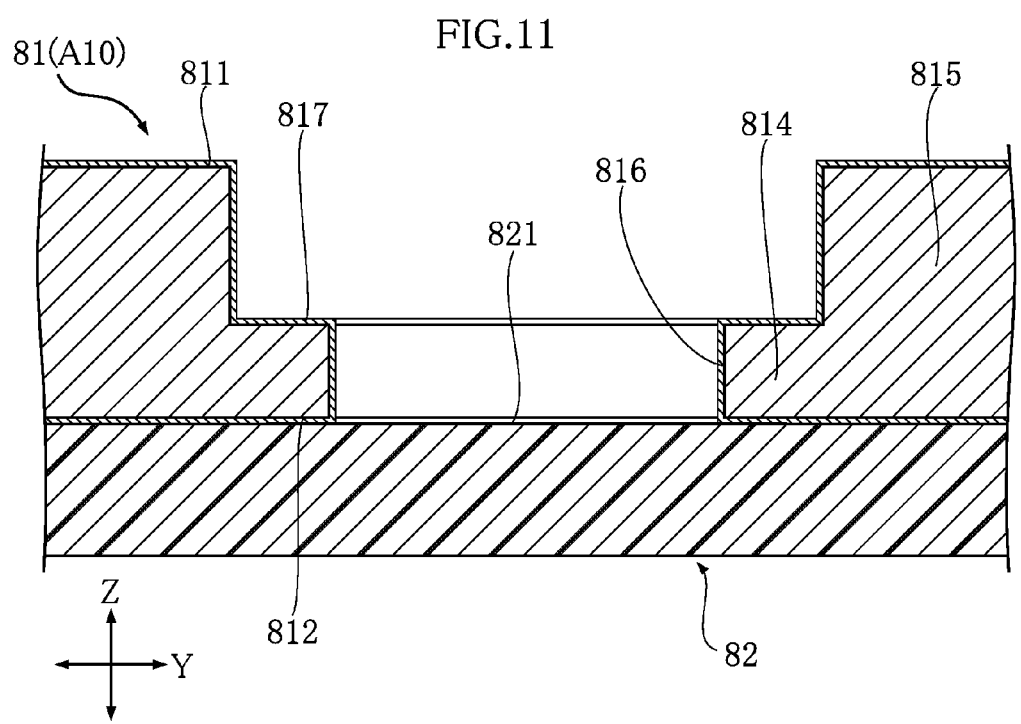
FIG. 11 is a cross-sectional view illustrating the manufacturing method of the semiconductor device shown in FIG. 1.

Next, as shown in FIG. 11, a second base material 82 which is an electrical insulator supporting the first base material 81 from the back surface 812 is prepared. The second base material 82 according to the present embodiment is insulating tape, for example. By sticking the second base material 82 to the back surface 812 of the first base material 81, the first base material 81 will be in a state of being supported by the second base material 82. At this time, the second base material 82 has an exposed part 821 that is exposed through the through part 816 of the first base material 81.

The process of preparing the first base material 81 and the second base material 82 may be a process of preparing the first base material 81 after preparing the second base material 82, apart from a process of preparing the second base material 82 after preparing the first base material 81 as aforementioned. In this case, the second base material 82 is stuck to the back surface 812, instead of the first resist layer 881 shown in FIG. 7 being formed to cover the back surface 812 of the first base material 81. By adopting this process, the formation of the first resist layer 881 and the second resist layer 882 that cover the back surface 812 of the first base material 81 is omitted. Also, the back surface 812 of the first base material 81 is not covered by the internal conductive layer 817.

Figure 12:
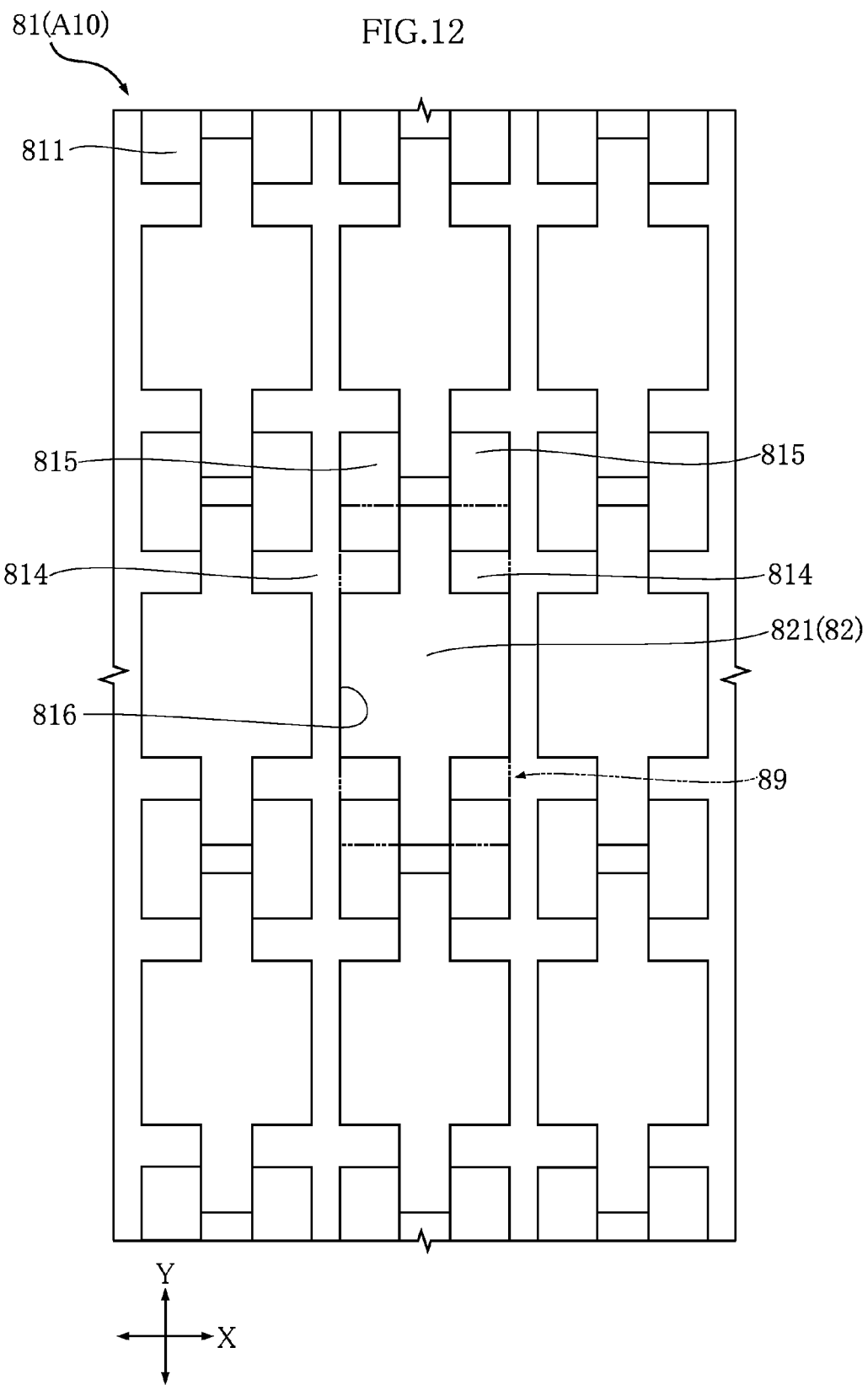
FIG. 12 is a plan view illustrating the manufacturing method of the semiconductor device shown in FIG. 1.

FIG. 12 shows the state when the first base material 81 and the second base material 82 have been prepared. As shown in FIG. 12, the portions surrounded by a region 89 of the first base material 81 are portions that will form the terminals 2 of the semiconductor device A10. Also, on the front surface 811 of the first base material 81, the exposed part 821 of the second base material 82 is visible through the through part 816.

Figure 13:
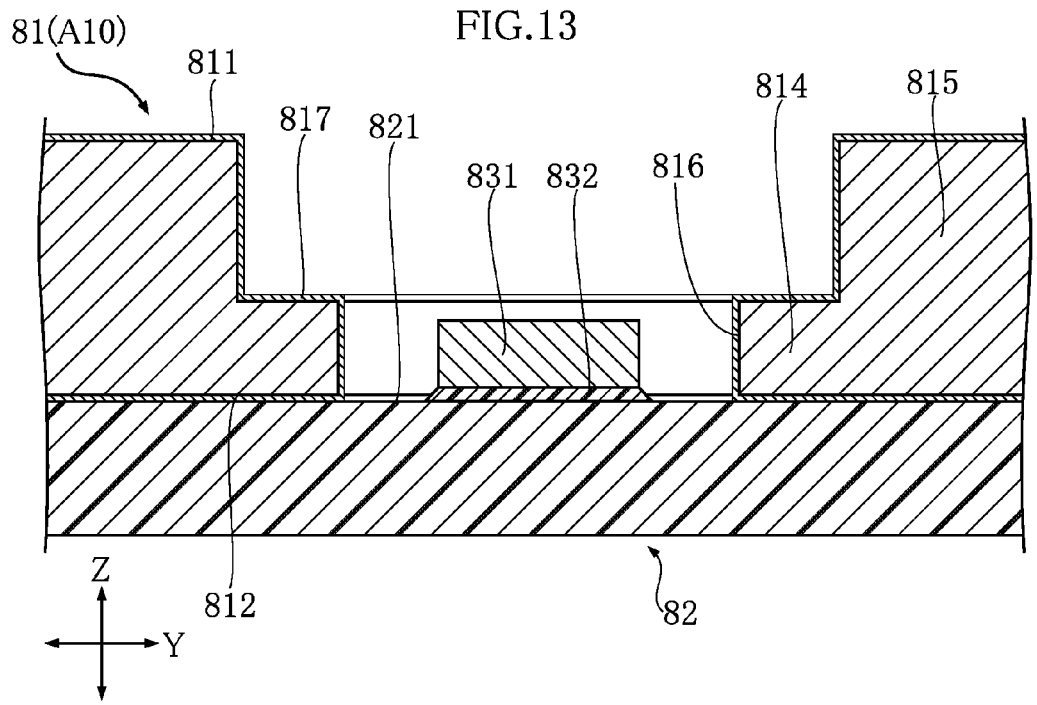
FIG. 13 is a cross-sectional view illustrating the manufacturing method of the semiconductor device shown in FIG. 1.

Next, as shown in FIG. 13, a semiconductor element 831 is mounted on the exposed part 821 of the second base material 82. The semiconductor element 831 corresponds to the semiconductor element 11 of the semiconductor device A10. In mounting the semiconductor element 831, first, a joining material 832 which is an electrical insulator is applied to the exposed part 821 of the second base material 82. The joining material 832 according to the present embodiment is a synthetic resin having insulating properties such as an epoxy resin, a polyimide or the like, for example. Next, the semiconductor element 831 suctioned with a collet or the like is transported to above the exposed part 821 of the second base material 82, and adhered to the joining material 832. Finally, the joining material 832 is heat-cured with a curing furnace or the like. At this time, the heat-cured joining material 832 corresponds to the insulation layer 12 of the semiconductor device A10. Accordingly, the semiconductor element 831 is mounted on the exposed part 821 of the second base material 82, by interposing the joining material 832 between the exposed part 821 of the second base material 82 and the semiconductor element 831.

Figure 14:
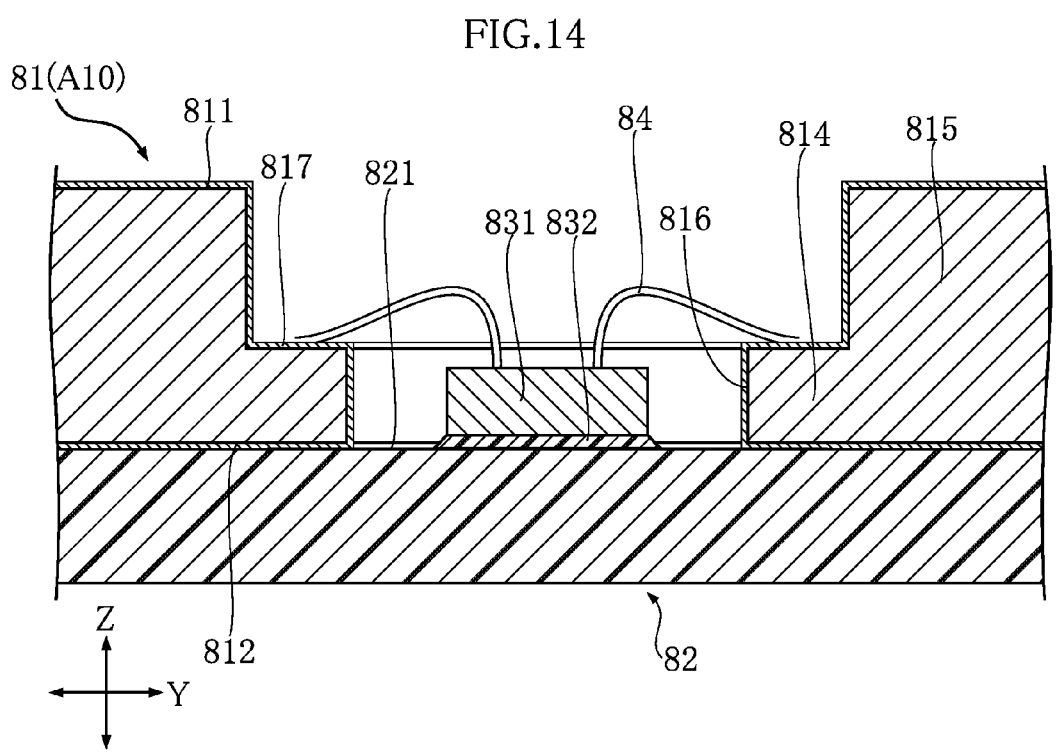
FIG. 14 is a cross-sectional view illustrating the manufacturing method of the semiconductor device shown in FIG. 1.

Next, as shown in FIG. 14, a wire 84 that electrically connect the semiconductor element 831 and the base part 814 of the first base material 81 is formed. The wire 84 corresponds to the wire 4 of the semiconductor device A10. The wire 84 is formed by wire bonding. The material of the wire 84 according to the present embodiment is Au, for example.

Figure 15:
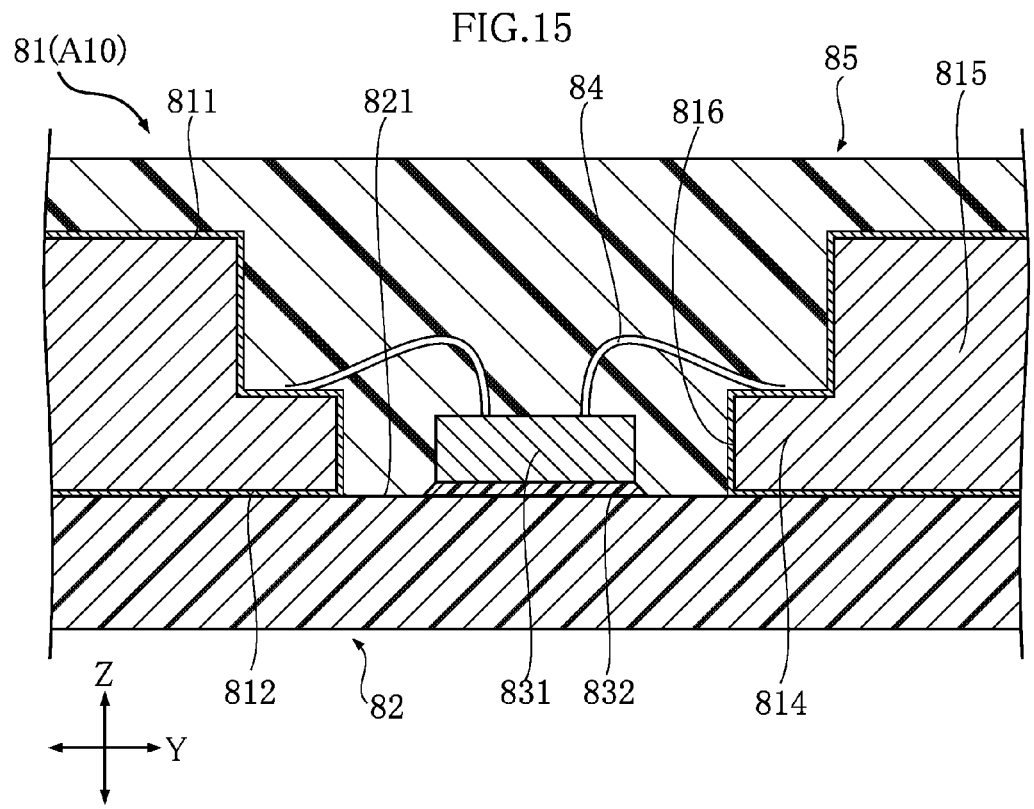
FIG. 15 is a cross-sectional view illustrating the manufacturing method of the semiconductor device shown in FIG. 1.

Next, as shown in FIG. 15, a sealing resin 85 that covers the first base material 81 and the semiconductor element 831 is formed. The sealing resin 85 corresponds to the sealing resin 3 of the semiconductor device A10. The sealing resin 85 according to the present embodiment is formed by heat-curing a black epoxy resin that has insulating properties and fluidity and contains glass frit by transfer molding. At this time, the sealing resin 85 will be in a state of covering the base part 814 and the projecting part 815 of the first base material 81, and being filled in the through part 816 of the first base material 81.

Figure 16:
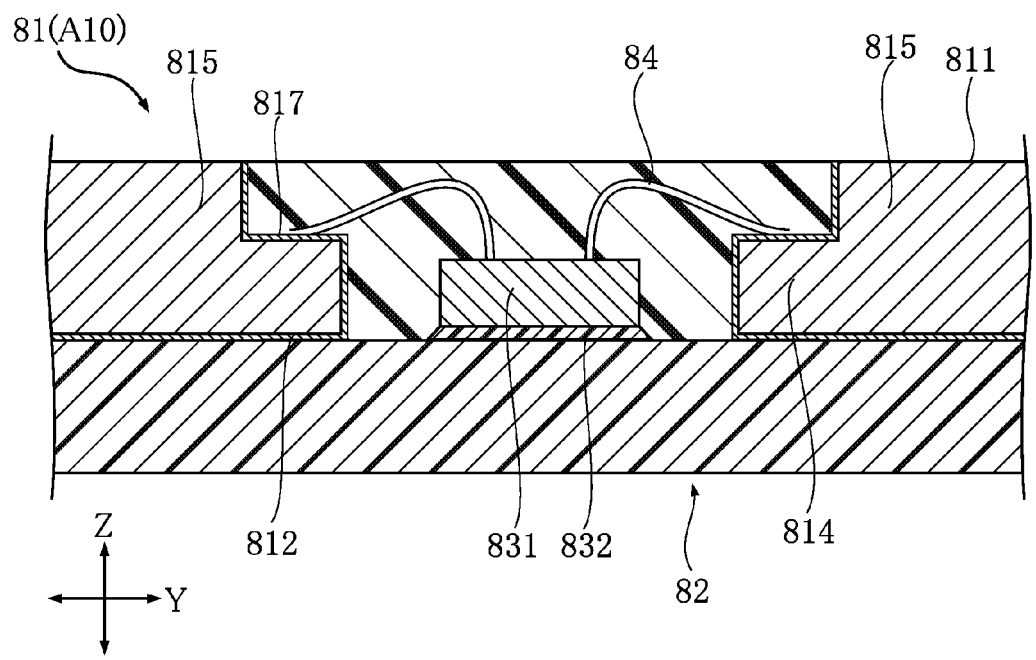
FIG. 16 is a cross-sectional view illustrating the manufacturing method of the semiconductor device shown in FIG. 1.
Figure 17:
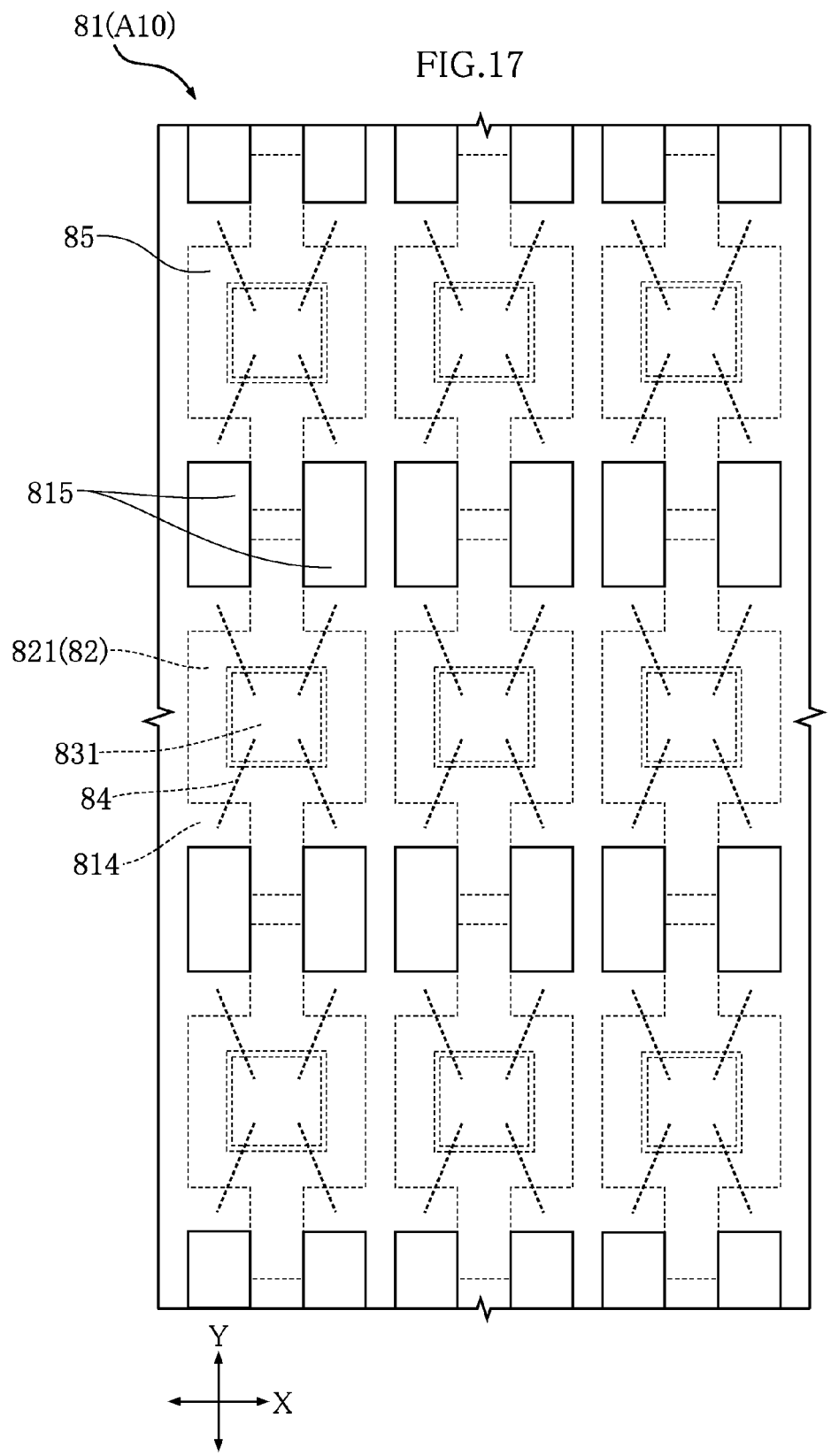
FIG. 17 is a plan view illustrating the manufacturing method of the semiconductor device shown in FIG. 1.

Next, part of each of the sealing resin 85 and the projecting part 815 of the first base material 81 is removed, and the projecting part 815 of the first base material 81 is exposed from the sealing resin 85. In the present embodiment, part of each of the projecting part 815 of the first base material 81 and the sealing resin 85 is removed, by uniformly grinding the projecting part 815 of the first base material 81 and the sealing resin 85 by mechanical polishing from the opposite side to the back surface 812 of the first base material 81. FIG. 16 and FIG. 17 show the state where the projecting part 815 of the first base material 81 is exposed from the sealing resin 85. As shown in FIG. 17, the projecting part 815 of the rectangular first base material 81 is visible from the sealing resin 85, on the opposite side to the back surface 812 of the first base material 81.

Figure 18:
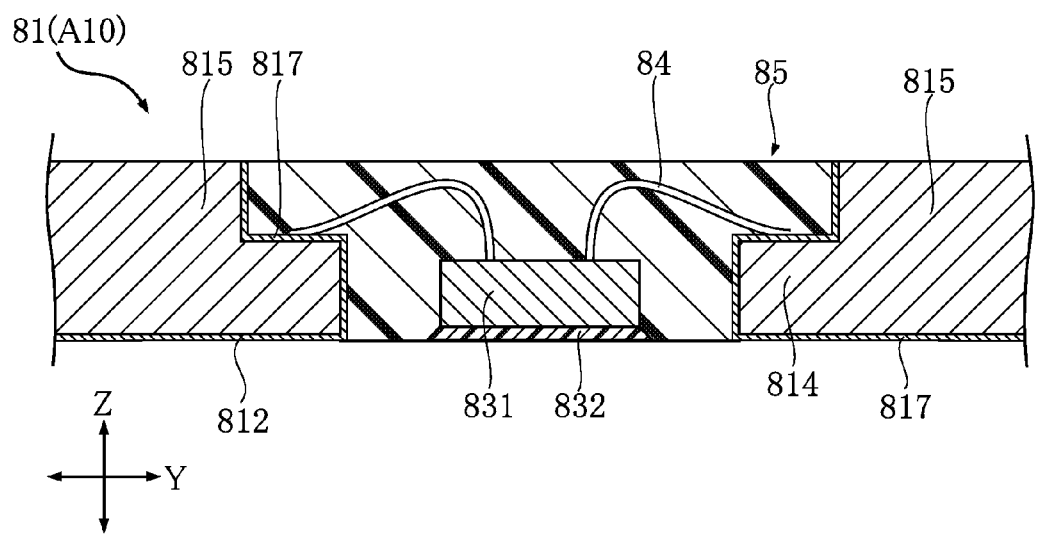
FIG. 18 is a cross-sectional view illustrating the manufacturing method of the semiconductor device shown in FIG. 1.

Next, as shown in FIG. 18, the second base material 82 is removed from the first base material 81. At this time, the back surface 812 of the first base material 81 covered by the internal conductive layer 817 is exposed, and, on the back surface 812, the cured joining material 832 and sealing resin 85 are exposed from the through part 816.

Figure 19:
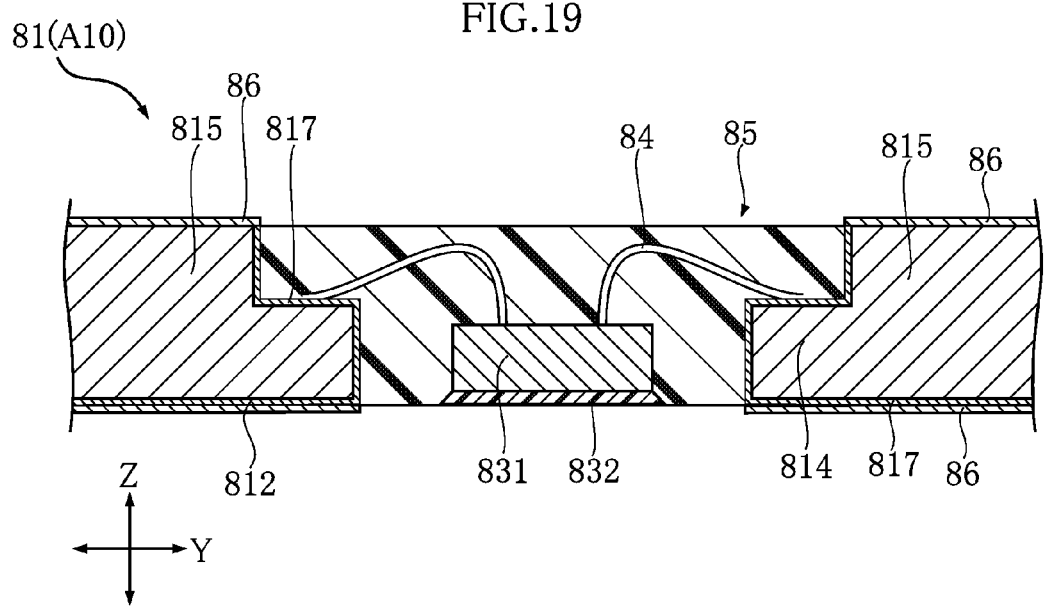
FIG. 19 is a cross-sectional view illustrating the manufacturing method of the semiconductor device shown in FIG. 1.

Next, as shown in FIG. 19, a conductive layer 86 that covers the projecting part 815 of the first base material 81 exposed from the sealing resin 85 is formed. The conductive layer 86 covering the projecting part 815 corresponds to the main surface conductive layer 281 of the semiconductor device A10. In the present embodiment, the conductive layer 86 is formed by electrolytic plating. Also, the conductive layer 86 according to the present embodiment is formed by depositing an alloy layer containing Sn, but may be formed by depositing a Ni layer and an alloy layer containing Sn in this order. Also, the conductive layer 86 may be formed by depositing a Ni layer, a Pd layer and an Au layer in this order, by depositing a Pd layer and an Au layer in this order, or by depositing an Au layer. In these cases, the outermost layer of the conductive layer 86 will be the alloy layer containing Sn or the Au layer. At this time, since the back surface 812 of the first base material 81 is exposed from the sealing resin 85 in a state of being covered by the internal conductive layer 817, the conductive layer 86 covering the back surface 812 is formed at the same time. The conductive layer 86 covering the back surface 812 corresponds to the bottom surface conductive layer 282 of the semiconductor device A10. In the semiconductor device A10, the configuration of the bottom surface conductive layer 282 will thus be the same as the configuration (composition) of the main surface conductive layer 281.

Figure 20:
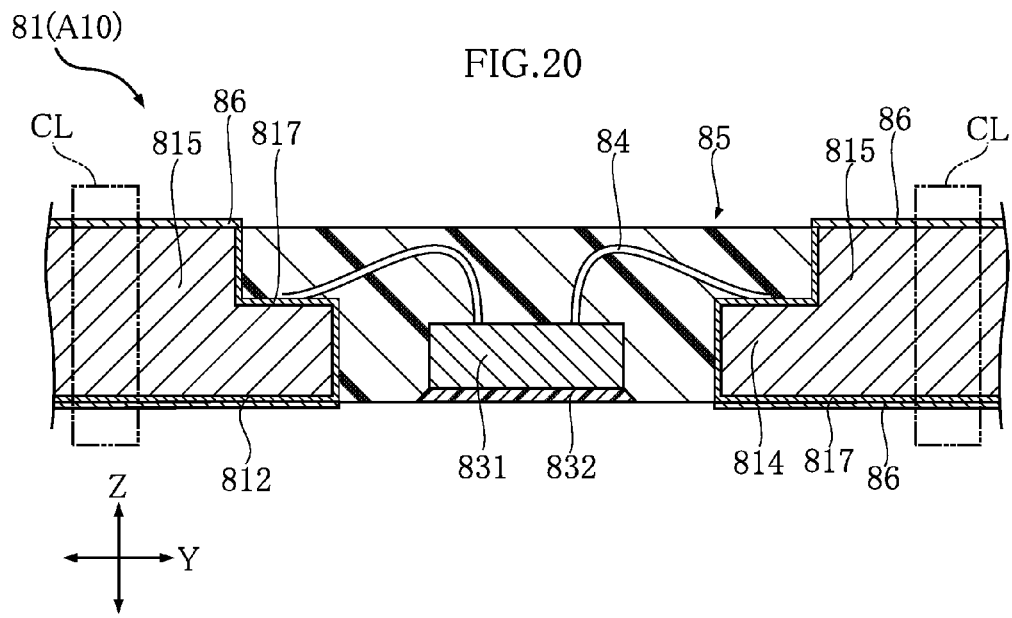
FIG. 20 is a cross-sectional view illustrating the manufacturing method of the semiconductor device shown in FIG. 1.

Next, individual pieces are formed, by sectioning the first base material 81 and the sealing resin 85 in the first direction X and the second direction Y. In the sectioning, the first base material 81 is sectioned from the back surface 812 using a dicing saw, for example. In the present embodiment, when sectioning the first base material 81 and the sealing resin 85 in the first direction X, the portion enclosed by a sectioning plane line CL shown with an imaginary line in FIG. 20 is removed. The individual pieces obtained in this process are semiconductor devices A10. The semiconductor device A10 is manufactured through the above processes.

Next, based on FIG. 21, the mounting structure of the semiconductor device A10 in which the semiconductor element 11 is a Hall element will be described. The position of the cross section of FIG. 21 is the same as FIG. 5.

Figure 21:
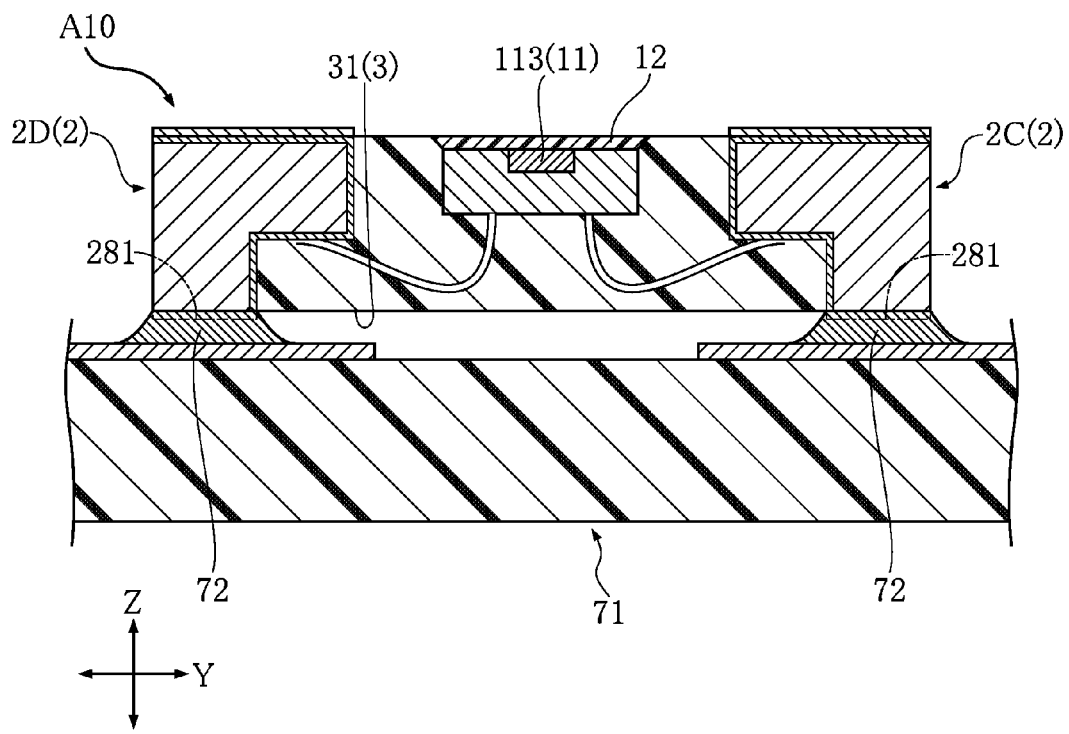
FIG. 21 is a cross-sectional view of the semiconductor device shown in FIG. 1 when mounted on a wiring board.

As shown in FIG. 21, when the semiconductor device A10 has been mounted on a wiring board 71 on which a wiring pattern is formed using a reflow method, a conductive joining layer 72 for mounting the semiconductor device A10 on the wiring board 71 is interposed between the projecting part 22 and the wiring board 71. The conductive joining layer 72 is a solder paste, for example. At this time, the main surface 221 of the projecting part 22, and the first surface 31 of the sealing resin 3 both oppose the wiring board 71. Also, in the case where the main surface conductive layer 281 covering the main surface 221 is an alloy layer containing Sn, the main surface conductive layer 281 is melted and fused to the conductive joining layer 72.

The semiconductor device A10 includes a semiconductor element 11 that has a front surface 111, a plurality of terminals 2 that are disposed at a distance from the semiconductor element 11 and are provided with a base part 21 and a projecting part 22, and a sealing resin 3 that covers the semiconductor element 11 and has a first surface 31 facing in the same direction as the front surface 111. The projecting part 22 projects from the base part 21 in the direction in which the front surface 111 faces, and has a main surface 221 that is flush with the first surface 31. Also, the terminals 2 are provided with a main surface conductive layer 281 that covers the main surface 221. By adopting this configuration, it becomes possible to achieve an even lower profile with the semiconductor device A10.

The main surface conductive layer 281 with which the terminals 2 of the semiconductor device A10 are provided is an alloy layer containing Sn. In this case, since the main surface conductive layer 281 melts and becomes integrated with the conductive joining layer 72 as shown in FIG. 21, the mounting strength of the semiconductor device A10 to the wiring board 71 can be secured. Also, by constituting the main surface conductive layer 281 with a Ni layer and an alloy layer containing Sn laminated one on the other, the terminals 2 can be protected from thermal shock in the mounting of the semiconductor device A10. Furthermore, by constituting the main surface conductive layer 281 with a Ni layer, a Pd layer and an Au layer laminated one on the other, the wettability of the conductive joining layer 72 to the terminals 2 can be improved, while protecting the terminals 2 from thermal shock in the mounting of the semiconductor device A10.

The terminals 2 of the semiconductor device A10 have a first side surface 23 that faces in the first direction X, and a second side surface 24 that faces in the second direction Y. Also, the sealing resin 3 of the semiconductor device A10 has a third surface 33 that faces in the first direction X and a fourth surface 34 that faces in the second direction Y. The first side surface 23 is flush with the third surface 33, and the second side surface 24 is flush with the fourth surface 34. By adopting this configuration, the dimensions of the sealing resin 3 in plan view are reduced, thus contributing to device miniaturization.

The semiconductor device A10 includes an insulation layer 12 that is disposed in contact with the back surface 112 facing in the opposite direction to the front surface 111 of the semiconductor element 11, and that is an electrical insulator. The insulation layer 12 is exposed from the second surface 32 of the sealing resin 3. Also, the length (thickness) of the insulation layer 12 in the thickness direction Z is shorter than the length (thickness) of the base part 21. By adopting this configuration, the length between the front surface 111 and the second surface 32 is shortened in the thickness direction Z, thus contributing to lowering the device profile.

In the terminals 2 of the semiconductor device A10, an internal conductive layer 29 covering the terminal surface 211 of the base part 21 is formed. The terminals 2 can be protected by the internal conductive layer 29 from thermal shock that occurs when electrically connecting the wire 4 to the terminal surface 211.

The sealing resin 3 of the semiconductor device A10 is an epoxy resin that contains glass frit. By applying such a sealing resin 3, an increase in the strength of the sealing resin 3 is achieved, and the occurrence of cracks in the sealing resin 3 can be prevented.

Also, in the manufacturing method of the semiconductor device A10, the process of exposing the projecting part 815 of the first base material 81 from the sealing resin 85 is provided before the process of forming the conductive layer 86. In this process, part of both the projecting part 815 of the first base material 81 and the sealing resin 85 is removed by mechanical polishing. Since the height (length in the thickness direction Z of the first base material 81) of the projecting part 815 of the first base material 81 can thus be reduced as much as possible to the extent that the wires 84 are not damaged, manufacture of the semiconductor device A10 that achieves a lower profile becomes possible. Also, the thickness of the projecting part 815 of the first base material 81 is freely adjustable.

According to the manufacturing method of the semiconductor device A10, the first base material 81 will be in a state where an electrical connection is secured by the base part 814 in both the first direction X and the second direction Y, as shown in FIG. 17, even in the case where part of the projecting part 815 is removed from the first base material 81. The conductive layer 86 can thus be formed by electrolytic plating.

In the manufacturing method of the semiconductor device A10, a process of preparing the first base material 81 on which the through part 816 that extends from the front surface 811 to the back surface 812 is formed and the second base material 82 that supports the first base material 81 from the back surface 812 is provided. By providing this process, the semiconductor element 831 can be mounted on the exposed part 821 of the second base material 82 that is exposed through the through part 816, thus enabling manufacture of the semiconductor device A10. Also, since the sealing resin 85 is formed in a state where the first base material 81 is reinforced against bending by the second base material 82, upward warpage occurring in the first base material 81 due to curing shrinkage of the sealing resin 85 can be suppressed.

Furthermore, according to the mounting structure of the semiconductor device A10, when the semiconductor device A10 has been mounted on the wiring board 71, the main surface 221 of the projecting part 22 and the first surface 31 of the sealing resin 3 both oppose the wiring board 71. By adopting this configuration, the distance between the magnet 63 disposed externally as shown in FIG. 6 and the semiconductor element 11 is reduced, in the case where the semiconductor element 11 is a Hall element, thus improving the detection accuracy of change in magnetic flux density by the semiconductor device A10. Also, in the case where the magnetosensitive layer 113 of the semiconductor element 11 is formed in proximity to the back surface 112, the detection accuracy of change in magnetic flux density by the semiconductor device A10 when adopting such a mounting structure is further improved.

Second Embodiment

Figure 22:
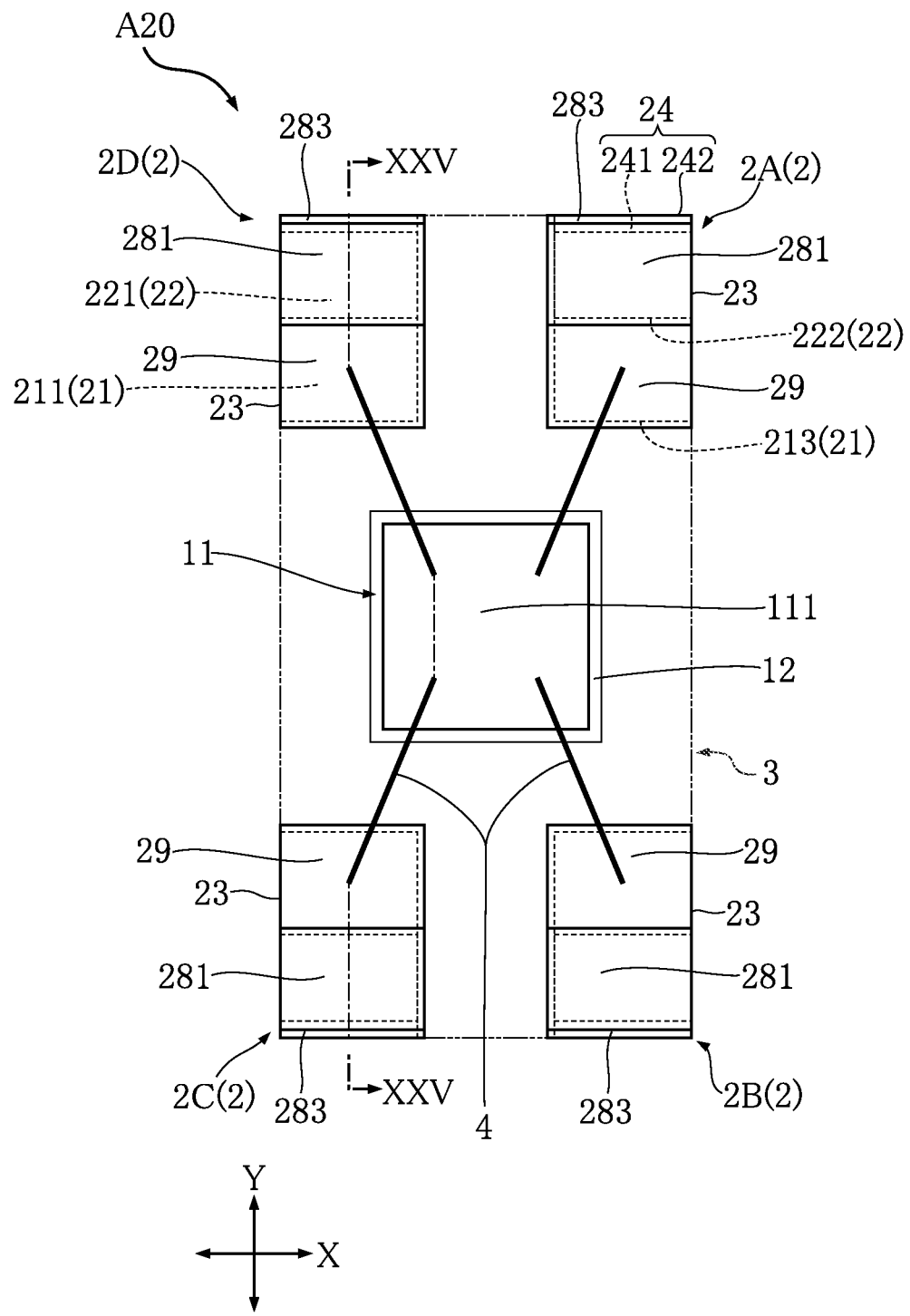
FIG. 22 is a plan view (sealing resin shown as see-through) of a semiconductor device according to a second embodiment of the present disclosure.

A semiconductor device A20 according to a second embodiment of the present disclosure will be described, based on FIG. 22 to FIG. 26. Here, FIG. 22 is a plan view of the semiconductor device A20, with the sealing resin 3 being shown as see-through, for convenience of understanding. In FIG. 22, an imaginary line shows the outer shape of the see-through sealing resin 3. FIG. 25 is a cross-sectional view along a XXV-XXV line (one-dot chain line shown in FIG. 22) of FIG. 22. Also, in FIG. 22 to FIG. 25, the reference signs of similar constituent elements that are duplicated with regard to the terminals 2 are omitted.

The semiconductor device A20 differs to the aforementioned semiconductor device A10 in the configurations of the plurality of terminals 2 and the sealing resin 3. As shown in FIG. 22, the semiconductor device A20 is rectangular in plan view. In the present embodiment, the terminals 2 are also disposed, like the semiconductor device A10, so that both the first side surface 23 and the second side surface 24 contact the corner of the semiconductor device A20 where the first direction X and the second direction Y intersect in plan view.

Figure 23:
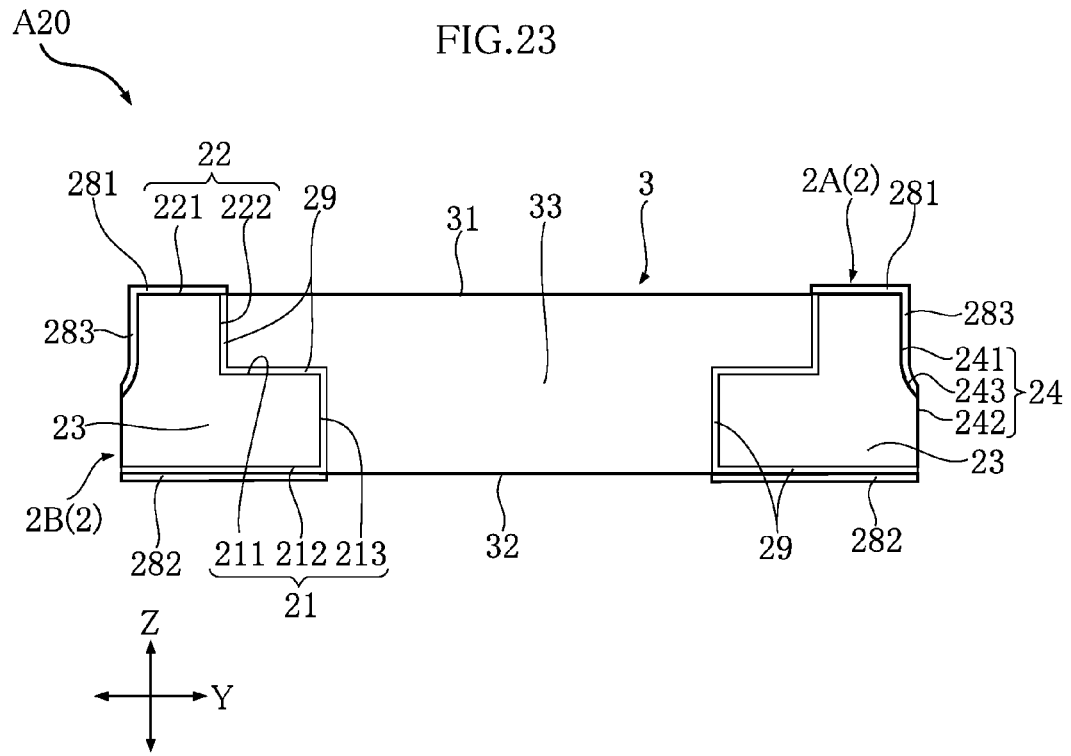
FIG. 23 is a right side view of the semiconductor device shown in FIG. 22.
Figure 24:
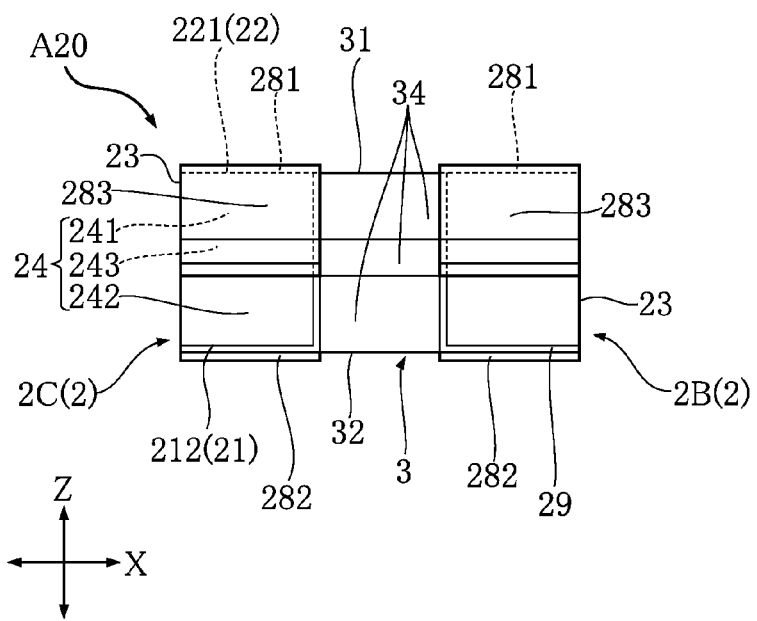
FIG. 24 is a front view of the semiconductor device shown in FIG. 22.
Figure 25:
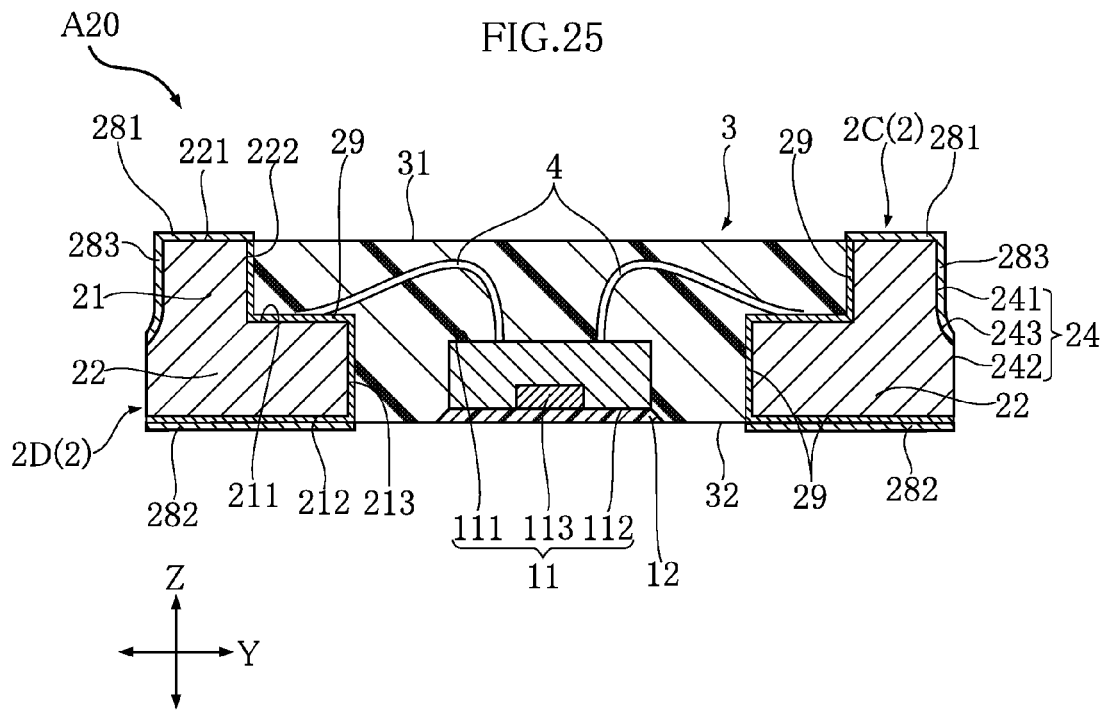
FIG. 25 is a cross-sectional view along a XXV-XXV line of FIG. 22.
Figure 26:
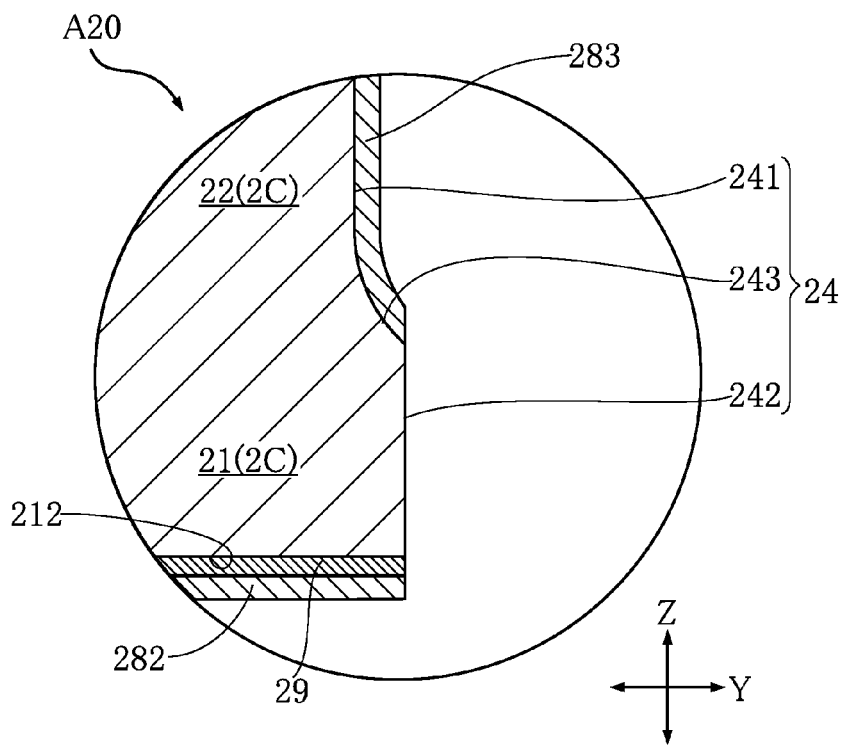
FIG. 26 is a partial enlarged view of FIG. 25.

As shown in FIG. 23 to FIG. 25, the second side surface 24 of the terminals 2 includes an inside surface 241 and an outside surface 242. The inside surface 241 and the outside surface 242 are both surfaces that face in the second direction Y and are connected to the first side surface 23. The inside surface 241 is a surface that is connected to the main surface 221 of the projecting part 22. The outside surface 242 is a surface that projects more to the outside of the semiconductor device A20 than the inside surface 241, and is connected to the bottom surface 212 of the base part 21. Also, as shown in FIG. 26, the second side surface 24 further includes an intermediate surface 243. The intermediate surface 243 is a surface that is connected at one end to the inside surface 241 and is connected at the other end to the outside surface 242 in the thickness direction Z. The intermediate surface 243 is a curved surface that faces the main surface 221 side of the projecting part 22 (upwardly in FIG. 26).

As shown in FIG. 22 to FIG. 26, the terminals 2 are provided with a side surface conductive layer 283 that covers the inside surface 241. The configuration of the side surface conductive layer 283 is the same as the configuration (composition) of the main surface conductive layer 281. The side surface conductive layer 283 is thus a conductive body.

As shown in FIG. 23 to FIG. 25, the inside surface 241, the outside surface 242 and the intermediate surface 243 are each connected to the fourth surface 34 of the sealing resin 3. The inside surface 241, the outside surface 242 and the intermediate surface 243 thus do not have a difference in level with the fourth surface 34 in the first direction X.

Next, an example of the manufacturing method of the semiconductor device A20 will be described, based on FIG. 27 to FIG. 30.

Figure 27:
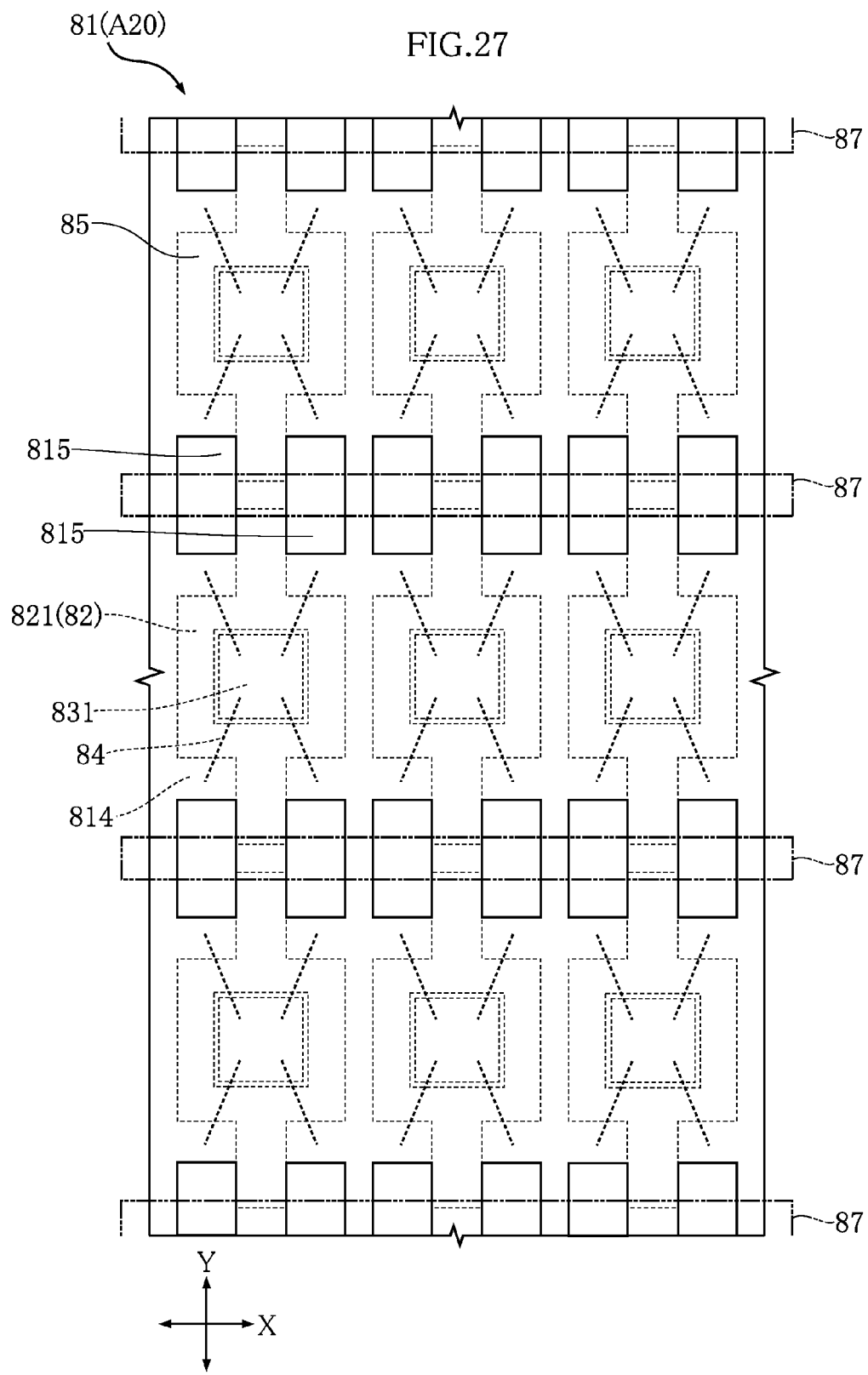
FIG. 27 is a plan view illustrating the manufacturing method of the semiconductor device shown in FIG. 22.
Figure 28:
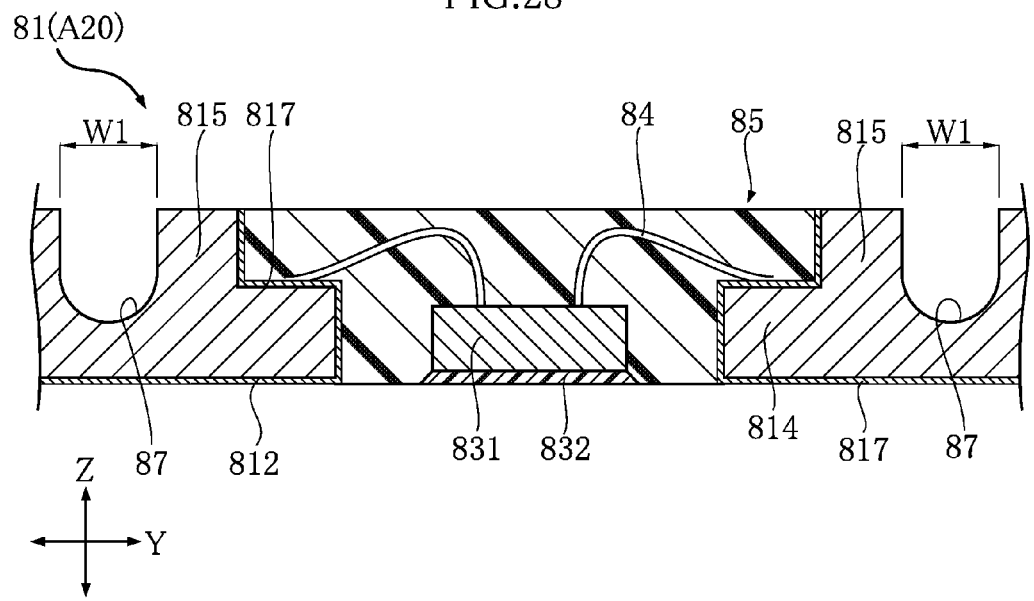
FIG. 28 is a cross-sectional view illustrating the manufacturing method of the semiconductor device shown in FIG. 22.
Figure 29:
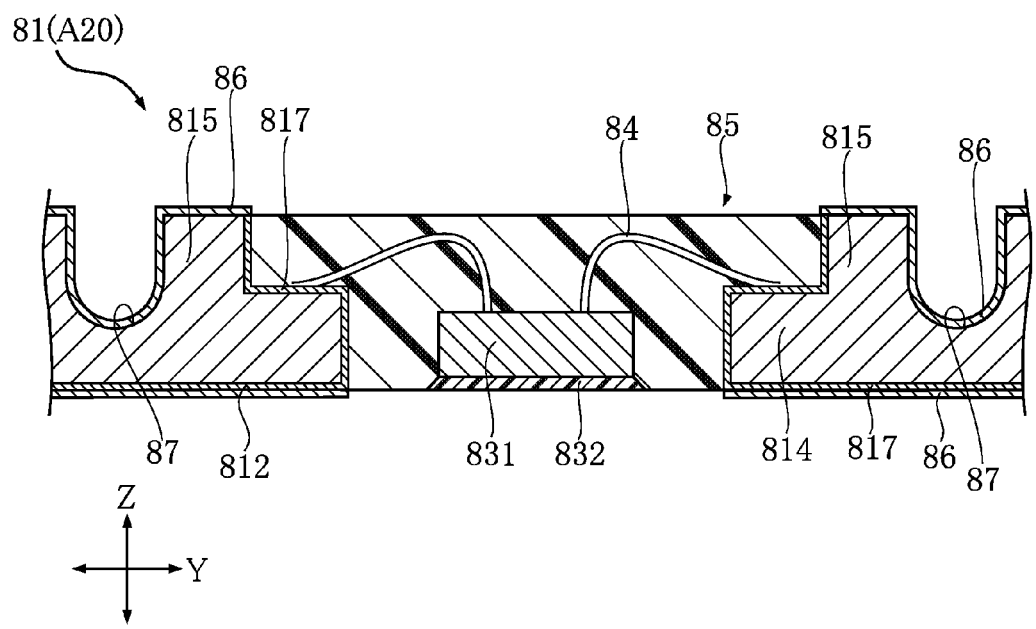
FIG. 29 is a cross-sectional view illustrating the manufacturing method of the semiconductor device shown in FIG. 22.
Figure 30:
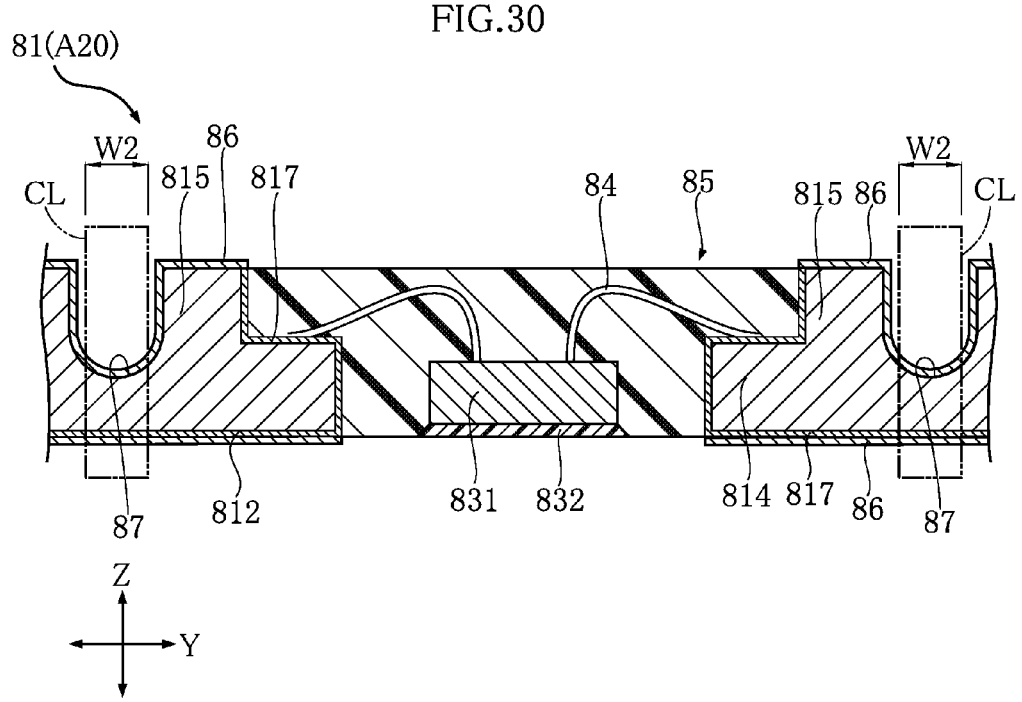
FIG. 30 is a cross-sectional view illustrating the manufacturing method of the semiconductor device shown in FIG. 22.

FIG. 28 to FIG. 30 are cross-sectional views illustrating the manufacturing method of the semiconductor device A20, with the position of the cross section thereof being the same as FIG. 25. Note that the thickness direction Z, the first direction X and the second direction Y of the first base material 81 shown in FIG. 27 to FIG. 30 correspond to the thickness direction Z, the first direction X and the second direction Y shown in FIG. 22 to FIG. 26.

Initially, a first base material 81 and a second base material 82 are prepared. Since this process is the same as the process of preparing the first base material 81 and the second base material 82 in the manufacture of the semiconductor device A10 shown in FIG. 7 to FIG. 12, description here is omitted. Accordingly, in the first base material 81 of the present embodiment, a base part 814, a projecting part 815, a through part 816 and an internal conductive layer 817 are formed. Also, the second base material 82 supports the first base material 81 from the back surface 812, and has an exposed part 821 that is exposed through the through part 816.

Next, the semiconductor element 831 is mounted on the exposed part 821 of the second base material 82. Since this process is the same as the process of mounting the semiconductor element 831 in the manufacture of the semiconductor device A10 shown in FIG. 13, description here is omitted.

Next, a wire 84 that electrically connect the semiconductor element 831 and the base part 814 of the first base material 81 are formed. Since this process is the same as the process of forming the wire 84 in the manufacture of the semiconductor device A10 shown in FIG. 14, description here is omitted.

Next, a sealing resin 85 that covers the first base material 81 and the semiconductor element 831 is formed. Since this process is the same as the process of forming the sealing resin 85 in the manufacture of the semiconductor device A10 shown in FIG. 15, description here is omitted.

Next, part of both the projecting part 815 of the first base material 81 and the sealing resin 85 is removed, and the projecting part 815 is exposed from the sealing resin 85. Since this process is the same as the process of exposing the projecting part 815 of the first base material 81 from the sealing resin 85 in the manufacture of the semiconductor device A10 shown in FIG. 16 and FIG. 17, description here is omitted.

Next, as shown in FIG. 27 and FIG. 28, a groove 87 that extends in the first direction X is formed in the first base material 81 from the opposite side to the back surface 812. In forming the groove 87, a dicing saw is used, for example. The portion enclosed by an imaginary line in FIG. 27 is the formation range of the groove 87. As shown in FIG. 28, part of the projecting part 815 of the first base material 81 is removed with the formation of the groove 87. In the present embodiment, part of both the base part 814 of the first base material 81 and the sealing resin 85 is further removed with the formation of the groove 87. The groove 87 is formed so as to have a width W1 (length in the second direction Y) shown in FIG. 28. Note that, in the present embodiment, the groove 87 does not pass through the base part 814 in the thickness direction Z of the first base material 81.

Next, as shown in FIG. 29, a conductive layer 86 that covers the projecting part 815 of the first base material 81 exposed from the sealing resin 85 is formed. In the present embodiment, a conductive layer 86 that covers the portion of the first base material 81 exposed due to the formation of the groove 87 is formed. The conductive layer 86 covering this portion corresponds to the side surface conductive layer 283 of the semiconductor device A10. The configuration and the formation method of the conductive layer 86 according to the present embodiment are the same as the configuration and the formation method of the conductive layer 86 according to the manufacture of the semiconductor device A10. In the semiconductor device A10, the configuration of the side surface conductive layer 283 will thus be the same as the configuration (composition) of the main surface conductive layer 281.

Next, individual pieces are formed, by sectioning the first base material 81 and the sealing resin 85 in the first direction X and the second direction Y. In the sectioning, the first base material 81 is sectioned from the back surface 812 using a dicing saw, for example. In the present embodiment, when sectioning the first base material 81 and the sealing resin 85 in the first direction X, the portion enclosed by a sectioning plane line CL shown with an imaginary line in FIG. 30 is removed. At this time, a width W2 (length in the second direction Y) of the sectioning plane line CL is set so as to be shorter than the width W1 of the groove 87. The individual pieces obtained in this process are semiconductor devices A20. The semiconductor device A20 is manufactured through the above processes.

The semiconductor device A20, like the aforementioned semiconductor device A10, includes a semiconductor element 11 that has a front surface 111, a plurality of terminals 2 that are disposed at a distance from the semiconductor element 11 and are provided with a base part 21 and a projecting part 22, and a sealing resin 3 that covers the semiconductor element 11. The sealing resin 3 has a first surface 31 that faces in the same direction as the front surface 111. Also, the projecting part 22 projects from the base part 21 in the direction in which the front surface 111 faces, and has a main surface 221 that is flush with the first surface 31. Furthermore, the terminals 2 are provided with a main surface conductive layer 281 that covers the main surface 221. Accordingly, it also becomes possible to achieve an even lower profile with the semiconductor device A20.

The terminals 2 of the semiconductor device A20 are provided with a side surface conductive layer 283 that covers an inside surface 241 included in the second side surface 24. By adopting this configuration, formation of a solder fillet on the inside surface 241 can be promoted, when the semiconductor device A20 has been mounted on a wiring board using a reflow method. Accordingly, it is possible to improve the mounting strength of the semiconductor device A20 to the wiring board compared with the semiconductor device A10.

The second side surface 24 of the terminals 2 of the semiconductor device A20 includes an outside surface 242 that projects more to the outside of the semiconductor device A20 than the inside surface 241. The outside surface 242 is formed in order to prevent cutting of the conductive layer 86 covering the portion of the first base material 81 exposed due to the formation of the groove 87, when sectioning the first base material 81 and the sealing resin 85 in the manufacture of the semiconductor device A20.

The process of exposing the projecting part 815 of the first base material 81 from the sealing resin 85 is also provided before the process of forming the conductive layer 86 with the manufacturing method of the semiconductor device A20. In this process, part of both the projecting part 815 of the first base material 81 and the sealing resin 85 is removed by mechanical polishing. Since the thickness of the projecting part 815 of the first base material 81 can be thus made as thin as possible to the extent that the wires 84 are not damaged, manufacture of the semiconductor device A20 becomes possible.

In the manufacturing method of the semiconductor device A20, the process of forming a groove 87 that extends in the first direction X from the opposite side to the back surface 812 in the first base material 81 is provided, before the process of forming the conductive layer 86. By providing such a process, in the process of forming the conductive layer 86, the side surface conductive layer 283 covering the inside surface 241 of the semiconductor device A20 can be formed.

According to the manufacturing method of the semiconductor device A20, the first base material 81 will be in a state in which an electrical connection is secured by the base part 814 in both the first direction X and the second direction Y, even in the case where the groove 87 is formed. The conductive layer 86 can thus also be formed by electrolytic plating with the manufacturing method of the semiconductor device A20.

Third Embodiment

Figure 31:
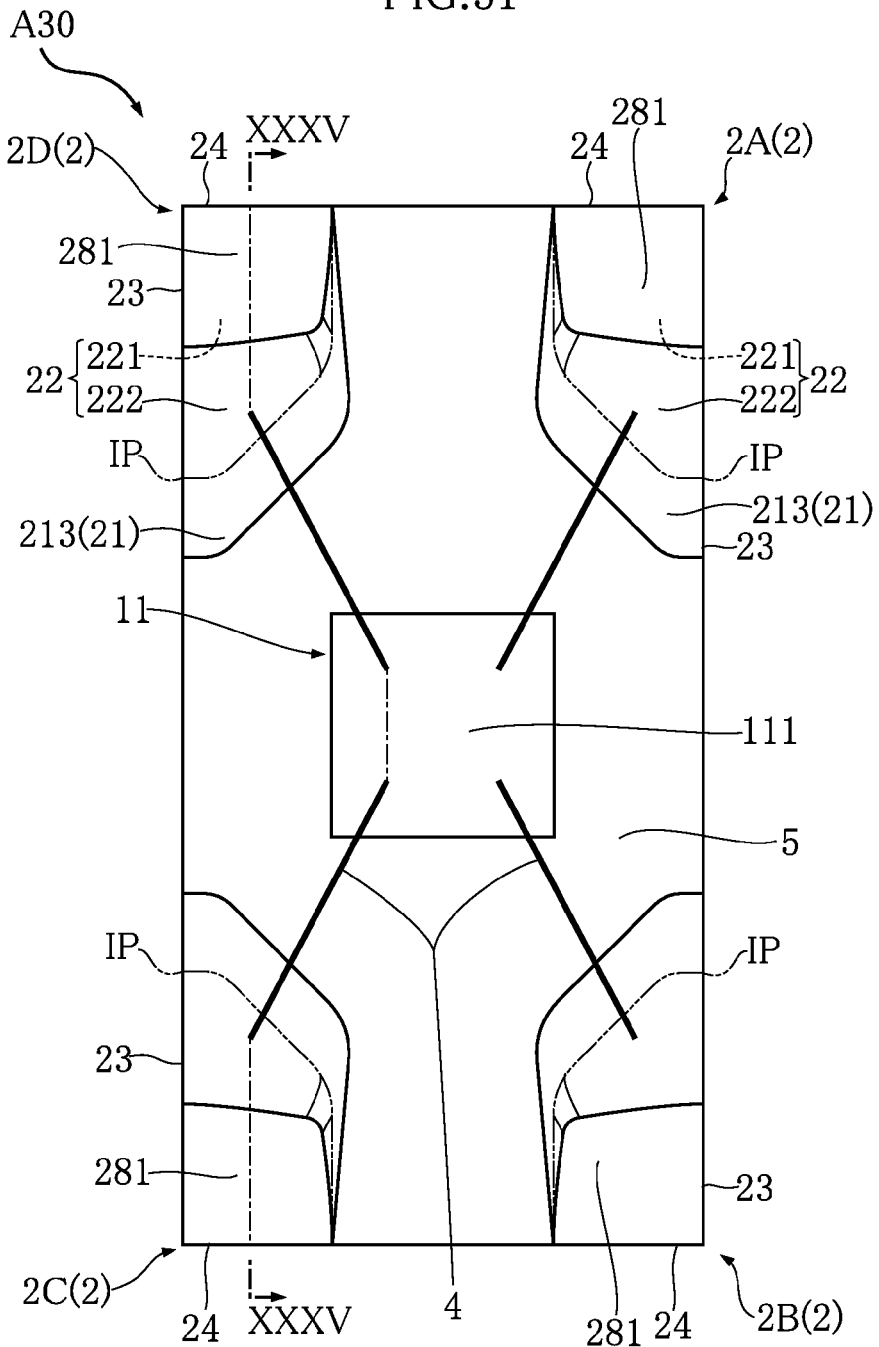
FIG. 31 is a plan view (sealing resin shown as see-through) of a semiconductor device according to a third embodiment of the present disclosure.

A semiconductor device A30 according to a third embodiment of the present disclosure will be described, based on FIG. 31 to FIG. 38. Here, FIG. 31 is a plan view of the semiconductor device A30, with the sealing resin 3 being shown as see-through and the internal conductive layer 29 being omitted, for convenience of understanding. FIG. 35 is a cross-sectional view along an XXXV-XXXV line (one-dot chain line shown in FIG. 31) of FIG. 31. Also, in FIG. 31 to FIG. 35, the reference signs of similar constituent elements that are duplicated with regard to the terminals 2 are omitted.

The semiconductor device A30 differs to the aforementioned semiconductor device A10 in the configuration of the plurality of terminals 2 and the provision of a heat dissipation layer 13 and an insulation film 5. As shown in FIG. 31, the semiconductor device A30 is rectangular in plan view. The configuration of the semiconductor element 11 according to the present embodiment is the same as the configuration (composition) of the semiconductor element 11 of the semiconductor device A10. A principal part (base part 21 and projecting part 22) of the terminals 2 according to the present embodiment is constituted from Cu or from an alloy whose main component is Cu. Note that, the main surface 221 of the projecting part 22 is also flush with the first surface 31 of the sealing resin 3 in the present embodiment, the same as the semiconductor device A10.

Figure 32:
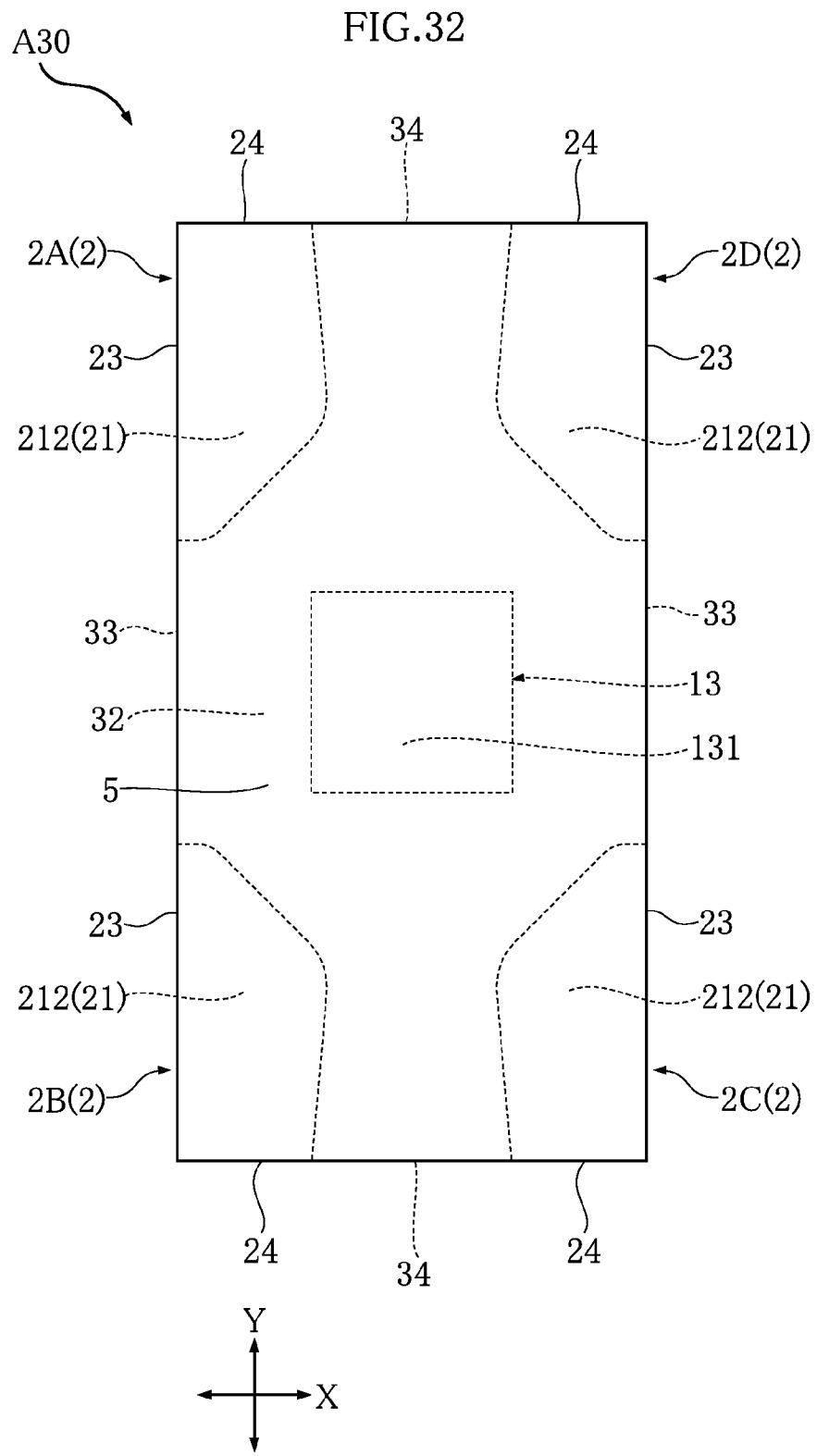
FIG. 32 is a bottom view of the semiconductor device shown in FIG. 31.
Figure 34:
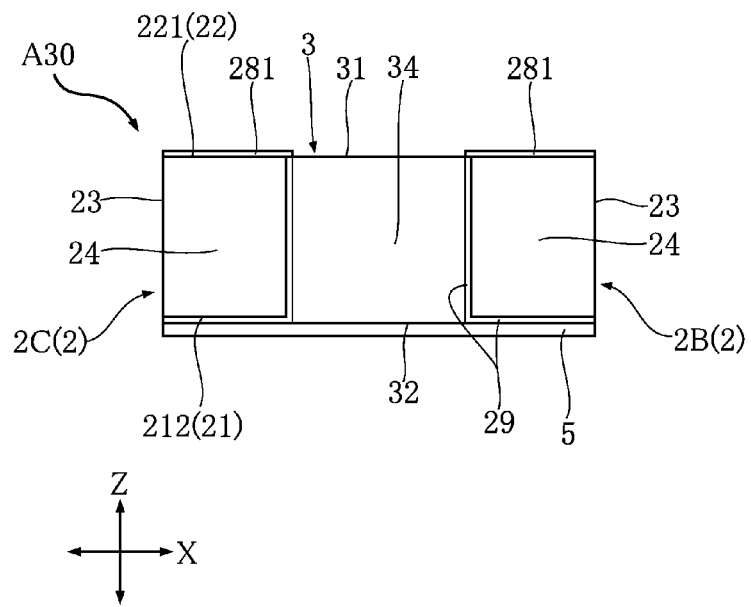
FIG. 34 is a front view of the semiconductor device shown in FIG. 31.
Figure 35:
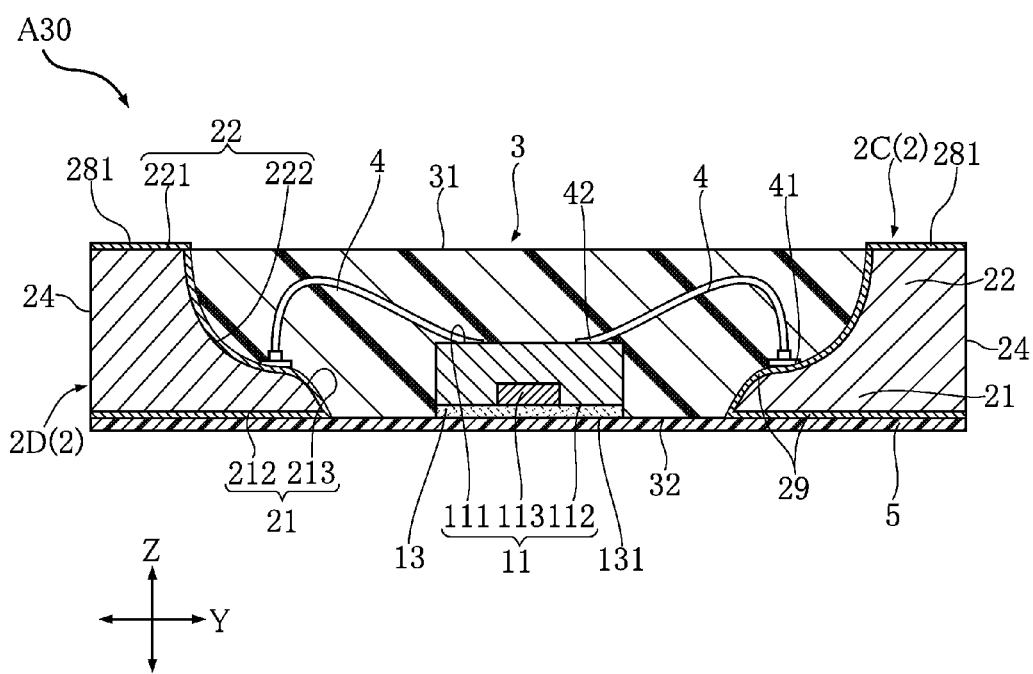
FIG. 35 is a cross-sectional view along an XXXV-XXXV line of FIG. 31.

As shown in FIG. 31, FIG. 32 and FIG. 34, the terminals 2 have a first side surface 23 that faces to the outside of the semiconductor device A30 in the first direction X. Also, the terminals 2 have a second side surface 24 that faces to the outside of the semiconductor device A30 in the second direction Y. In the corner of the semiconductor device A30 where the first direction X and the second direction Y intersect, the second side surface 24 intersects the first side surface 23. The terminals 2 are thus disposed so that both the first side surface 23 and the second side surface 24 contact the corner of the semiconductor device A30 where the first direction X and the second direction Y intersect in plan view. Note that, in the present embodiment, the same as the semiconductor device A10, the first side surface 23 is flush with the third surface 33 of the sealing resin 3, and the second side surface 24 is flush with the fourth surface 34 of the sealing resin 3.

Figure 33:
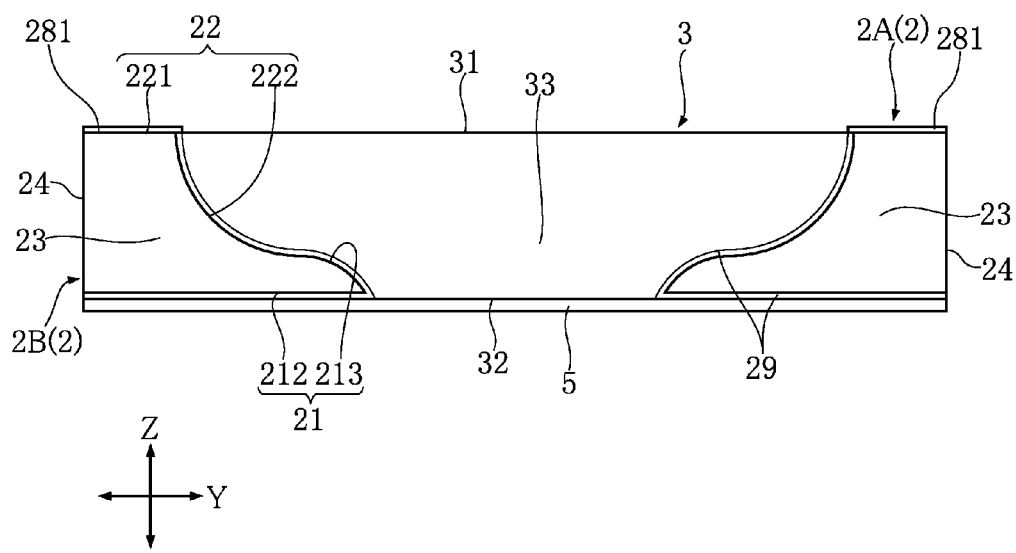
FIG. 33 is a right side view of the semiconductor device shown in FIG. 31.

As shown in FIG. 31, FIG. 33 and FIG. 35, the projecting part 22 of the terminals 2 has a first inner surface 222 that is at a distance from the second side surface 24 in the second direction Y, and that intersects the main surface 221. Also, the base part 21 of the terminals 2 has a second inner surface 213 that is at a distance from the second side surface 24 in the second direction Y, and that is connected to the first inner surface 222 and intersects the bottom surface 212. In the present embodiment, the terminal surface 211 is omitted in the base part 21, unlike the semiconductor device A10. The first inner surface 222 and the second inner surface 213 are both curved surfaces. The first inner surface 222 and the second inner surface 213 are connected by curved surfaces that are continuous with each other. The first inner surface 222 and the second inner surface 213 both intersect the first side surface 23 in the first direction X.

Figure 36:
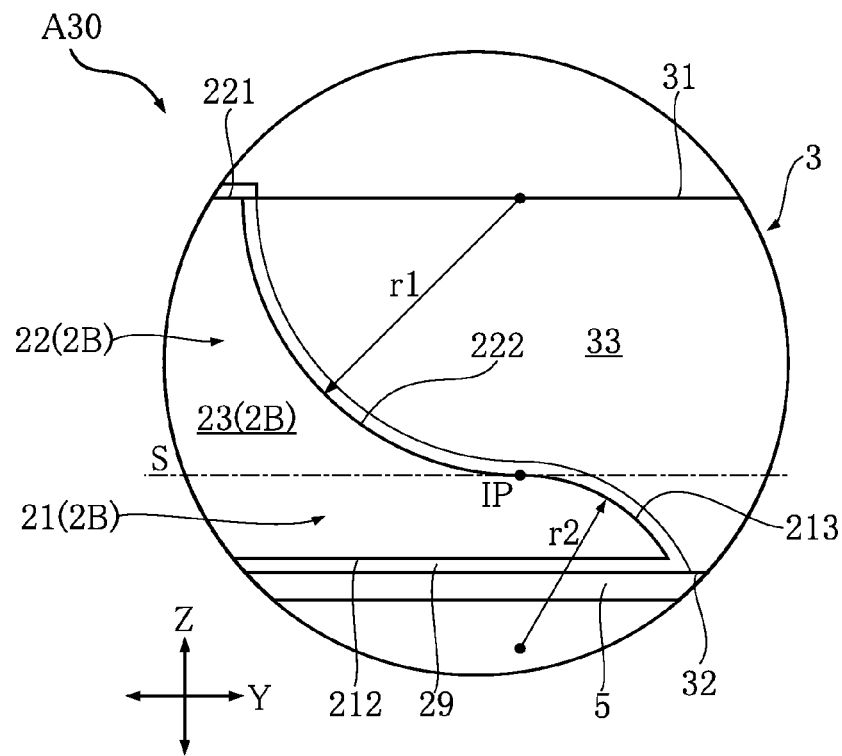
FIG. 36 is a partial enlarged view of FIG. 33.

As shown in FIG. 36, in the terminals 2, an inflection point IP exists at the boundary between the first inner surface 222 and the second inner surface 213 that intersect the first side surface 23. In the present embodiment, a plane S that is disposed in the first direction X and the second direction Y and passes through this boundary is given as the boundary between the base part 21 and the projecting part 22. In plan view, a two-dot chain line shows the locus through which the inflection point IP passes in FIG. 31. Also, the curved sections where the first inner surface 222 and the second inner surface 213 intersect the first side surface 23 are both circular arcs. In the present embodiment, a curvature radius r1 of the curved section of the first inner surface 222 is larger than a curvature radius r2 of the curved section of the second inner surface 213.

As shown in FIG. 33 and FIG. 35, the terminals 2 are provided with an internal conductive layer 29 that covers the first inner surface 222 and the second inner surface 213. The internal conductive layer 29 is an Ag layer. Also, in the present embodiment, the internal conductive layer 29 also covers the bottom surface 212 of the base part 21. The internal conductive layer 29 may be configured to not cover the bottom surface 212.

As shown in FIG. 35, the wire 4 electrically connects the front surface 111 of the semiconductor element 11 and the first inner surface 222 of the terminals 2 (projecting part 22) to each other. The wire 4 may be configured to electrically connect both the first inner surface 222 and the second inner surface 213 of the terminals 2 (base part 21). In the present embodiment, the wire 4 has a first connection part 41 that is connected to the internal conductive layer 29 covering the first inner surface 222, and a second connection part 42 that is connected to an electrode pad formed on the front surface 111. Here, the first connection part 41 is a so-called ball bonding part. Also, the second connection part is a so-called stitch bonding part. The wire 4 may have the opposite connection mode to this, that is, a connection mode in which the first connection part 41 is connected to an electrode pad formed on the front surface 111, and the second connection part 42 is connected to the internal conductive layer 29 covering the first inner surface 222. Note that the material constituting the wire 4 according to the present embodiment is the same as the wire 4 of the semiconductor device A10.

The main surface conductive layer 281 according to the present embodiment is an Ag layer. Also, the main surface conductive layer 281 may be constituted from a Ni layer, a Pd layer and an Au layer laminated one on the other. Furthermore, the main surface conductive layer 281 may be configured to include a Pd layer and an Au layer laminated one on the other, or configured to include an Au layer. In these configurations of the main surface conductive layer 281 including an Au layer, the Au layer in each case will be in a state of being exposed to the outside. Note that, in the present embodiment, the terminals 2 are not provided with a bottom surface conductive layer 282, unlike the semiconductor device A10.

As shown in FIG. 35, the semiconductor device A30 includes a heat dissipation layer 13 provided to contact the back surface 112 of the semiconductor element 11. The heat dissipation layer 13 is a conductive body. The heat dissipation layer 13 according to the present embodiment is constituted from a conductive die attach film. Note that the heat dissipation layer 13 may be constituted from a die attach paste (so-called Ag paste) that contains Ag. The heat dissipation layer 13 is exposed from the second surface 32 of the sealing resin 3. An exposed surface 131 of the heat dissipation layer 13 that is exposed from the sealing resin 3 is flush with the second surface 32.

Figure 37:
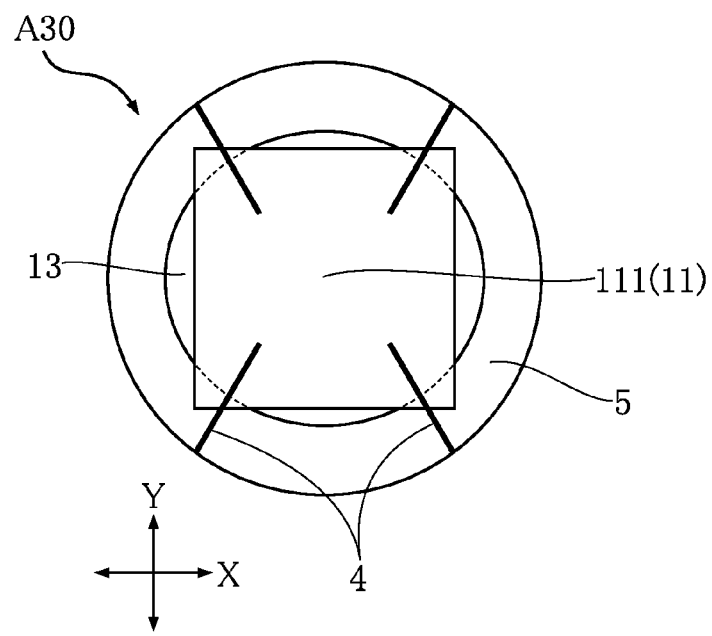
FIG. 37 is an enlarged plan view of the semiconductor device (in the case where a heat dissipation layer is constituted from Ag paste) shown in FIG. 31.

As shown in FIG. 31, FIG. 32 and FIG. 35, in the case where the heat dissipation layer 13 is constituted from a die attach film, the position of the periphery of the heat dissipation layer 13 in plan view is the same as the position of the periphery of the semiconductor element 11. As shown in FIG. 37, in the case where the heat dissipation layer 13 is constituted from an Ag paste, the periphery of the heat dissipation layer 13 in plan view has a section located inside the periphery of the semiconductor element 11.

As shown in FIG. 31 to FIG. 35, the semiconductor device A30 includes an insulation film 5 that is provided in contact with the second surface 32 of the sealing resin 3 and has electrical insulating properties. The bottom surface 212 of the plurality of terminals 2 and the exposed surface 131 of the heat dissipation layer 13 are both covered by the insulation film 5. The insulation film 5 is constituted from a film material or a synthetic resin paste. The film material includes polyimide or polyamide-imide in the constituent elements thereof, for example. The synthetic resin paste includes an epoxy resin or a silicone resin in the constituent elements thereof, for example.

Figure 38:
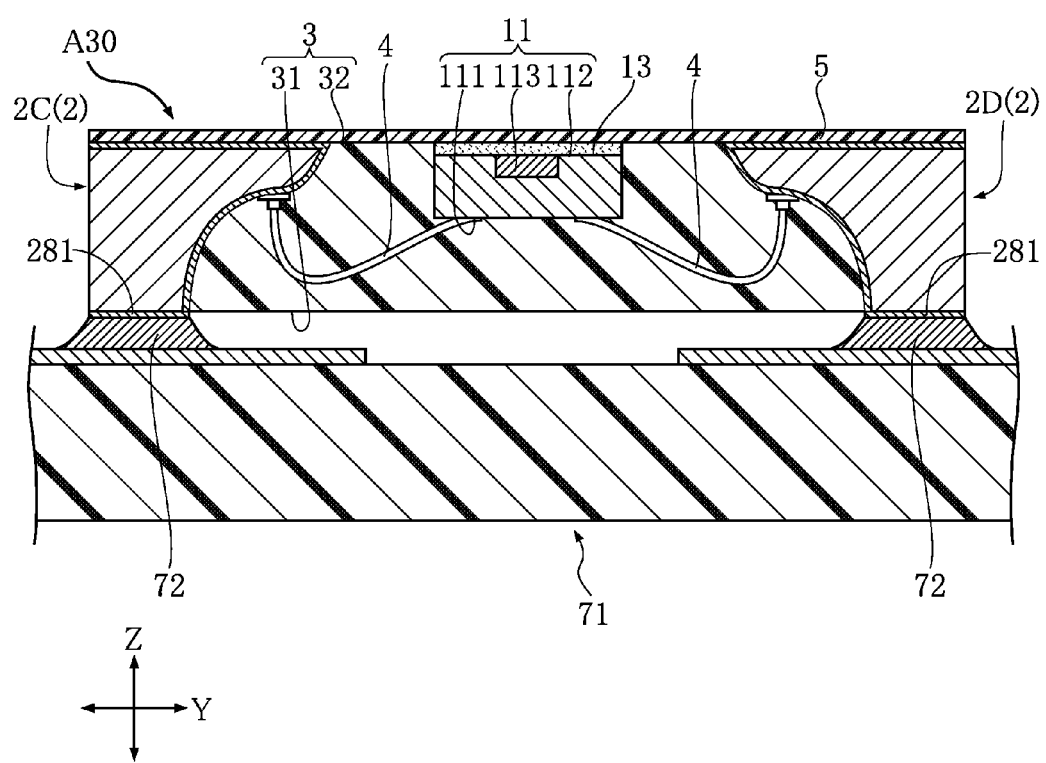
FIG. 38 is a cross-sectional view of the semiconductor device shown in FIG. 31 when mounted on a wiring board.

FIG. 38 shows the mounting structure of the semiconductor device A30 (the position of the cross section is the same as FIG. 35). When the semiconductor device A30 has been mounted on the wiring board 71 using a reflow method, the first surface 31 of the sealing resin 3 opposes the wiring board 71, and the conductive joining layer 72 for mounting the semiconductor device A30 on the wiring board 71 opposes (in the present embodiment, contacts) the main surface conductive layer 281. Note that the conductive joining layer 72 is constituted from a solder paste, for example.

The semiconductor device A30 includes a semiconductor element 11 that has a front surface 111, a plurality of terminals 2 that are provided with a base part 21 disposed at a distance from the semiconductor element 11 and are electrically connected to the front surface 111, and a sealing resin 3 that covers the semiconductor element 11. The terminals 2 are provided with a projecting part 22 that projects from the base part 21 in the direction in which the front surface 111 faces. The sealing resin 3 has a first surface 31 that faces in the same direction as the front surface 111, and a main surface 221 of the projecting part 22 is exposed from the first surface 31. This configuration is realized by reducing the height (length in the thickness direction Z) of the projecting part 22 as much as possible, when removing part of the sealing resin 3 that is located on the opposite side to the semiconductor element 11 in the thickness direction Z, at the time of manufacture of the semiconductor device A30 (see FIG. 16). Accordingly, by adopting this configuration, it becomes possible to achieve an even lower profile with the semiconductor device A30.

The semiconductor device A30 includes a heat dissipation layer 13 provided in contact with the back surface 112 of the semiconductor element 11. The heat dissipation layer 13 is exposed from the second surface 32 of the sealing resin 3. By adopting this configuration, heat generated from the semiconductor element 11 at the time of usage of the semiconductor device A30 can be efficiently released to the outside of the semiconductor device A30.

The semiconductor device A30 includes an insulation film 5 provided in contact with the second surface 32 of the sealing resin 3. The insulation film 5 covers the bottom surface 212 of the plurality of terminals 2 and the exposed surface 131 of the heat dissipation layer 13. By adopting this configuration, short circuits caused by the conductive joining layer 72 contacting a plurality of terminals 2 when the semiconductor device A30 has been mounted on the wiring board 71 and leaking of leakage current from the semiconductor element 11 at the time of usage of the semiconductor device A30 can be prevented.

In the terminals 2 of the semiconductor device A30, the first inner surface 222 of the projecting part 22 and the second inner surface 213 of the base part 21 are both curved surfaces. By adopting this configuration, concentration of stress that acts on the sealing resin 3 is alleviated compared with the semiconductor device A10, thus enabling the occurrence of cracks in the sealing resin 3 to be suppressed.

Also, the first inner surface 222 and the second inner surface 213 are connected by curved surfaces that are continuous with each other. Additionally, in the terminals 2, an inflection point IP exists at the boundary between the first inner surface 222 and the second inner surface 213 that intersect the first side surface 23. By adopting this configuration, the vicinity of the boundary between the first inner surface 222 and the second inner surface 213 forms a substantially flat surface, and thus can be said to be favorable from the viewpoint of the joinability of the wire 4 in electrically connecting the wire 4 to the first inner surface 222.

According to the mounting structure of the semiconductor device A30, when the semiconductor device A30 has been mounted on the wiring board 71, the first surface 31 of the sealing resin 3 opposes the wiring board 71, and the conductive joining layer 72 opposes the main surface conductive layer 281. By adopting this configuration, the distance between the magnet 63 disposed externally as shown in FIG. 6 and the semiconductor element 11 is reduced, in the case where the semiconductor element 11 is a Hall element, thus improving the detection accuracy of change in magnetic flux density by the semiconductor device A30. Note that the main surface conductive layer 281 according to the present embodiment is an Ag layer. The main surface conductive layer 281 thus has an effect of protecting the terminals 2 from thermal shock caused by the conductive joining layer 72 in the mounting of the semiconductor device A30.

Variation of Third Embodiment

Figure 39:
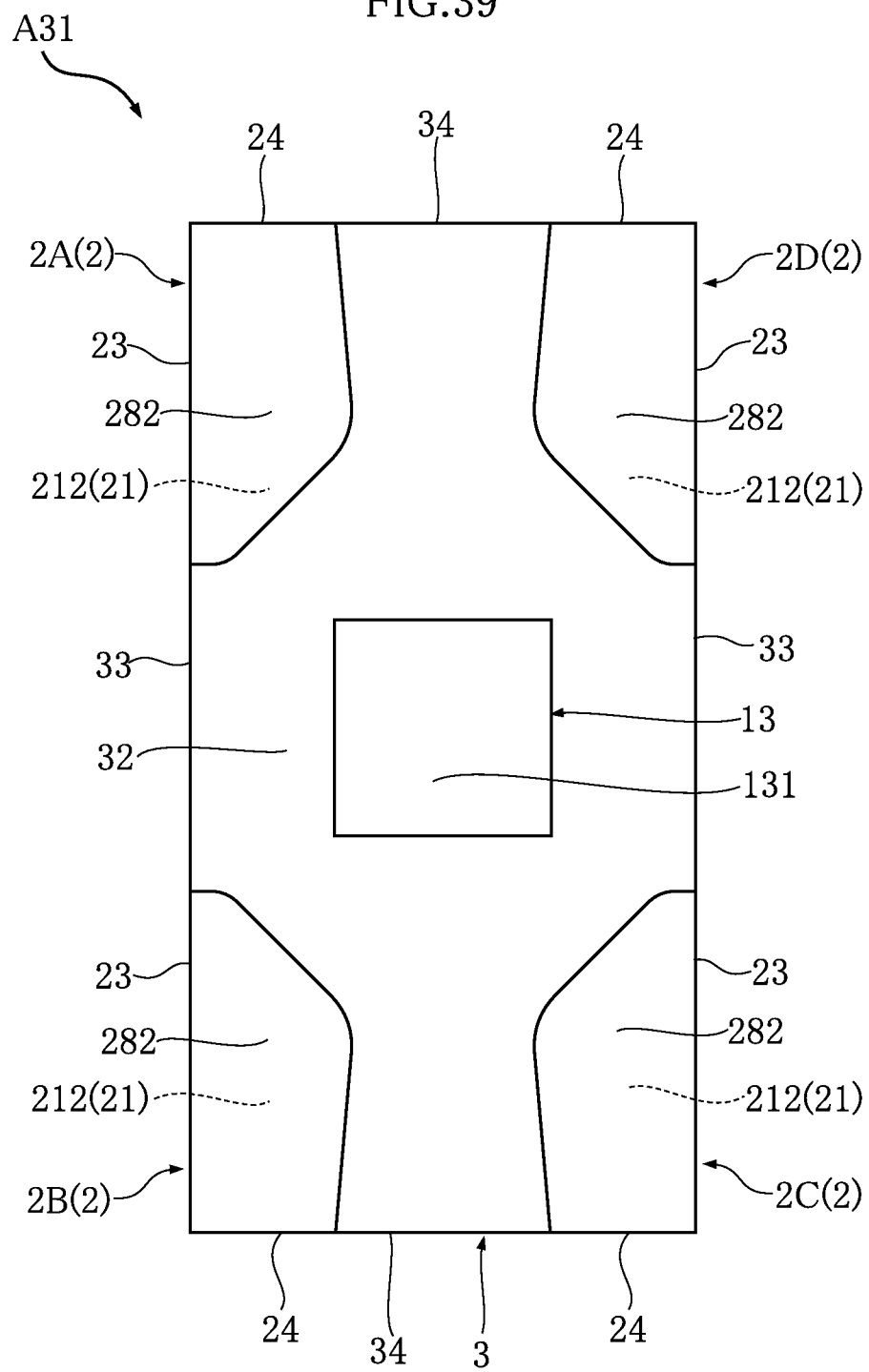
FIG. 39 is a bottom view of the semiconductor device according to a variation of the third embodiment of the present disclosure.

A semiconductor device A31 according to a variation of the third embodiment of the present disclosure will be described, based on FIG. 39 to FIG. 41. Here, FIG. 40 is a cross-sectional view of the semiconductor device A31, and the position of the cross section is the same as FIG. 35.

The semiconductor device A31 differs to the aforementioned semiconductor device A30 in not being provided with the insulation film 5. As shown in FIG. 39 and FIG. 40, on the first surface 31 of the sealing resin 3, the exposed surface 131 of the heat dissipation layer 13 and the plurality of terminals 2 are both exposed to the outside of the semiconductor device A31. Note that in this variation, the terminals 2 are provided with a bottom surface conductive layer 282 along with a main surface conductive layer 281.

Figure 40:
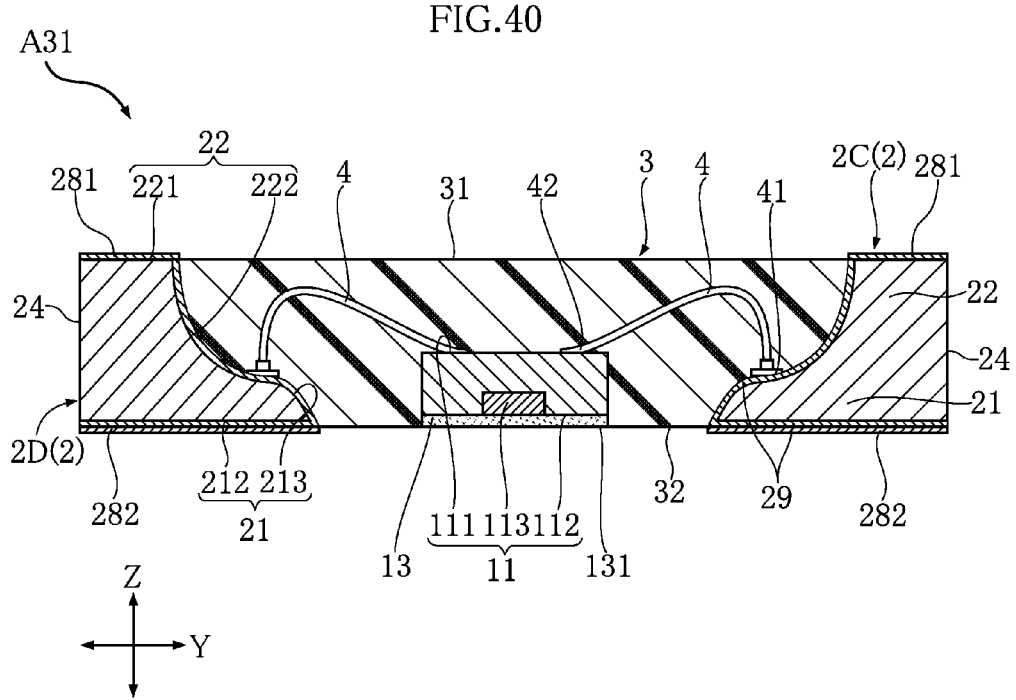
FIG. 40 is a cross-sectional view of the semiconductor device shown in FIG. 39.
Figure 41:
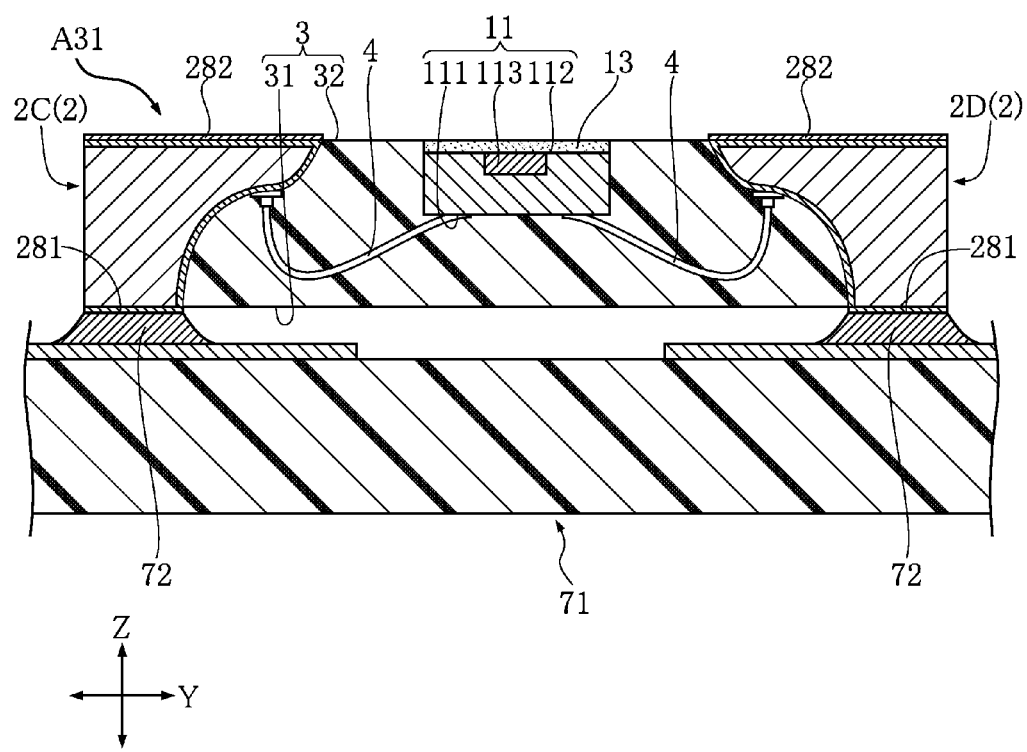
FIG. 41 is a cross-sectional view of the semiconductor device shown in FIG. 39 when mounted on a wiring board.

FIG. 41 shows the mounting structure of the semiconductor device A31 (the position of the cross section is the same as FIG. 40). The mounting structure of the semiconductor device A31 is the same as the semiconductor device A30 shown in FIG. 38.

With the semiconductor device A31, the configurations of the semiconductor element 11, the plurality of terminals 2 and the sealing resin 3 are the same as the semiconductor device A30. Accordingly, it also becomes possible to achieve an even lower profile with the semiconductor device A31. Also, the semiconductor device A31 is not provided with an insulation film 5, and is thus configured such that the exposed surface 131 of the heat dissipation layer 13 is exposed to the outside of the semiconductor device A31. The heat dissipation efficiency of the semiconductor device A31 can thus be improved over the semiconductor device A30.

Fourth Embodiment

Figure 42:
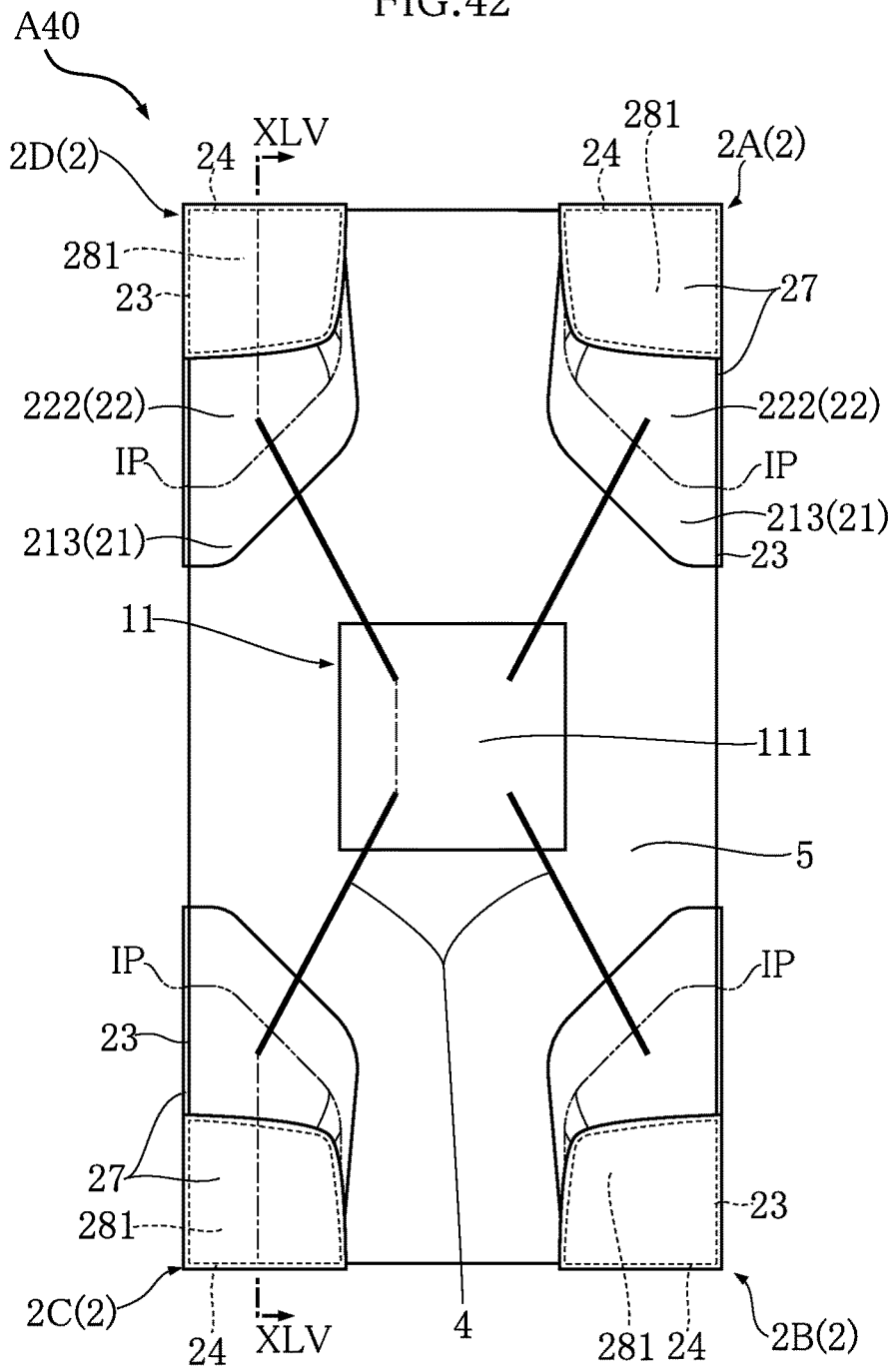
FIG. 42 is a plan view (sealing resin shown as see-through) of a semiconductor device according to a fourth embodiment of the present disclosure.
Figure 43:
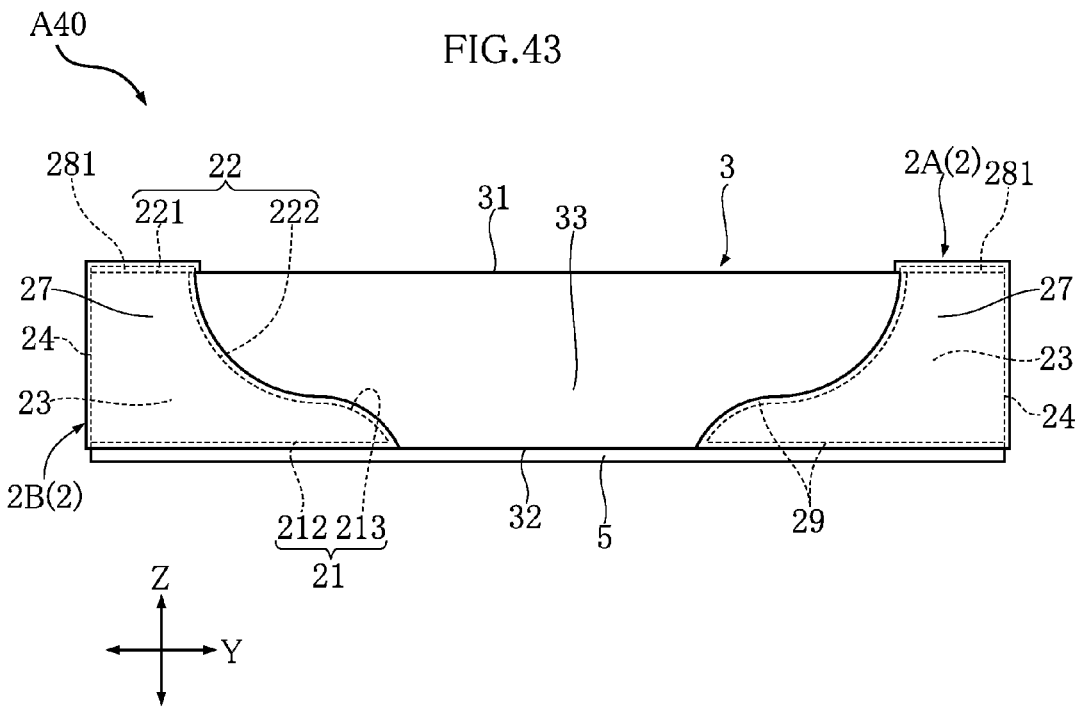
FIG. 43 is a right side view of the semiconductor device shown in FIG. 42.
Figure 44:
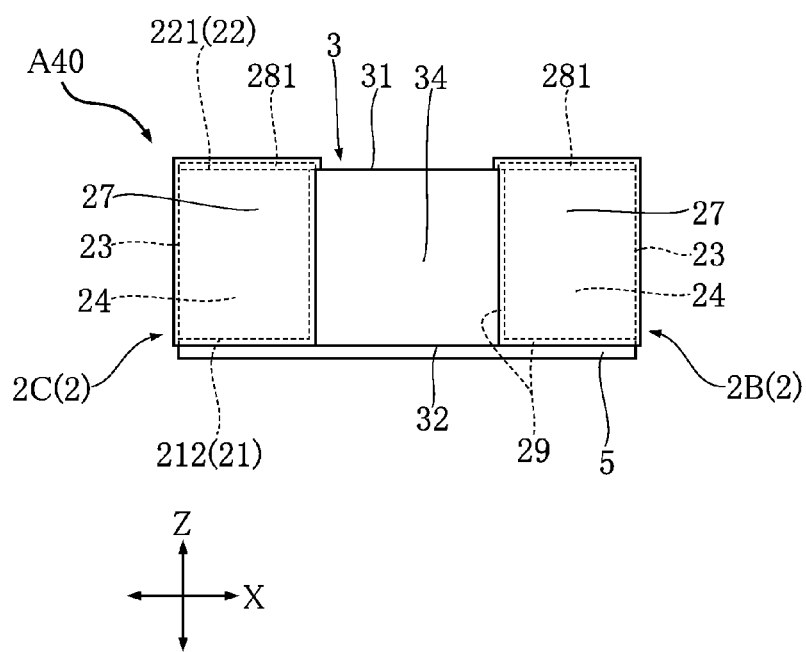
FIG. 44 is a front view of the semiconductor device shown in FIG. 42.
Figure 45:
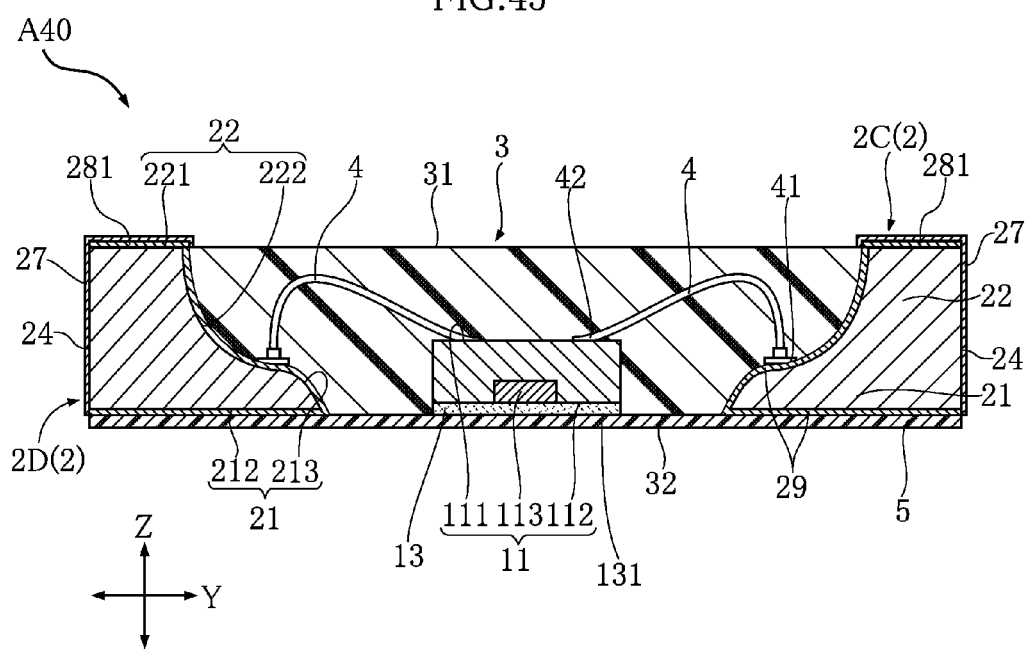
FIG. 45 is a cross-sectional view along a XLV-XLV line of FIG. 42.

A semiconductor device A40 according to a fourth embodiment of the present disclosure will be described, based on FIG. 42 to FIG. 47. Here, FIG. 42 is a plan view of the semiconductor device A40, with the sealing resin 3 being shown as see-through and the internal conductive layer 29 being omitted, for convenience of understanding. FIG. 45 is a cross-sectional view along a XLV-XLV line (one-dot chain line shown in FIG. 42) of FIG. 42. Also, in FIG. 42 to FIG. 45, the reference signs of similar constituent elements that are duplicated with regard to the terminals 2 are omitted.

The semiconductor device A40 differs to the aforementioned semiconductor device A30 in the configuration of a plurality of terminals 2. As shown in FIG. 42, the semiconductor device A40 is rectangular in plan view. In the present embodiment, the terminals 2 are also disposed, like the semiconductor device A30, so that both the first side surface 23 and the second side surface 24 contact the corner of the semiconductor device A40 where the first direction X and the second direction Y intersect in plan view.

As shown in FIG. 42 to FIG. 45, the terminals 2 are provided with a first side surface 23, a second side surface 24 and an external conductive layer 27 that covers the main surface conductive layer 281. The external conductive layer 27 can be formed by barrel plating, for example. The external conductive layer 27 according to the present embodiment is an alloy layer containing Sn. The alloy layer is a lead-free solder alloy such as a Sn—Sb alloy or a Sn—Ag alloy, for example. Also, the external conductive layer 27 may be constituted from a Ni layer and an alloy layer containing Sn laminated one on the other.

Figure 46:
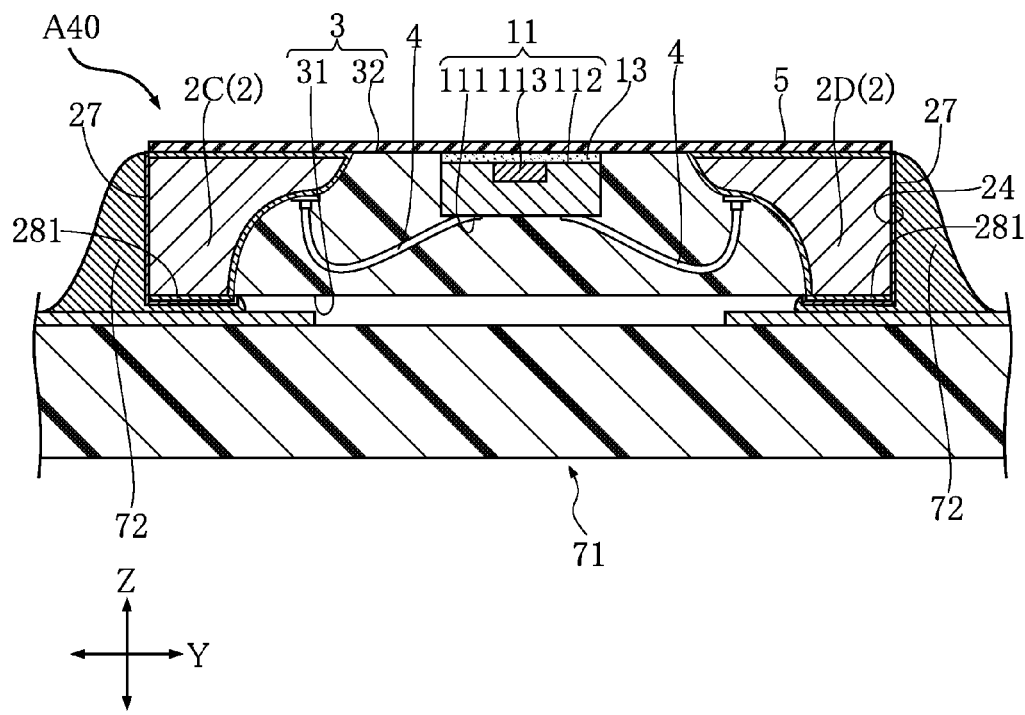
FIG. 46 is a cross-sectional view of the semiconductor device shown in FIG. 42 when mounted on a wiring board.

FIG. 46 shows a first mode of the mounting structure of the semiconductor device A40 (the position of the cross section is the same as FIG. 45). When the semiconductor device A40 has been mounted on the wiring board 71 using a reflow method, the first surface 31 of the sealing resin 3 opposes the wiring board 71, and the conductive joining layer 72 opposes the main surface conductive layer 281. In the present embodiment, part of the conductive joining layer 72 tucks around directly under the external conductive layer 27 covering the main surface conductive layer 281, and, furthermore, the conductive joining layer 72 reaches to the external conductive layer 27 that is located at the opposite side of both the first side surface 23 and the second side surface 24, with respect to the main surface conductive layer 281.

Figure 47:
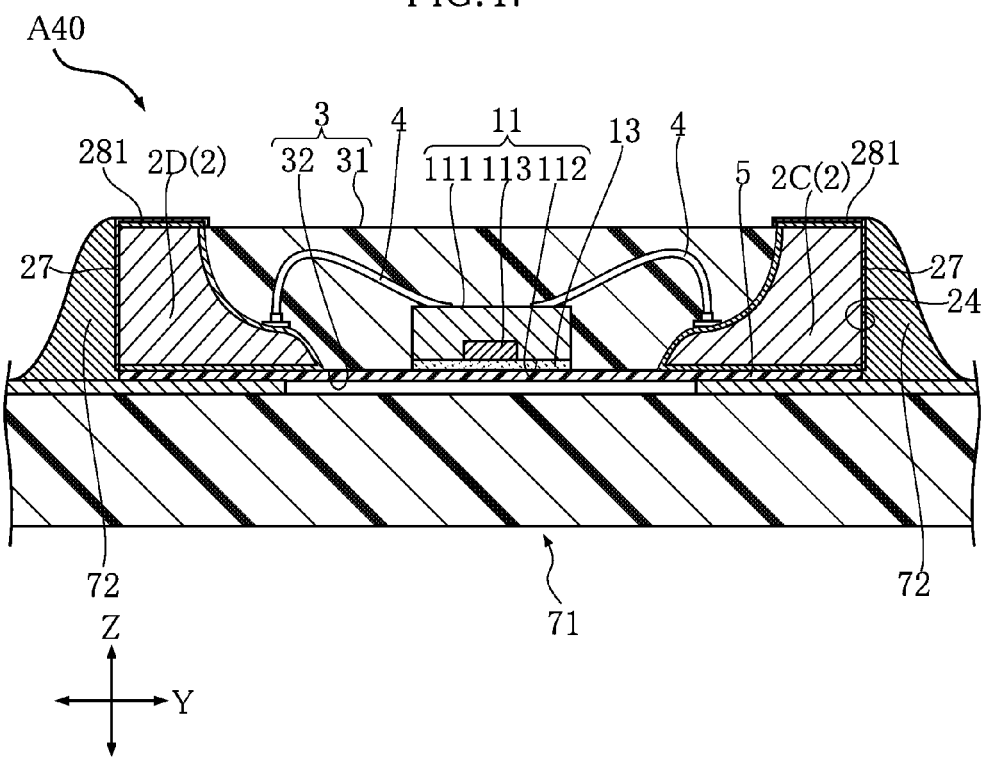
FIG. 47 is a cross-sectional view of the semiconductor device shown in FIG. 42 when mounted on a wiring board.

FIG. 47 shows a second mode of the mounting structure of the semiconductor device A40 (the position of the cross section is the same as FIG. 45). When the semiconductor device A40 has been mounted on the wiring board 71 using a reflow method, the insulation film 5 opposes the wiring board 71, and the conductive joining layer 72 contacts the external conductive layer 27. In the present embodiment, the insulation film 5 contacts the wiring board 71.

The semiconductor device A40, like the aforementioned semiconductor device A30, includes a semiconductor element 11 that has a front surface 111, a plurality of terminals 2 that are provided with a base part 21 disposed at a distance from the semiconductor element 11 and are electrically connected to the front surface 111, and a sealing resin 3 that covers the semiconductor element 11. The terminals 2 are provided with a projecting part 22 that projects from the base part 21 in the direction in which the front surface 111 faces. The sealing resin 3 has a first surface 31 that faces in the same direction as the front surface 111, and a main surface 221 of the projecting part 22 is exposed from the first surface 31. Accordingly, it also becomes possible to achieve an even lower profile with the semiconductor device A40.

The terminals 2 of the semiconductor device A40 are provided with a first side surface 23, a second side surface 24, and an external conductive layer 27 that covers the main surface conductive layer 281. By adopting this configuration, the second mode of the mounting structure of the semiconductor device A40 shown in FIG. 47 can be adopted as a result of the conductive joining layer 72 contacting the external conductive layer 27.

According to the second mode of the mounting structure of the semiconductor device A40 shown in FIG. 47, when the semiconductor device A40 has been mounted on the wiring board 71, the insulation film 5 opposes the wiring board 71, and the conductive joining layer 72 contacts the external conductive layer 27. By adopting this configuration, the conductive joining layer 72 is not interposed between the wiring board 71 and the semiconductor device A40, thus enabling the mounting height of the semiconductor device A40 to be lowered. Additionally, the contact surface area of the conductive joining layer 72 with the terminals 2 is larger than for the mounting structure of the semiconductor device A30, thus improving the mounting strength of the semiconductor device A40 to the wiring board 71. Also, by providing the insulation film 5, the occurrence of short-circuits caused by the conductive joining layer 72 contacting a plurality of terminals 2 when the semiconductor device A40 has been mounted on the wiring board 71 can be prevented. In this case, the wettability of the conductive joining layer 72 to the terminals 2 is good if the external conductive layer 27 is an alloy layer containing Sn, thus increasing the contact surface area of the conductive joining layer 72 with the terminals 2. Also, as a result of the external conductive layer 27 being constituted from a Ni layer and an alloy layer containing Sn laminated one on the other, the terminals 2 can be protected from thermal shock caused by the conductive joining layer 72 in the mounting of the semiconductor device A40.

Also, according to the first mode of the mounting structure of the semiconductor device A40 shown in FIG. 46, when the semiconductor device A40 has been mounted on the wiring board 71, the first surface 31 of the sealing resin 3 opposes the wiring board 71, and the conductive joining layer 72 opposes the main surface conductive layer 281. In this case, the conductive joining layer 72 also contacts the external conductive layer 27, like the second mode of the mounting structure of the semiconductor device A40 shown in FIG. 47. With regard to the contact surface area of the conductive joining layer 72 with the external conductive layer 27, the contact surface area with the external conductive layer 27 covering both the first side surface 23 and the second side surface 24 is larger than the contact surface area with the external conductive layer 27 covering the main surface conductive layer 281. The mounting strength of the semiconductor device A40 to the wiring board 71 can thus be improved over the mounting structure of the semiconductor device A30, while suppressing the amount of the conductive joining layer 72 that tucks around directly under the external conductive layer 27 covering the main surface conductive layer 281.

Fifth Embodiment

Figure 48:
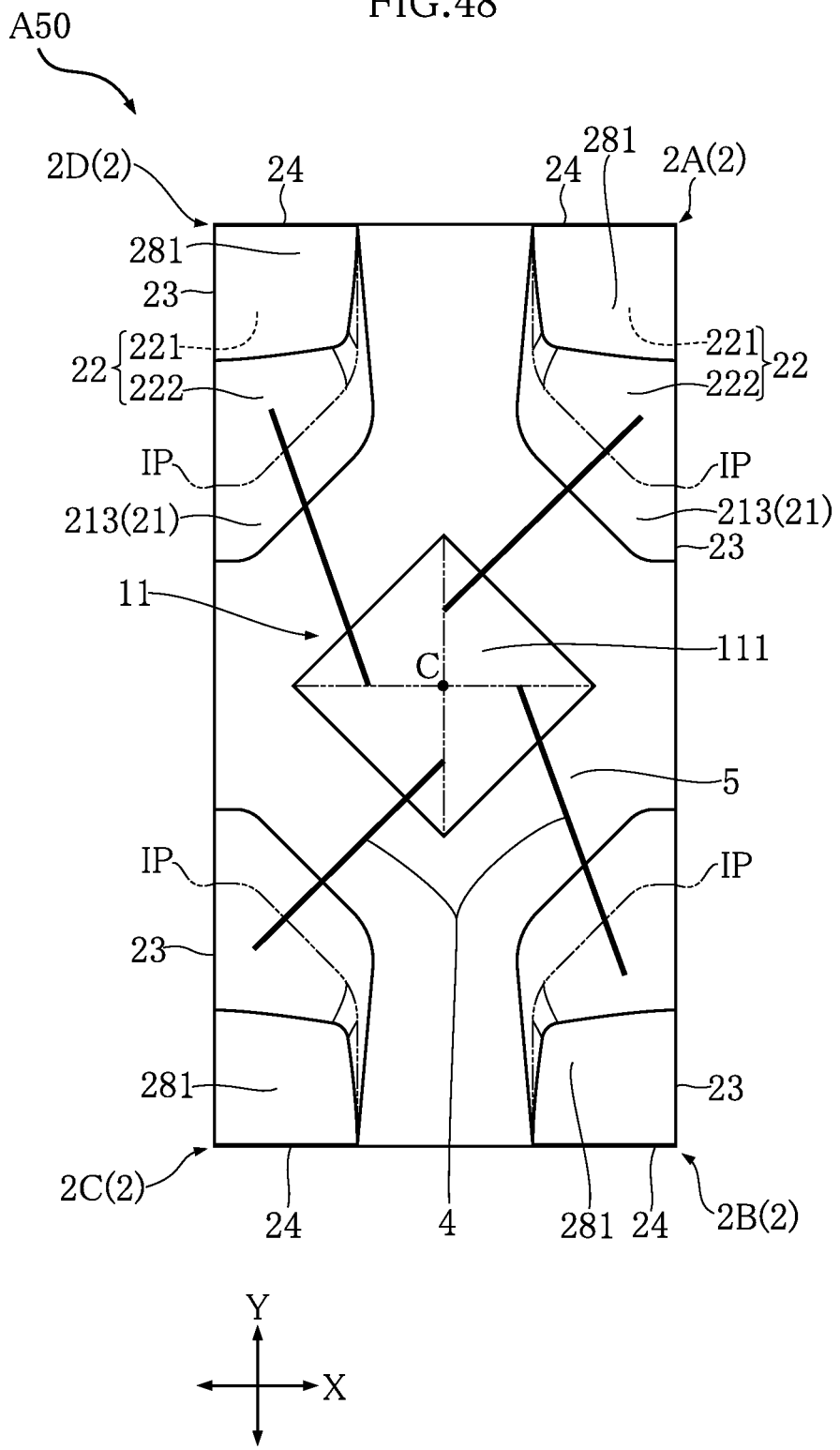
FIG. 48 is a plan view (sealing resin shown as see-through) of a semiconductor device according to a fifth embodiment of the present disclosure.

A semiconductor device A50 according to a fifth embodiment of the present disclosure will be described, based on FIG. 48 and FIG. 49. Here, FIG. 48 is a plan view of the semiconductor device A40, with the sealing resin 3 being shown as see-through and the internal conductive layer 29 being omitted, for convenience of understanding. Also, in FIG. 48 and FIG. 49, the reference signs of similar constituent elements that are duplicated with regard to the terminals 2 are omitted.

The semiconductor device A50 differs to the aforementioned semiconductor device A30 in the disposition mode of the semiconductor element 11. As shown in FIG. 48, the semiconductor device A50 is rectangular in plan view. In the present embodiment, the terminals 2 are also disposed, like the semiconductor device A30, so that both the first side surface 23 and the second side surface 24 contact the corner of the semiconductor device A50 where the first direction X and the second direction Y intersect in plan view.

Figure 49:
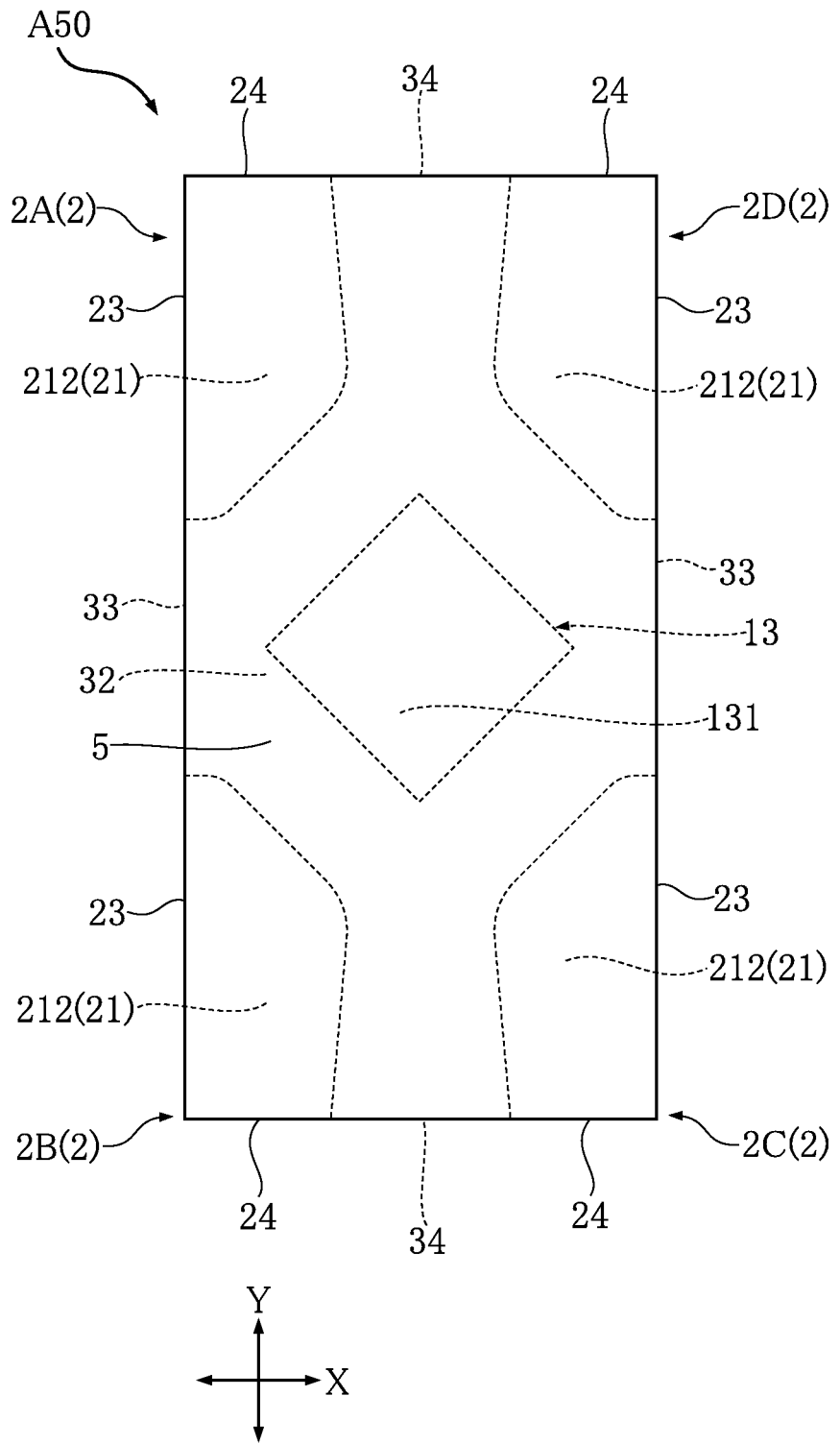
FIG. 49 is a bottom view of the semiconductor device shown in FIG. 48.

As shown in FIG. 48 and FIG. 49, the semiconductor element 11 is disposed in a state of having been rotated 45 degrees around the thickness direction Z relative to the semiconductor device A30. In this case, a rotation center C of the semiconductor element 11 shown in FIG. 48 is the intersection of the diagonal lines (two-dot chain lines shown in FIG. 48) of the semiconductor element 11. Note that the mounting structure of the semiconductor device A50 is the same as the mounting structure of the semiconductor device A30 shown in FIG. 38.

The semiconductor device A50, like the aforementioned semiconductor device A30, includes a semiconductor element 11 that has a front surface 111, a plurality of terminals 2 that are provided with a base part 21 disposed at a distance from the semiconductor element 11 and are electrically connected to the front surface 111, and a sealing resin 3 that covers the semiconductor element 11. The terminals 2 are provided with a projecting part 22 that projects from the base part 21 in the direction in which the front surface 111 faces. The sealing resin 3 has a first surface 31 that faces in the same direction as the front surface 111, and a main surface 221 of the projecting part 22 is exposed from the first surface 31. Accordingly, it also becomes possible to achieve an even lower profile with the semiconductor device A50.

The semiconductor element 11 is disposed in a state of being rotated 45 degrees around the thickness direction Z relative to the semiconductor device A30. By adopting such an disposition mode, the distance at which the terminals 2 are disposed from the semiconductor element 11 can be reduced to less than the semiconductor device A30. Accordingly, with the semiconductor device A50, further device miniaturization can be achieved.

Sixth Embodiment

Figure 50:
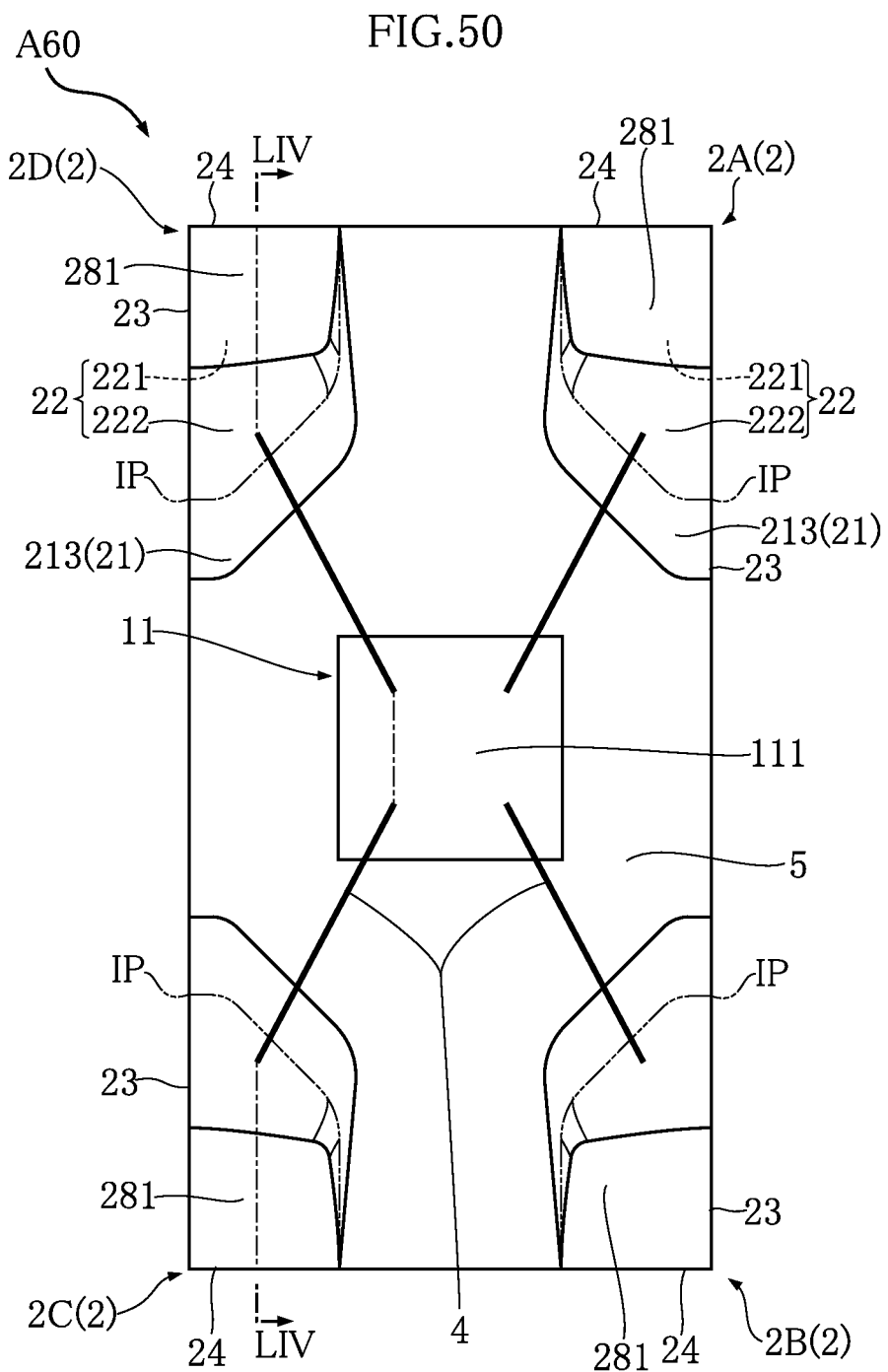
FIG. 50 is a plan view (sealing resin shown as see-through) of a semiconductor device according to a sixth embodiment of the present disclosure.
Figure 51:
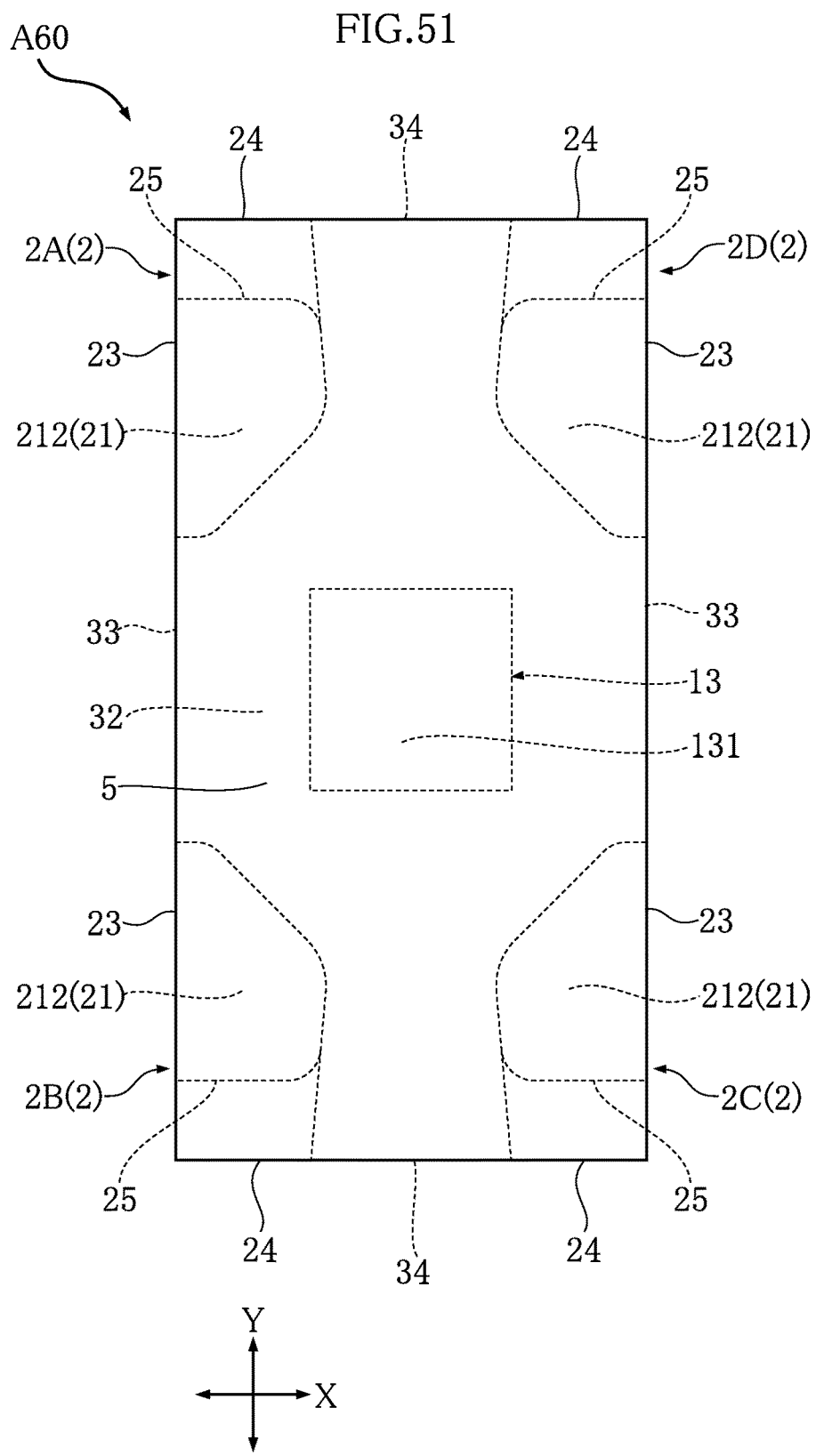
FIG. 51 is a bottom view of the semiconductor device shown in FIG. 50.
Figure 52:
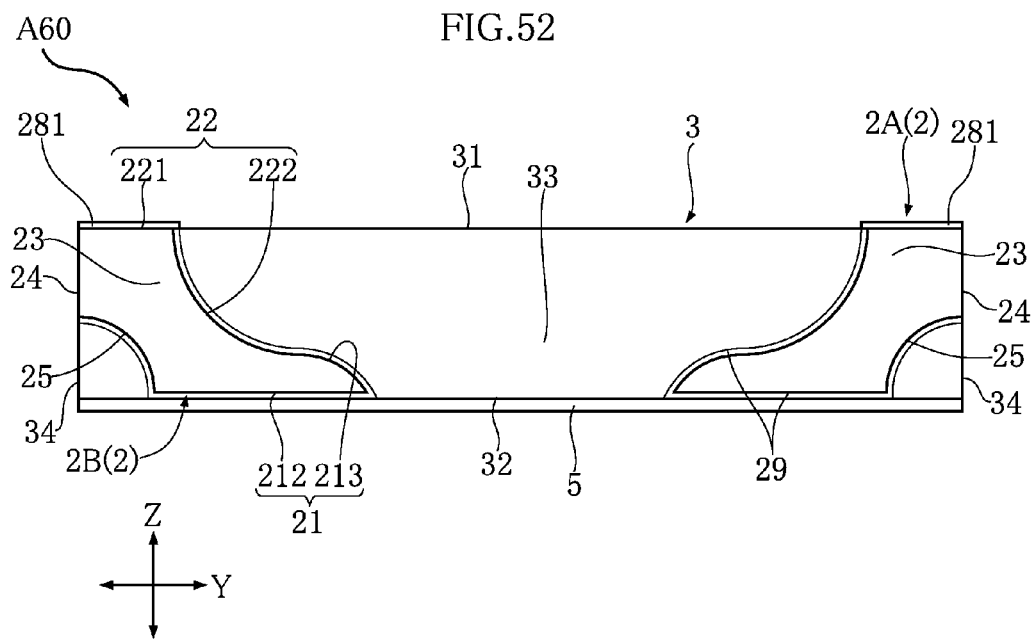
FIG. 52 is a right side view of the semiconductor device shown in FIG. 50.

A semiconductor device A60 according to a sixth embodiment of the present disclosure will be described, based on FIG. 50 to FIG. 55. Here, FIG. 50 is a plan view of the semiconductor device A60, with the sealing resin 3 being shown as see-through and the internal conductive layer 29 being omitted, for convenience of understanding. FIG. 54 is a cross-sectional view along a LIV-LIV line (one-dot chain line shown in FIG. 50) of FIG. 50. Also, in FIG. 50 to FIG. 54, the reference signs of similar constituent elements that are duplicated with regard to the terminals 2 are omitted.

The semiconductor device A60 differs to the aforementioned semiconductor device A30 in the configuration of the plurality of terminals 2. As shown in FIG. 50, the semiconductor device A60 is rectangular in plan view. In the present embodiment, the terminals 2 are also disposed, like the semiconductor device A30, so that both the first side surface 23 and the second side surface 24 contact the corner of the semiconductor device A60 where the first direction X and the second direction Y intersect in plan view.

Figure 53:
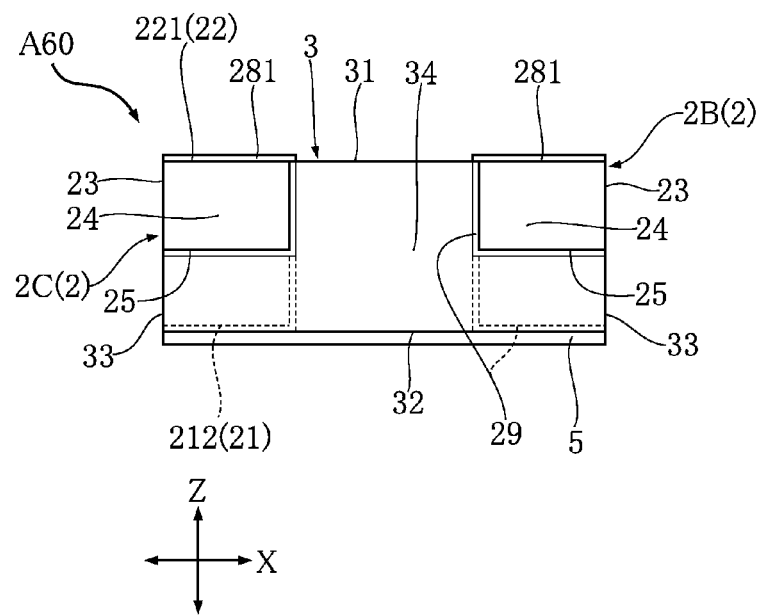
FIG. 53 is a front view of the semiconductor device shown in FIG. 50.
Figure 54:
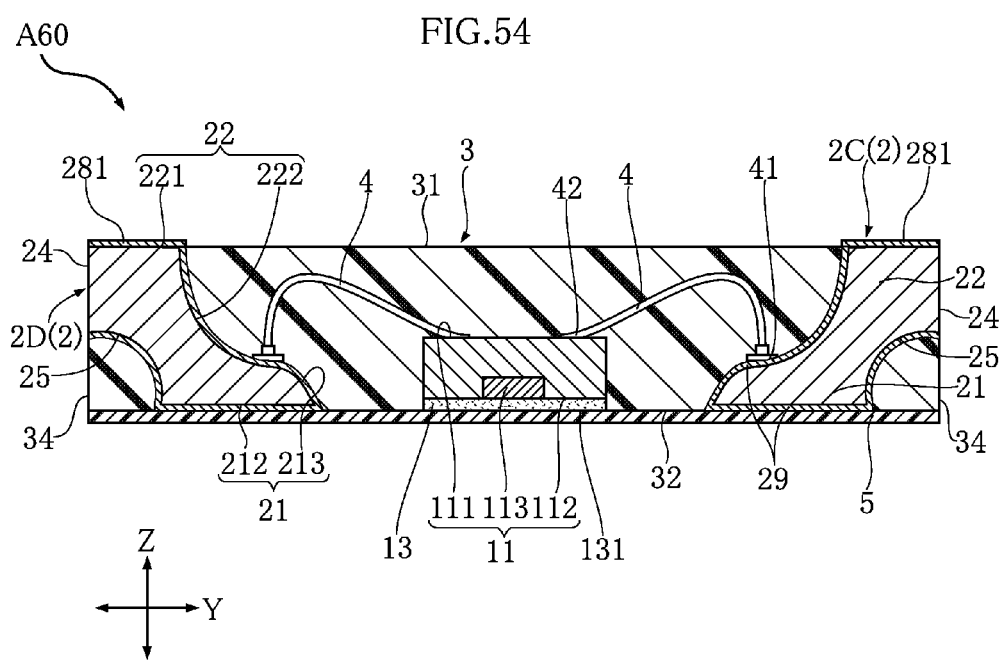
FIG. 54 is a cross-sectional view along a LIV-LIV line of FIG. 50.

As shown in FIG. 50 to FIG. 54, the terminals 2 have a recessed part 25. The recessed part 25 is recessed from both the bottom surface 212 of the base part 21 and the second side surface 24, and is formed to pass through the terminals 2 in the first direction X. The sealing resin 3 opposes the recessed part 25. The present embodiment has a configuration in which the sealing resin 3 is filled into the recessed part 25. Thus, as shown in FIG. 53, in the sealing resin 3, the length of the boundary between the second surface 32 and the fourth surface 34 matches the length of the semiconductor device A60 in the first direction X. Note that as shown in FIG. 54, the internal conductive layer 29 is configured to cover the inner peripheral surface of the recessed part 25, in addition to the configuration of the internal conductive layer 29 of the semiconductor device A30.

Figure 55:
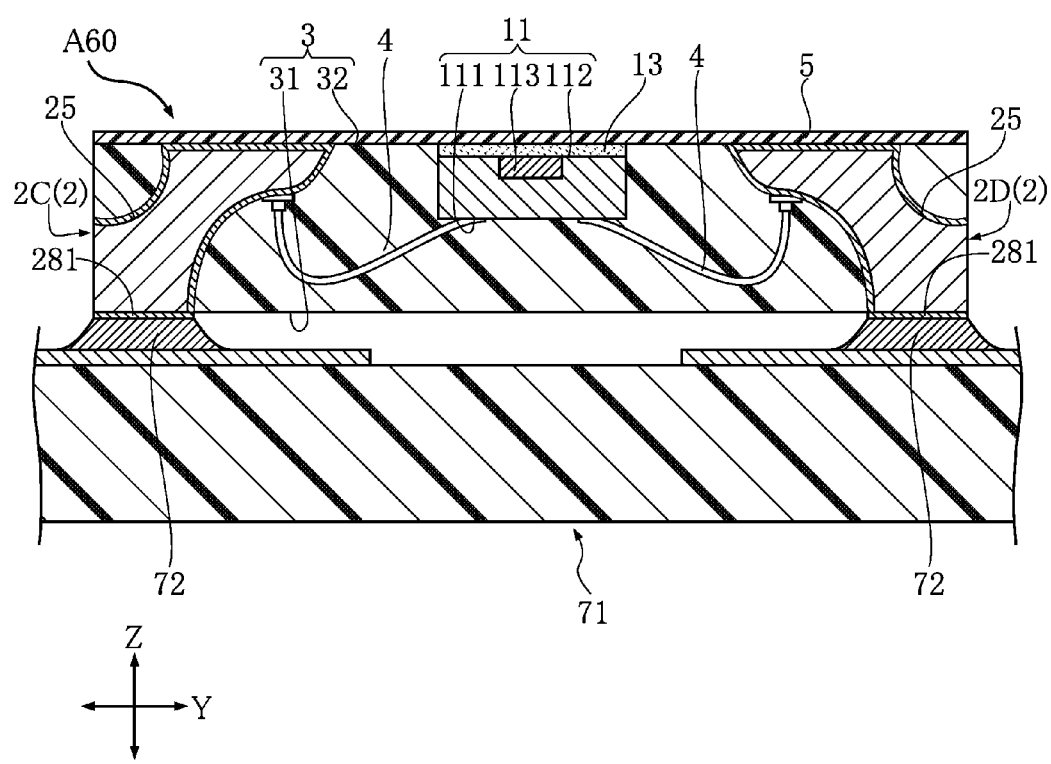
FIG. 55 is a cross-sectional view of the semiconductor device shown in FIG. 50 when mounted on a wiring board.

FIG. 55 shows the mounting structure of the semiconductor device A60 (the position of the cross section is the same as FIG. 54). When the semiconductor device A60 has been mounted on the wiring board 71 using a reflow method, the first surface 31 of the sealing resin 3 opposes the wiring board 71, and the conductive joining layer 72 opposes the main surface conductive layer 281.

The semiconductor device A60, like the aforementioned semiconductor device A30, includes a semiconductor element 11 that has a front surface 111, a plurality of terminals 2 that are provided with a base part 21 disposed at a distance from the semiconductor element 11 and are electrically connected to the front surface 111, and a sealing resin 3 that covers the semiconductor element 11. The terminals 2 are provided with a projecting part 22 that projects from the base part 21 in the direction in which the front surface 111 faces. The sealing resin 3 has a first surface 31 that faces in the same direction as the front surface 111, and a main surface 221 of the projecting part 22 is exposed from the first surface 31. Accordingly, it also becomes possible to achieve an even lower profile with the semiconductor device A60.

The terminals 2 of the semiconductor device A60 has a recessed part 25 that is recessed from both the bottom surface 212 of the base part 21, and the second side surface 24, and is formed to pass through the terminals 2 in the first direction X. The sealing resin 3 opposes the recessed part 25. By adopting this configuration, the terminals 2 dropping out from the sealing resin 3 can be prevented more effectively.

According to the mounting structure of the semiconductor device A60, when the semiconductor device A60 has been mounted on the wiring board 71, the first surface 31 of the sealing resin 3 opposes the wiring board 71, and the conductive joining layer 72 opposes the main surface conductive layer 281. By adopting this configuration, the same effects as the mounting structure of the semiconductor device A30 shown in FIG. 38 are obtained.

Variation of Sixth Embodiment

Figure 56:
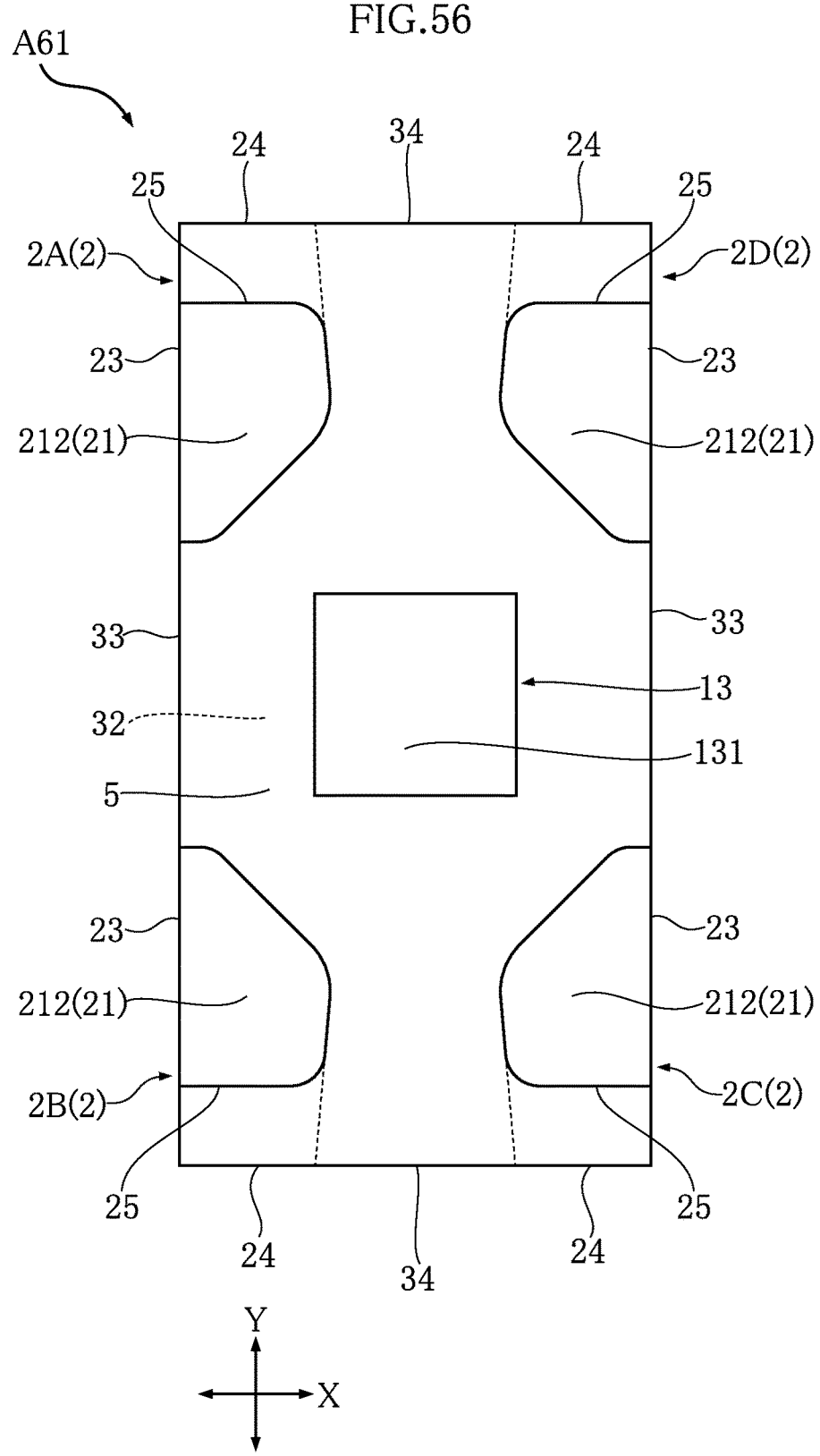
FIG. 56 is a bottom view of the semiconductor device according to a variation of the sixth embodiment of the present disclosure.

The semiconductor device A61 according to a variation of the sixth embodiment of the present disclosure will be described, based on FIG. 56 to FIG. 58. Here, FIG. 57 is a cross-sectional view of a semiconductor device A61, with the position of the cross section being the same as FIG. 54.

The semiconductor device A61 differs to the aforementioned semiconductor device A60 in not being provided with the insulation film 5. As shown in FIG. 56 and FIG. 57, on the first surface 31 of the sealing resin 3, the exposed surface 131 of the heat dissipation layer 13 and the plurality of terminals 2 are both exposed to the outside of the semiconductor device A61. Note that, in this variation, the terminals 2 are provided with a bottom surface conductive layer 282 along with a main surface conductive layer 281.

Figure 57:
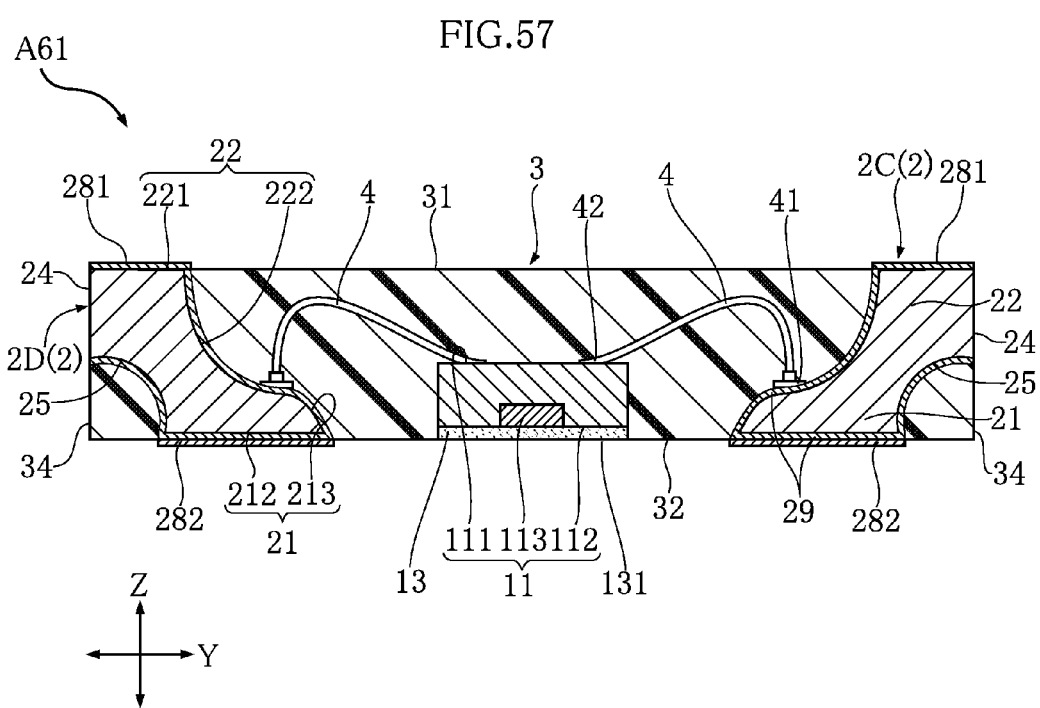
FIG. 57 is a cross-sectional view of the semiconductor device shown in FIG. 56.
Figure 58:
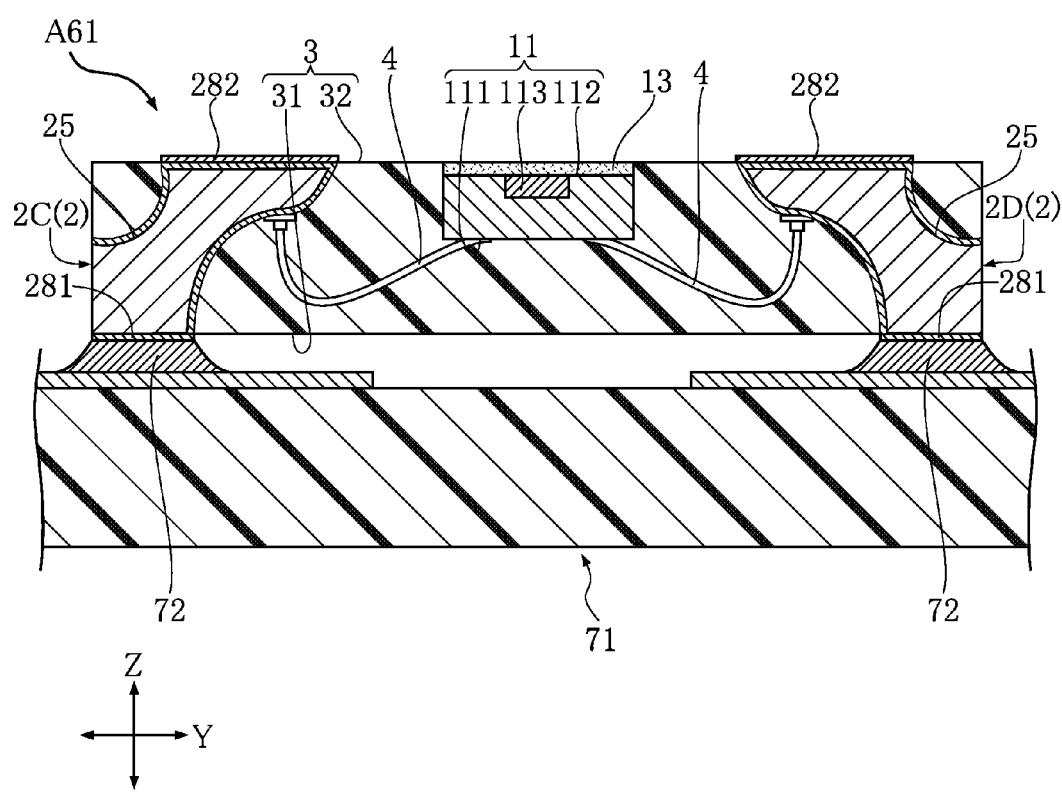
FIG. 58 is a cross-sectional view of the semiconductor device shown in FIG. 56 when mounted on a wiring board.

FIG. 58 shows the mounting structure of the semiconductor device A61 (the position of the cross section is the same as FIG. 57). The mounting structure of the semiconductor device A61 is the same as the semiconductor device A30 shown in FIG. 38.

With the semiconductor device A61, the configuration of the semiconductor element 11, the plurality of terminals 2 and the sealing resin 3 is the same as the semiconductor device A30. Accordingly, it also becomes possible to achieve an even lower profile with the semiconductor device A61. Also, since an insulation film 5 is not provided, the semiconductor device A61 is configured such that the exposed surface 131 of the heat dissipation layer 13 is exposed to the outside of the semiconductor device A61. The heat dissipation efficiency of the semiconductor device A61 can thus be improved over the semiconductor device A60.

Seventh Embodiment

Figure 59:
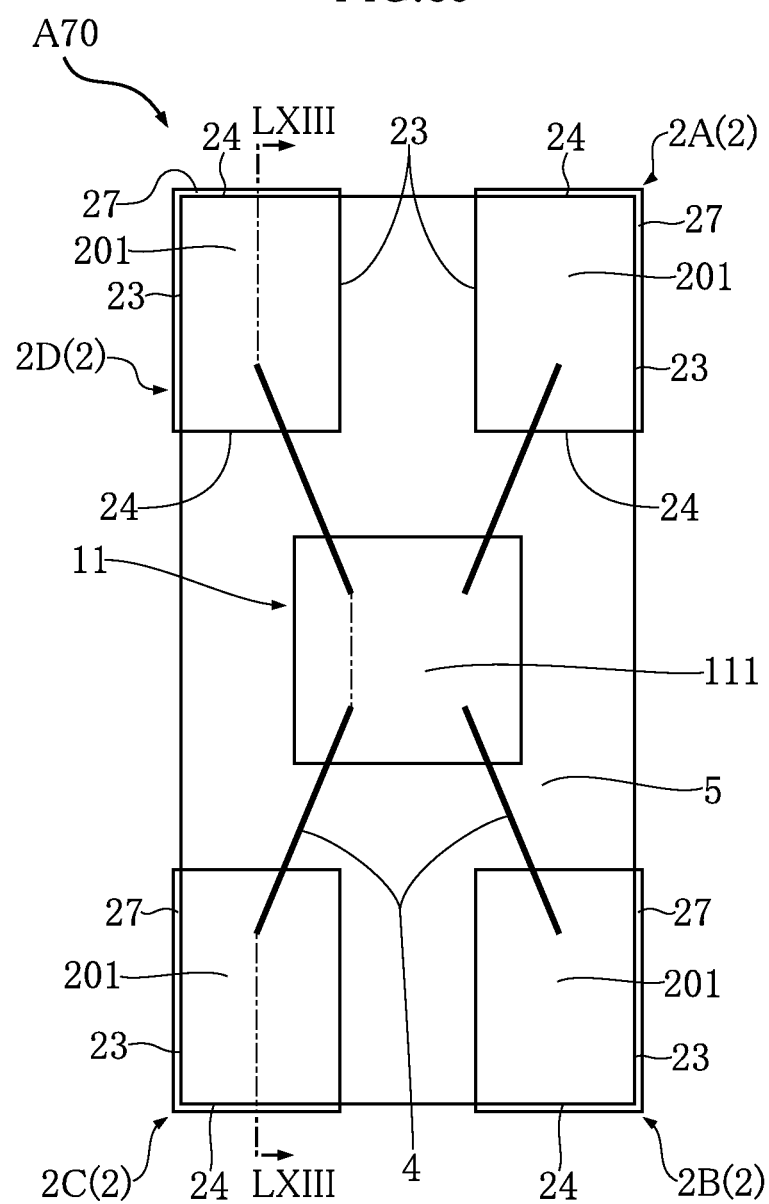
FIG. 59 is a plan view (sealing resin shown as see-through) of a semiconductor device according to a seventh embodiment of the present disclosure.
Figure 60:
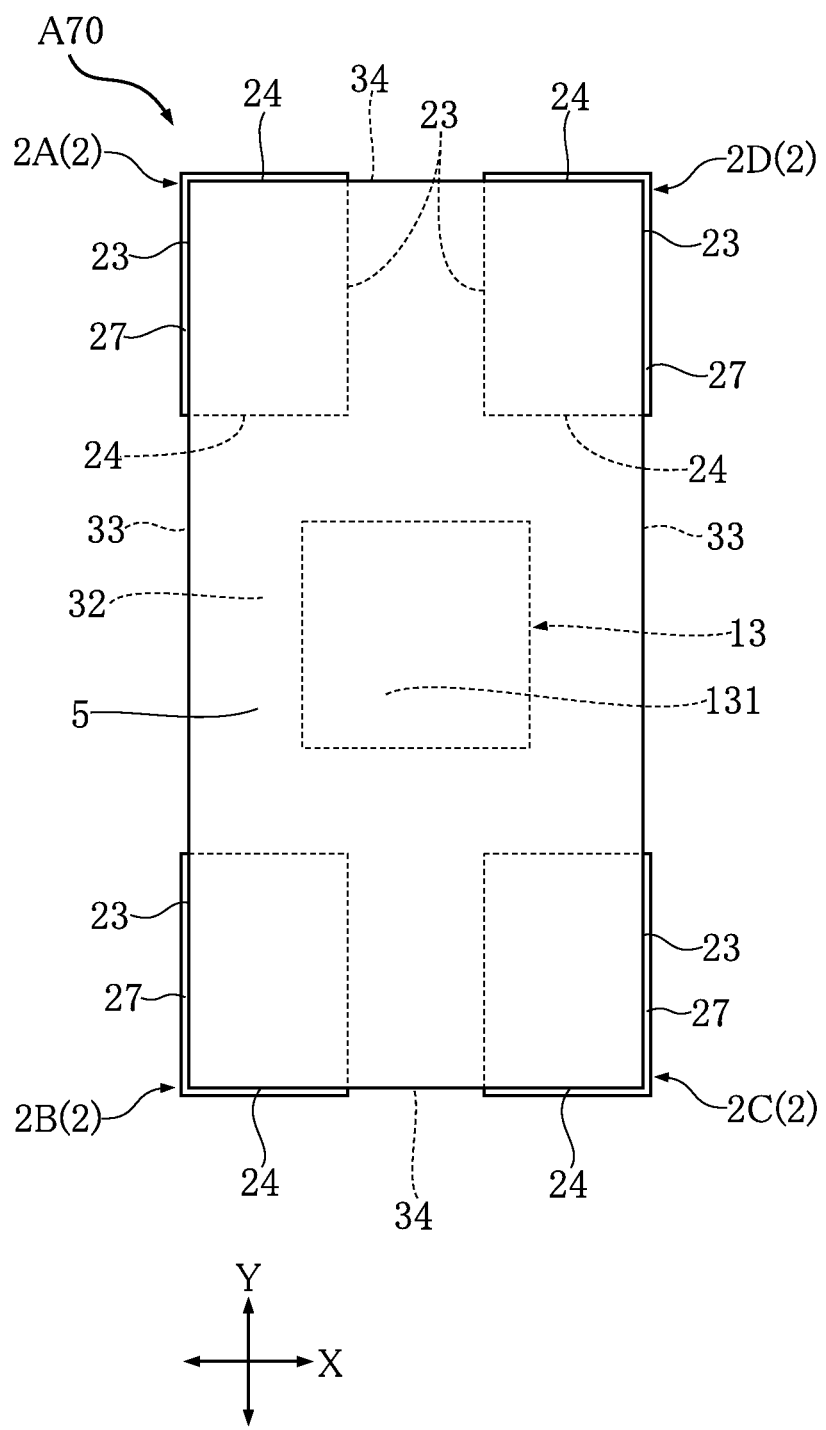
FIG. 60 is a bottom view of the semiconductor device shown in FIG. 59.
Figure 61:
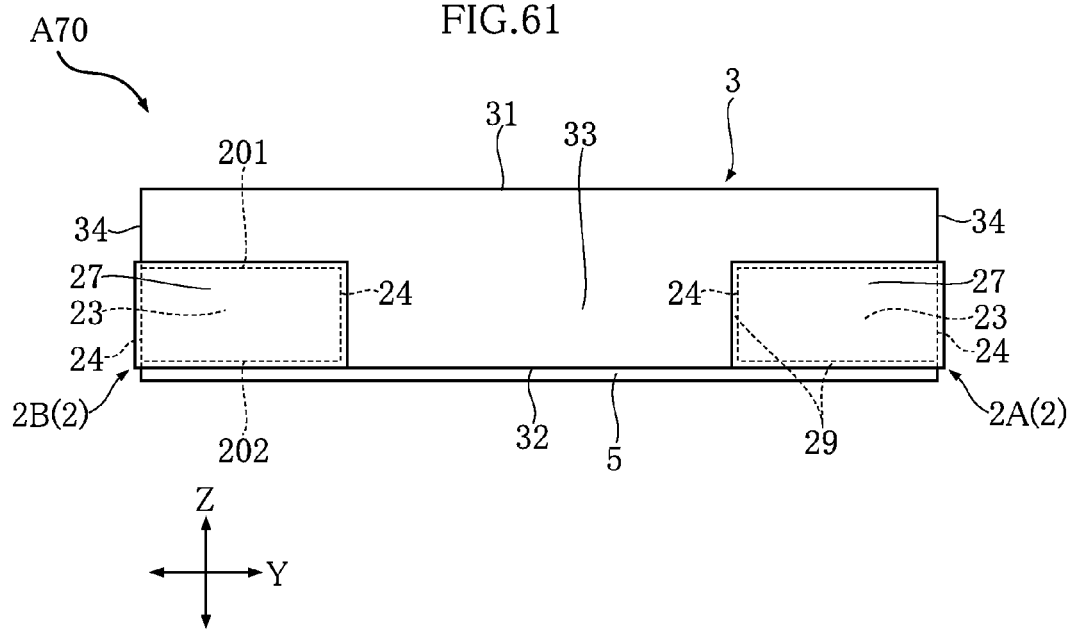
FIG. 61 is a right side view of the semiconductor device shown in FIG. 59.
Figure 62:
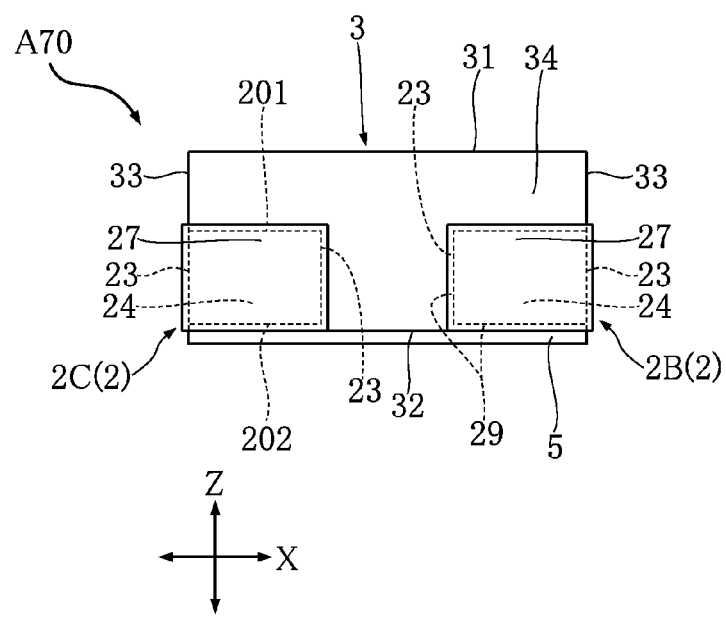
FIG. 62 is a front view of the semiconductor device shown in FIG. 59.
Figure 63:
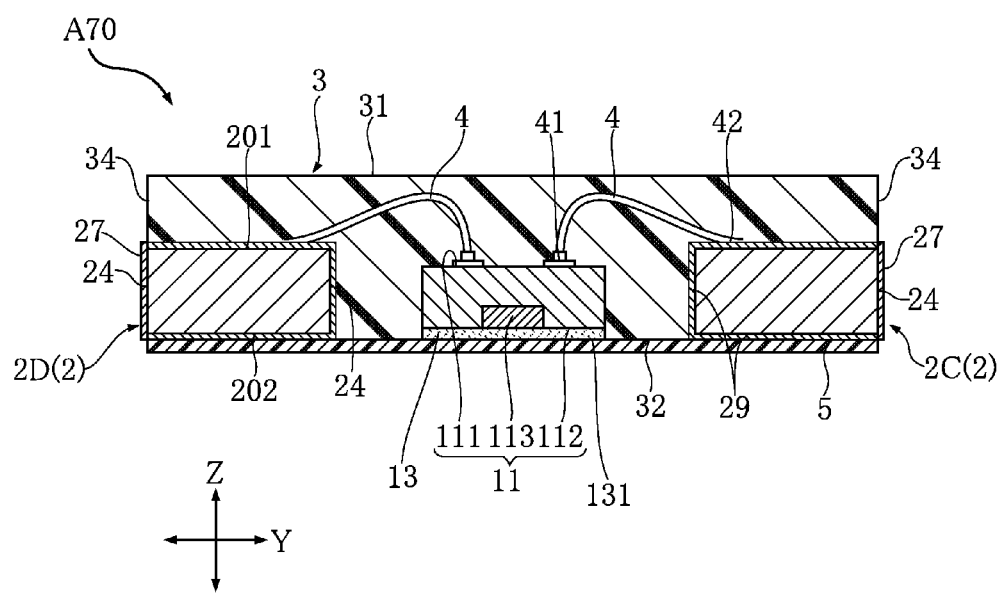
FIG. 63 is a cross-sectional view along a LXIII-LXIII line of FIG. 59.

A semiconductor device A70 according to a seventh embodiment of the present disclosure will be described, based on FIG. 59 to FIG. 64. Here, FIG. 59 is a plan view of the semiconductor device A70, with the sealing resin 3 being shown as see-through and the internal conductive layer 29 being omitted, for convenience of understanding. FIG. 63 is a cross-sectional view along a LXIII-LXIII line (one-dot chain line shown in FIG. 59) of FIG. 59. Also, in FIG. 59 to FIG. 63, the reference signs of similar constituent elements that are duplicated with regard to the terminals 2 are omitted.

The semiconductor device A70 differs to the aforementioned semiconductor device A30 in the configuration of the plurality of terminals 2. As shown in FIG. 59, the semiconductor device A70 is rectangular in plan view. The configuration of the semiconductor element 11 according to the present embodiment is the same as the configuration (composition) of the semiconductor element 11 of the semiconductor device A10. Also, in the present embodiment, the terminals 2 are disposed so that both the first side surface 23 and the second side surface 24 contact the corner of the semiconductor device A70 where the first direction X and the second direction Y intersect in plan view.

In the present embodiment, as shown in FIG. 59 to FIG. 63, the semiconductor element 11 and the plurality of terminals 2 that are disposed at a distance from the semiconductor element 11 are both mounted on the insulation film 5. The sealing resin 3 covers the semiconductor element 11 and the wire 4, and some of the terminals 2.

As shown in FIG. 59 to FIG. 63, the terminals 2 are provided with a main surface 201, a bottom surface 202, a pair of first side surfaces 23, a pair of second side surfaces 24. In the present embodiment, the terminals 2 are provided with an internal conductive layer 29 and an external conductive layer 27, and, unlike the semiconductor device A10, are not provided with a main surface conductive layer 281 and a bottom surface conductive layer 282. The terminals 2, excluding the internal conductive layer 29 and the external conductive layer 27, are rectangular parallelepiped. The terminals 2 are thus not provided with a base part 21 and a projecting part 22, unlike the semiconductor device A10.

As shown in FIG. 59 and FIG. 61 to FIG. 63, the main surface 201 is a surface that faces in the same direction as the front surface 111 of the semiconductor element 11. As shown in FIG. 60 to FIG. 63, the bottom surface 202 is a surface that faces in the opposite direction to the main surface 201. The main surface 201 and the bottom surface 202 are both covered by the internal conductive layer 29. A wire 4 is electrically connects the front surface 111 and the main surface 201 to each other.

As shown in FIG. 59 to FIG. 62, the pair of first side surfaces 23 are disposed at a distance from each other in the first direction X. The pair of first side surfaces 23 intersect both ends of each second side surface 24 that are in the first direction X. Out of the pair of first side surfaces 23, one of the first side surfaces 23 is flush with the third surface 33, and is covered by the external conductive layer 27. Also, the other of the first side surfaces 23 is covered by the internal conductive layer 29.

As shown in FIG. 59 to FIG. 63, the pair of second side surfaces 24 are disposed at a distance from each other in the second direction Y. The pair of second side surfaces 24 intersect both ends of each first side surface 23 in the second direction Y. Out of the pair of second side surfaces 24, one of the second side surfaces 24 is flush with the fourth surface 34, and is covered by the external conductive layer 27. Also, the other of the second side surfaces 24 is covered by the internal conductive layer 29.

The present embodiment has a configuration in which a heat dissipation layer 13 is provided. A configuration in which an insulation layer 12 is provided, like the semiconductor device A10, instead of the heat dissipation layer 13 may also be adopted. Also, a configuration may be adopted in which the heat dissipation layer 13 and the insulation layer 12 are not provided, and the back surface 112 of the semiconductor element 11 contacts the insulation film 5.

Figure 64:
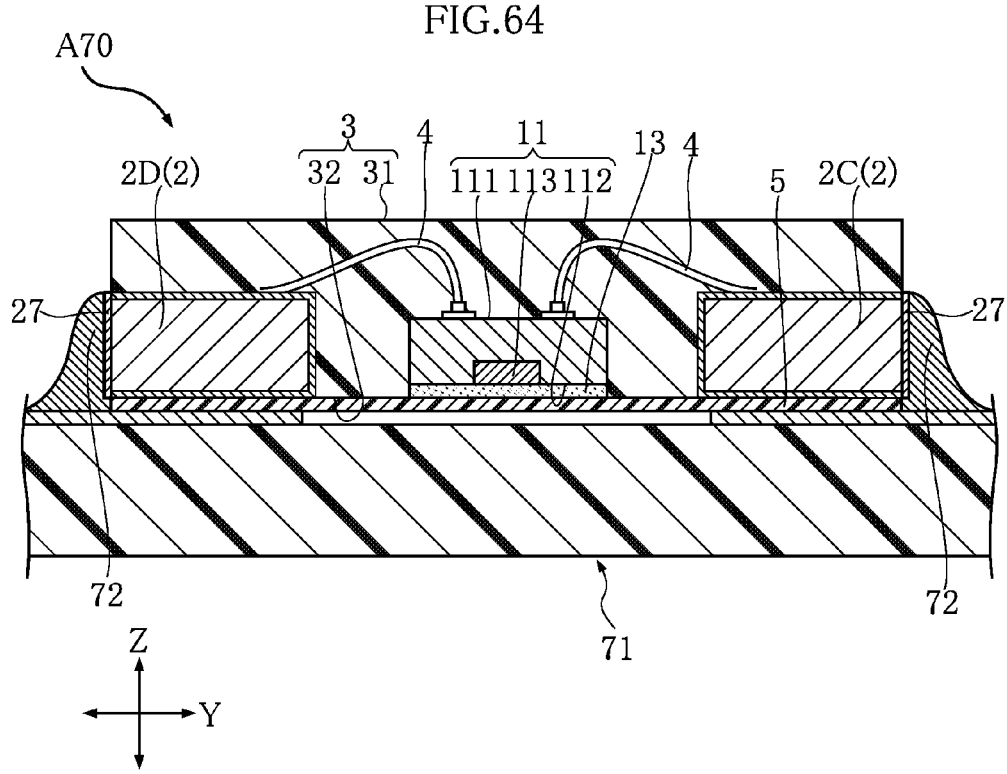
FIG. 64 is a cross-sectional view of the semiconductor device shown in FIG. 59 when mounted on a wiring board.

FIG. 64 shows the mounting structure of the semiconductor device A70 (the position of the cross section is the same as FIG. 63). When the semiconductor device A70 has been mounted on the wiring board 71 using a reflow method, the insulation film 5 opposes the wiring board 71, and the conductive joining layer 72 contacts the external conductive layer 27. In the present embodiment, the insulation film 5 contacts the wiring board 71.

The semiconductor device A70 includes an insulation film 5, a semiconductor element 11 mounted on the insulation film 5, a plurality of terminals 2 that are mounted on the insulation film 5 and are disposed at a distance from the semiconductor element 11, and a sealing resin 3 that covers the semiconductor element 11. The sealing resin 3 has a third surface 33 and a fourth surface 34. In this case, the terminals 2 are exposed from one of the third surface 33 and the fourth surface 34. This configuration is realized by removing part of the sealing resin 3 located on the opposite side to the insulation film 5 in the thickness direction Z, and reducing the thickness of the sealing resin 3 as much as possible, at the time of manufacturing the semiconductor device A70 (see FIG. 16). Accordingly, by adopting this configuration, it becomes possible to achieve a lower profile in the semiconductor device A70.

The terminals 2 of the semiconductor device A70 are provided with an external conductive layer 27 that covers the first side surface 23 that is flush with the third surface 33 of the sealing resin 3, and the second side surface 24 that is flush with the fourth surface 34 of the sealing resin 3. By adopting this configuration, the mounting structure of the semiconductor device A70 shown in FIG. 64 can be adopted as a result of the conductive joining layer 72 contacting the external conductive layer 27.

According to the mounting structure of the semiconductor device A70, when the semiconductor device A70 has been mounted on the wiring board 71, the insulation film 5 opposes the wiring board 71, and the conductive joining layer 72 contacts the external conductive layer 27. By adopting this configuration, the conductive joining layer 72 is not interposed between the wiring board 71 and the semiconductor device A70, enabling the mounting height of the semiconductor device A70 to be further lowered. Additionally, the contact surface area of the conductive joining layer 72 with the terminals 2 will be larger than for the mounting structure of the semiconductor device A10, thus further improving the mounting strength of the semiconductor device A70 to the wiring board 71. Also, by providing the insulation film 5, short-circuits caused by the conductive joining layer 72 contacting a plurality of terminals 2 when the semiconductor device A70 has been mounted on the wiring board 71 can be prevented from occurring.

Eighth Embodiment

Figure 65:
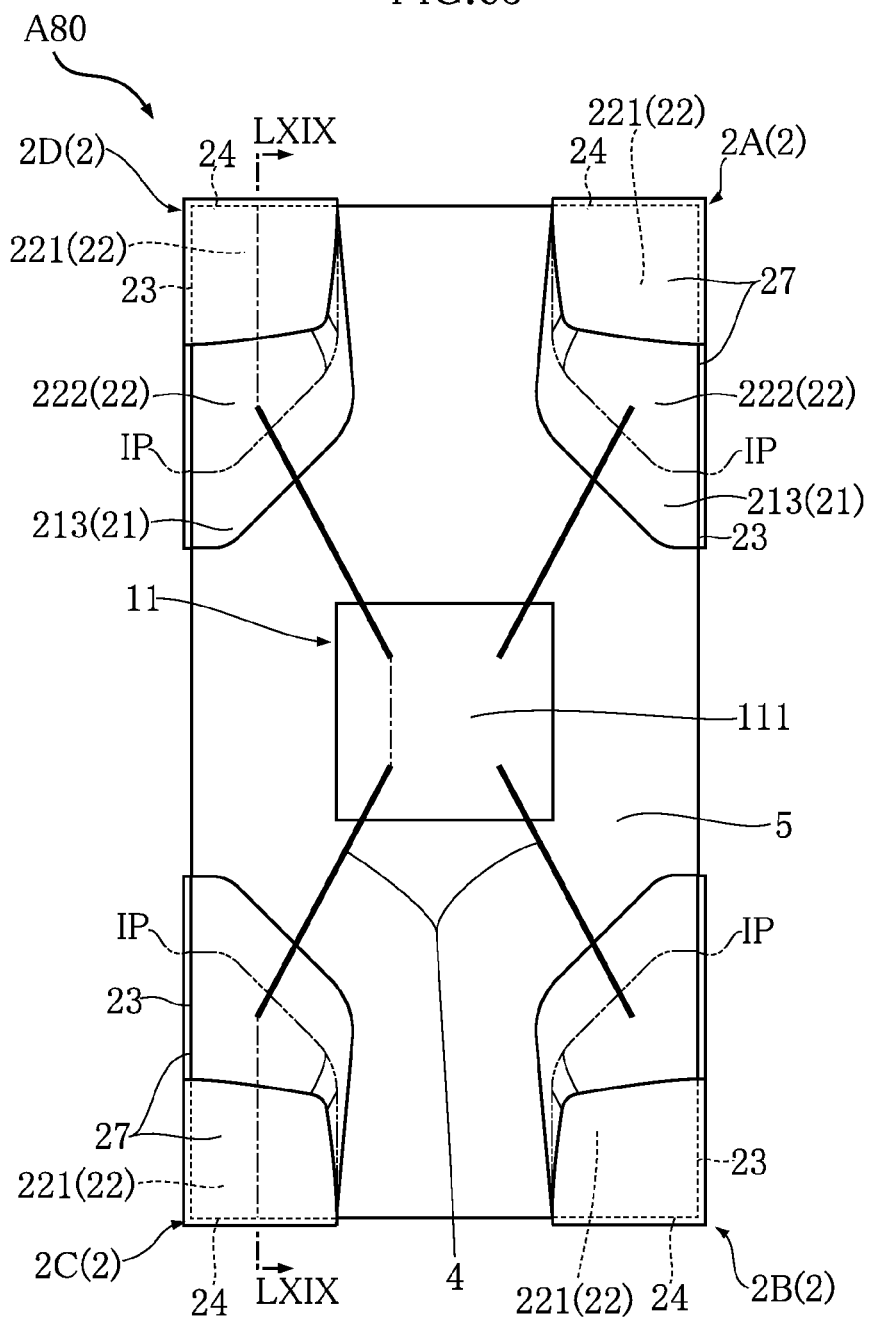
FIG. 65 is a plan view (sealing resin shown as see-through) of a semiconductor device according to an eighth embodiment of the present disclosure.
Figure 66:
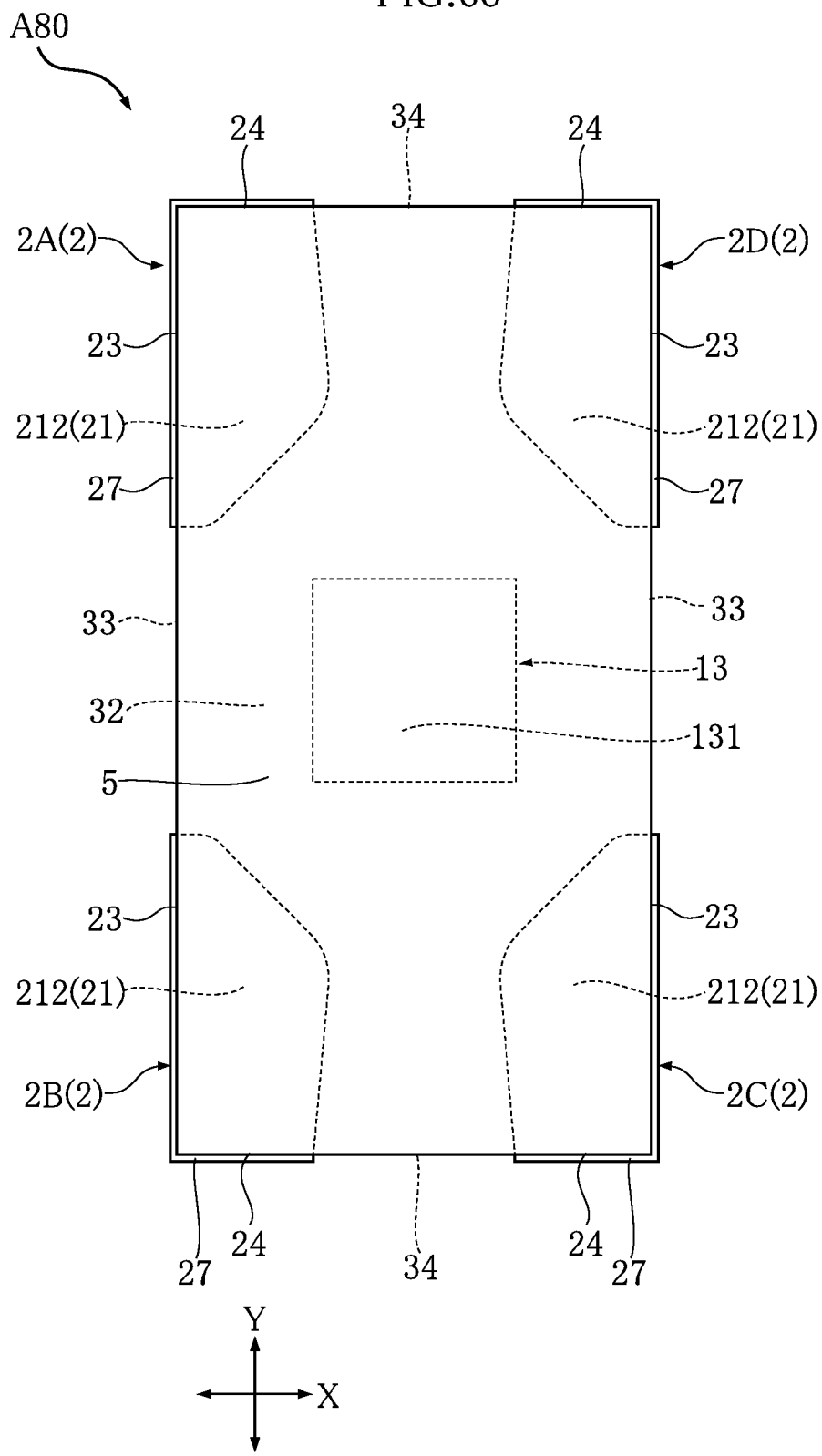
FIG. 66 is a bottom view of the semiconductor device shown in FIG. 65.
Figure 67:
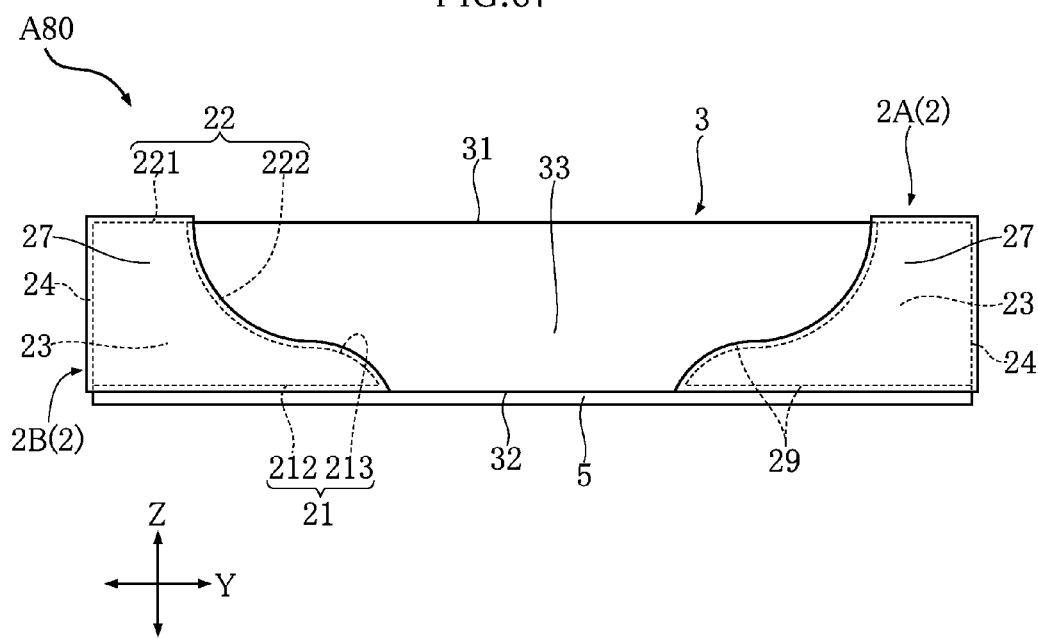
FIG. 67 is a right side view of the semiconductor device shown in FIG. 65.
Figure 68:
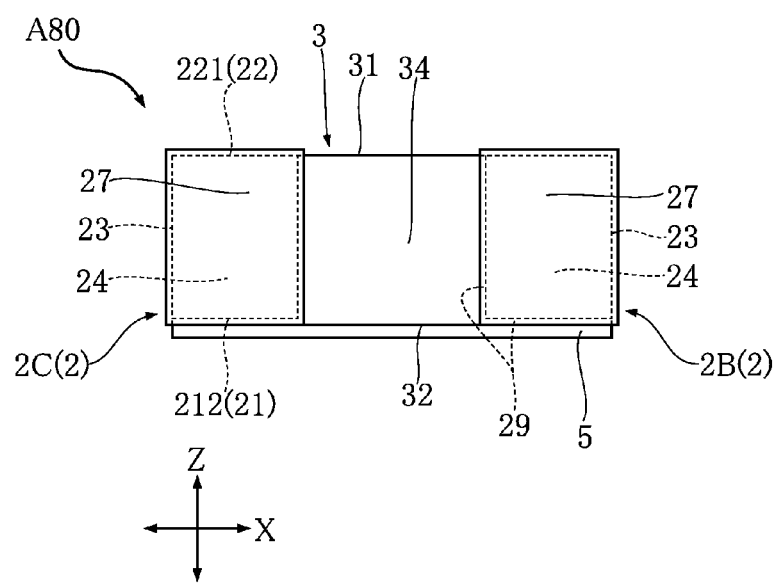
FIG. 68 is a front view of the semiconductor device shown in FIG. 65.
Figure 69:
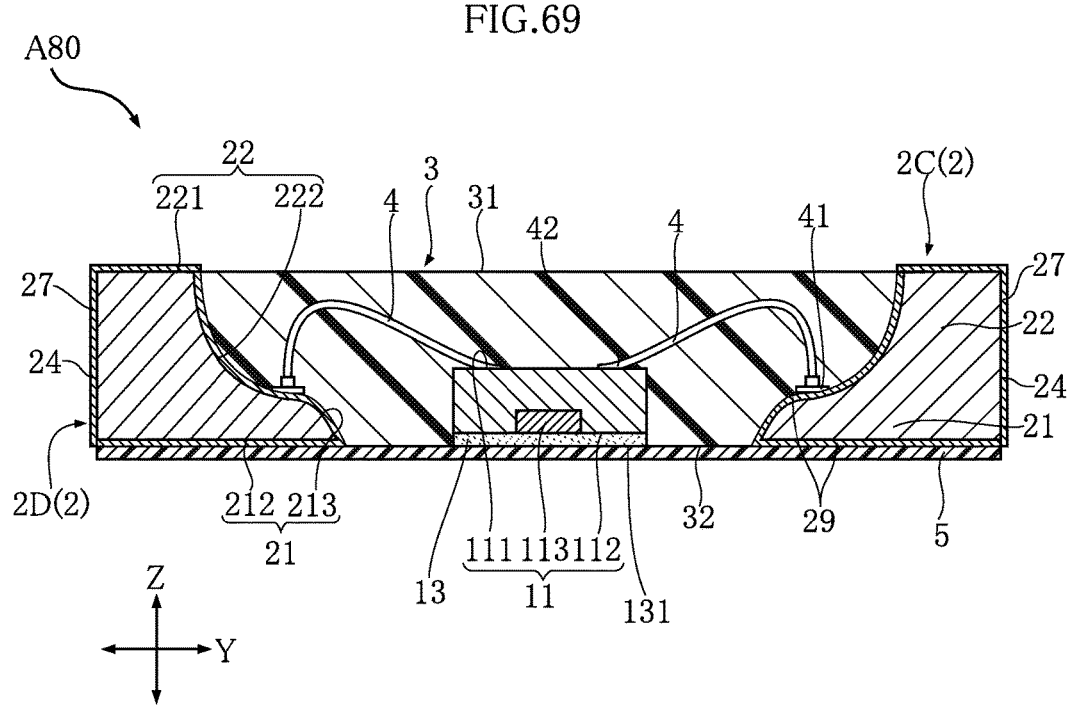
FIG. 69 is a cross-sectional view along a LXIX-LXIX line of FIG. 65.

A semiconductor device A80 according to an eighth embodiment of the present disclosure will be described, based on FIG. 65 to FIG. 71. Here, FIG. 65 is a plan view of the semiconductor device A80, with the sealing resin 3 being shown as see-through and the internal conductive layer 29 being omitted, for convenience of understanding. FIG. 69 is a cross-sectional view along a LXIX-LXIX line (one-dot chain line shown in FIG. 69) of FIG. 65. Also, in FIG. 65 to FIG. 69, the reference signs of similar constituent elements that are duplicated with regard to the terminals 2 are omitted.

The semiconductor device A80 differs to the aforementioned semiconductor device A70 in the configuration of the plurality of terminals 2. As shown in FIG. 65, the semiconductor device A80 is rectangular in plan view. In the present embodiment, the terminals 2 are also disposed, like the semiconductor device A70, so that both the first side surface 23 and the second side surface 24 contact the corner of the semiconductor device A80 where the first direction X and the second direction Y intersect in plan view.

As shown in FIG. 65 to FIG. 69, in the present embodiment, the configuration of the terminals 2 excluding the external conductive layer 27 is the same as the configuration (composition) of the terminals 2 of the semiconductor device A30 excluding the main surface conductive layer 281. The external conductive layer 27 covers the first side surface 23, the second side surface 24, and the main surface 221 of the projecting part 22. Note that the configuration (composition) of the internal conductive layer 29 is the same as the semiconductor device A30.

The present embodiment has a configuration in which a heat dissipation layer 13 is provided. A configuration may be adopted in which an insulation layer 12 is provided, like the semiconductor device A10, instead of the heat dissipation layer 13. Also, a configuration may be adopted in which the heat dissipation layer 13 and the insulation layer 12 are not provided, and the back surface 112 of the semiconductor element 11 contacts the insulation film 5.

Figure 70:
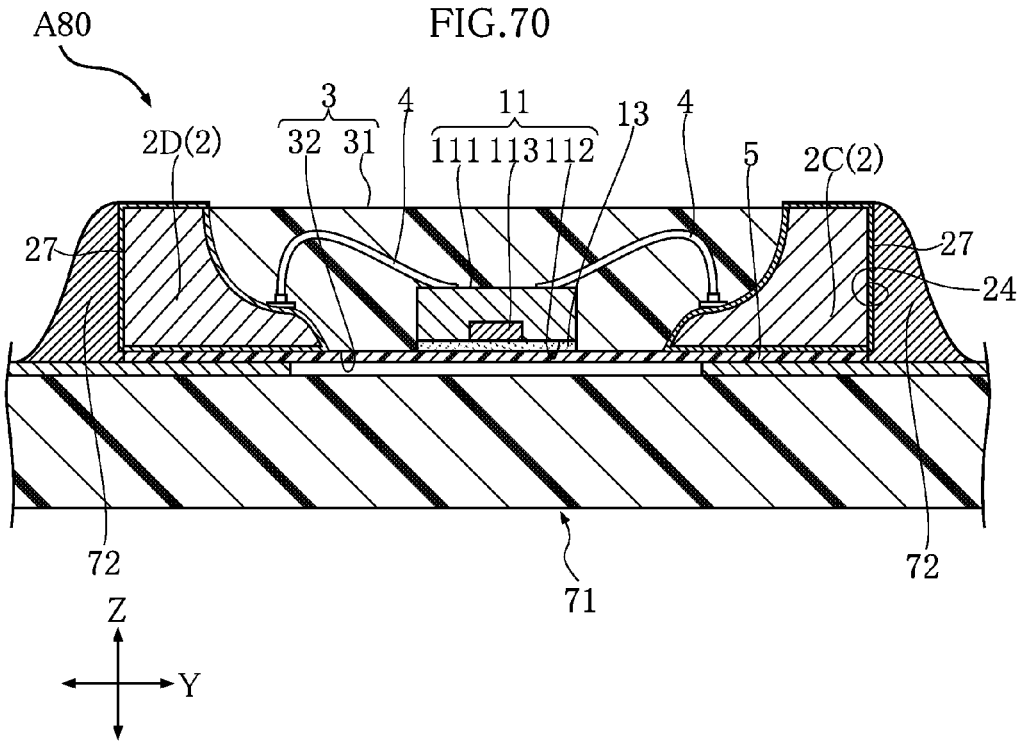
FIG. 70 is a cross-sectional view of the semiconductor device shown in FIG. 65 when mounted on a wiring board.

FIG. 70 shows a first mode of the mounting structure of the semiconductor device A80 (the position of the cross section is the same as FIG. 69). When the semiconductor device A80 has been mounted on the wiring board 71 using a reflow method, the insulation film 5 opposes the wiring board 71, and the conductive joining layer 72 contacts the external conductive layer 27. In the present embodiment, the insulation film 5 contacts the wiring board 71.

Figure 71:
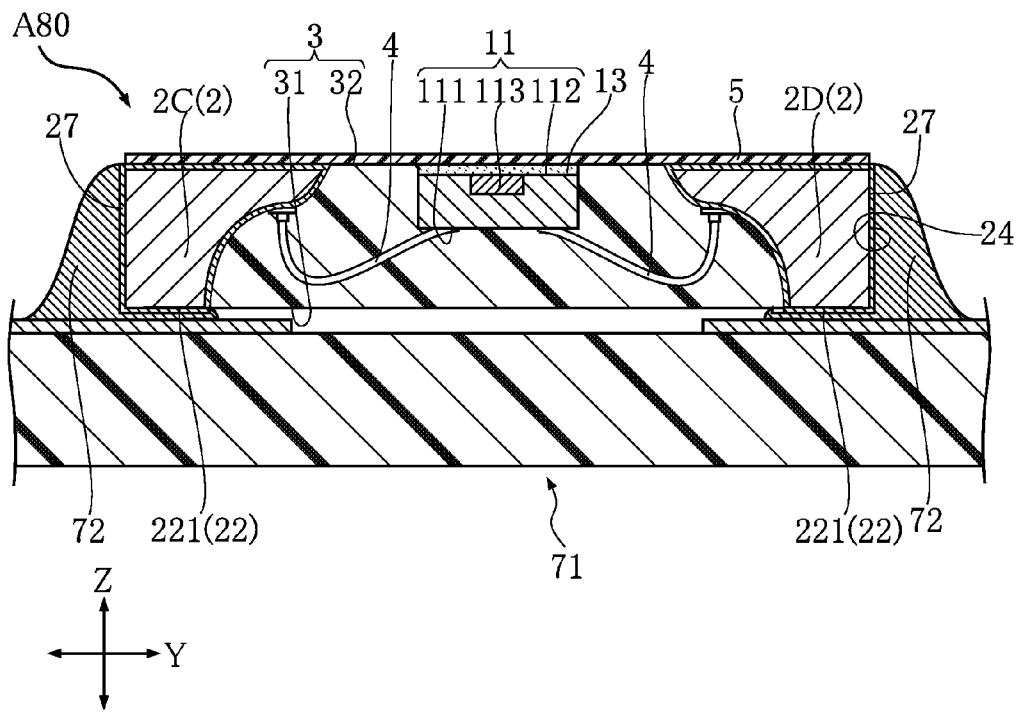
FIG. 71 is a cross-sectional view of the semiconductor device shown in FIG. 65 when mounted on a wiring board.

FIG. 71 shows a second mode of the mounting structure of the semiconductor device A80 (the position of the cross section is the same as FIG. 69). When the semiconductor device A80 has been mounted on the wiring board 71 using a reflow method, the first surface 31 of the sealing resin 3 opposes the wiring board 71, and the conductive joining layer 72 contacts the external conductive layer 27. In the present embodiment, part of the conductive joining layer 72 tucks around directly under the external conductive layer 27 covering the main surface 221 of the projecting part 22, and, furthermore, the conductive joining layer 72 reaches to the external conductive layer 27 that is located on the opposite side of both the first side surface 23 and the second side surface 24, with respect to the main surface 221.

The semiconductor device A80, like the aforementioned semiconductor device A70, includes an insulation film 5, a semiconductor element 11 mounted on the insulation film 5, a plurality of terminals 2 that are mounted on the insulation film 5 and are disposed at a distance from the semiconductor element 11, and a sealing resin 3 that covers the semiconductor element 11. The sealing resin 3 has a third surface 33 and a fourth surface 34. In this case, the terminals 2 are exposed from one of the third surface 33 and the fourth surface 34. Accordingly, it also becomes possible to achieve an even lower profile with the semiconductor device A80.

The terminals 2 of the semiconductor device A80 are provided with an external conductive layer 27 that covers the first side surface 23, the second side surface 24, and the main surface 221 of the projecting part 22. By adopting this configuration, the mounting structure of the semiconductor device A70 shown in FIG. 70 and FIG. 71 can be adopted as a result of the conductive joining layer 72 contacting the external conductive layer 27.

According to a first mode of the mounting structure of the semiconductor device A80 shown in FIG. 70, when the semiconductor device A80 has been mounted on the wiring board 71, the insulation film 5 opposes the wiring board 71, and the conductive joining layer 72 contacts the external conductive layer 27. By adopting this configuration, the contact surface area of the conductive joining layer 72 with the external conductive layer 27 will be larger than for the semiconductor device A70 shown in FIG. 64. Accordingly, the mounting strength of the semiconductor device A80 to the wiring board 71 can be improved over the mounting structure of the semiconductor device A70.

According to the second mode of the mounting structure of the semiconductor device A80 shown in FIG. 71, when the semiconductor device A80 has been mounted on the wiring board 71, the first surface 31 of the sealing resin 3 opposes the wiring board 71, and the conductive joining layer 72 contacts the external conductive layer 27. In this case, with regard to the contact surface area of the conductive joining layer 72 with the external conductive layer 27, the contact surface area with the external conductive layer 27 covering both the first side surface 23 and the second side surface 24 is larger than the contact surface area with the external conductive layer 27 covering the main surface 221 of the projecting part 22 (terminals 2). The mounting strength of the semiconductor device A80 to the wiring board 71 can thus be made comparable with the first mode of the mounting structure of the semiconductor device A80 shown in FIG. 70, while suppressing the amount of the conductive joining layer 72 that tucks around directly under the external conductive layer 27 covering the main surface 221.

Ninth Embodiment

Figure 72:
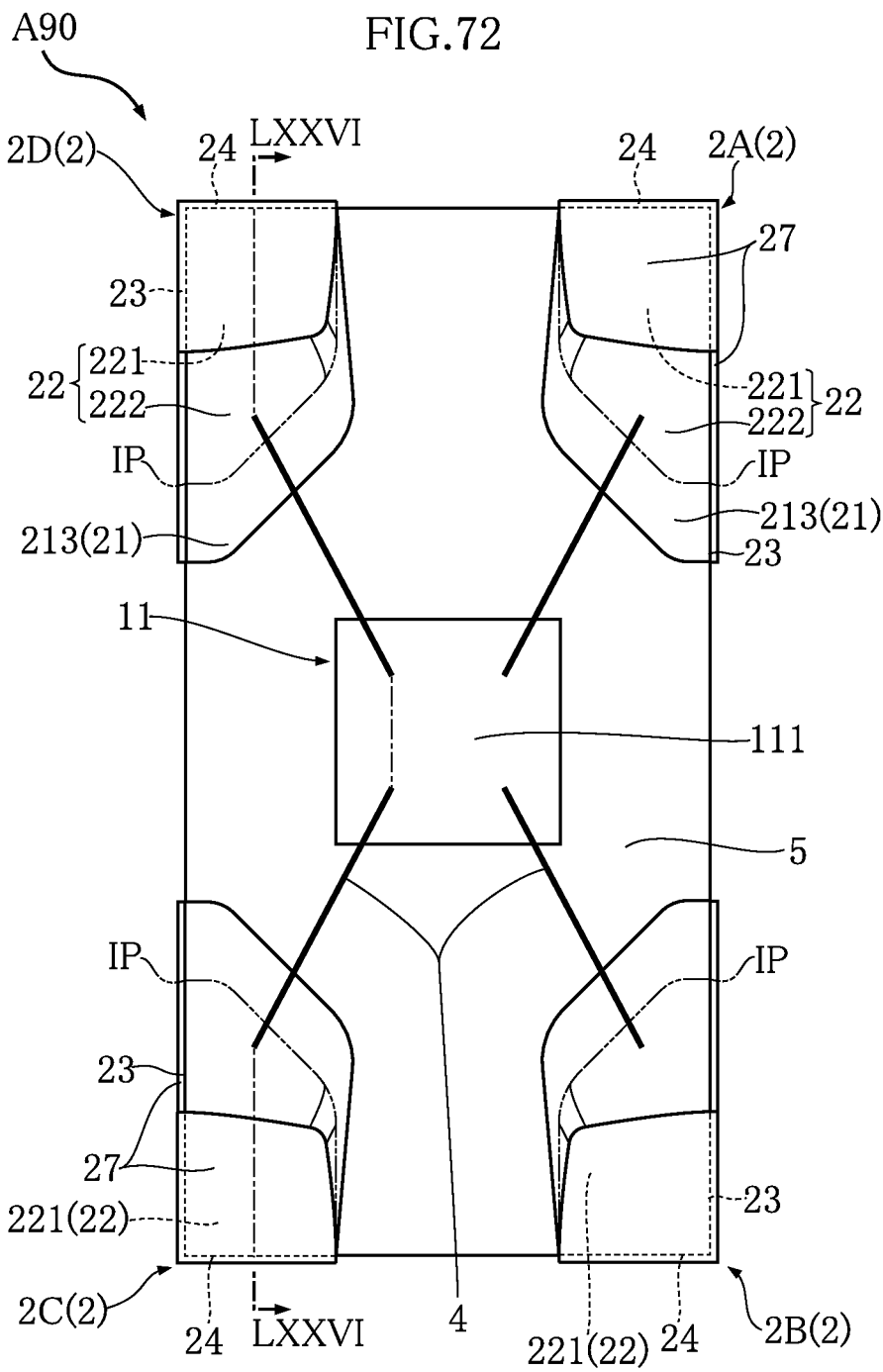
FIG. 72 is a plan view (sealing resin shown as see-through) of a semiconductor device according to a ninth embodiment of the present disclosure.
Figure 73:
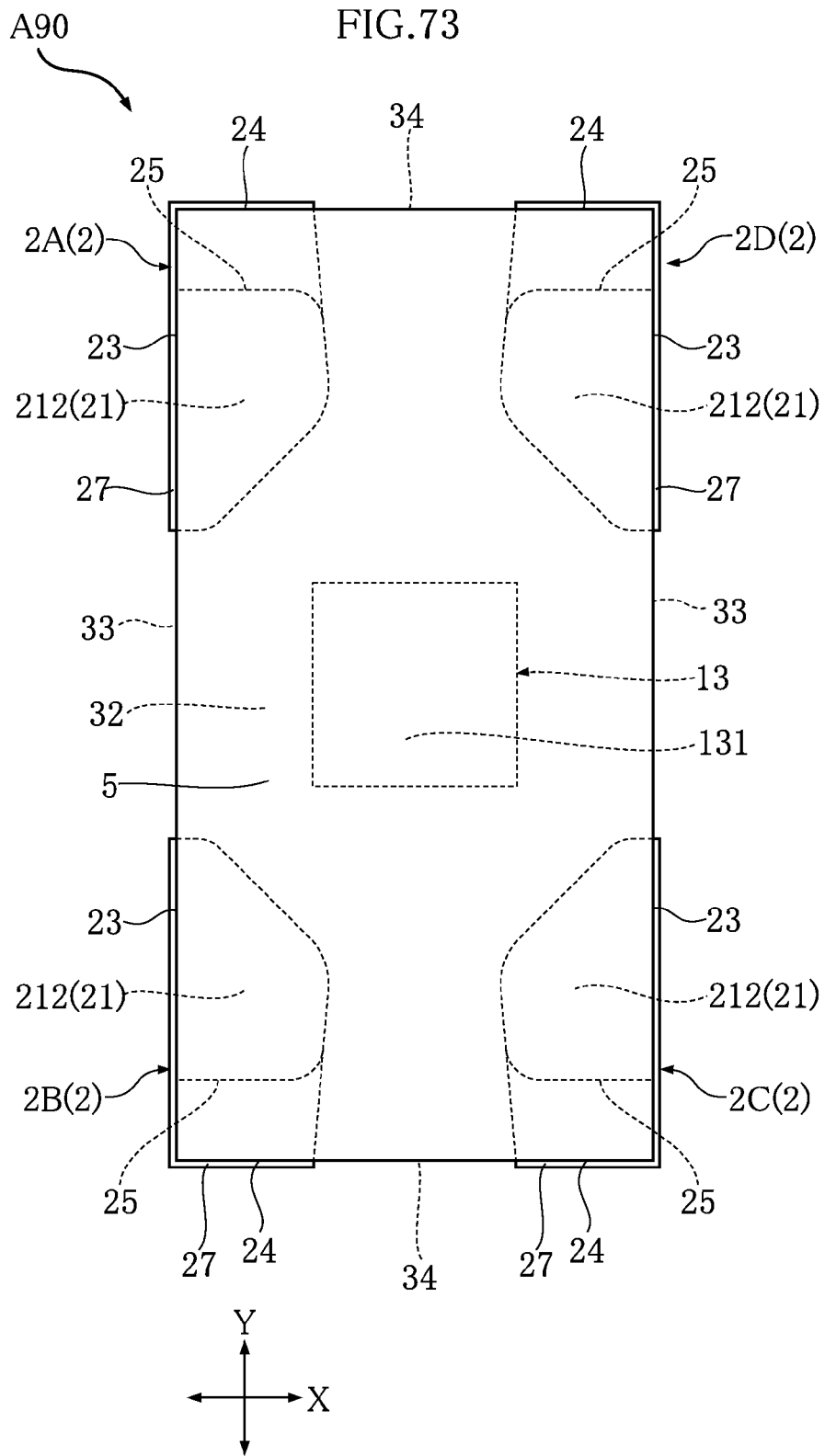
FIG. 73 is a bottom view of the semiconductor device shown in FIG. 72.
Figure 74:
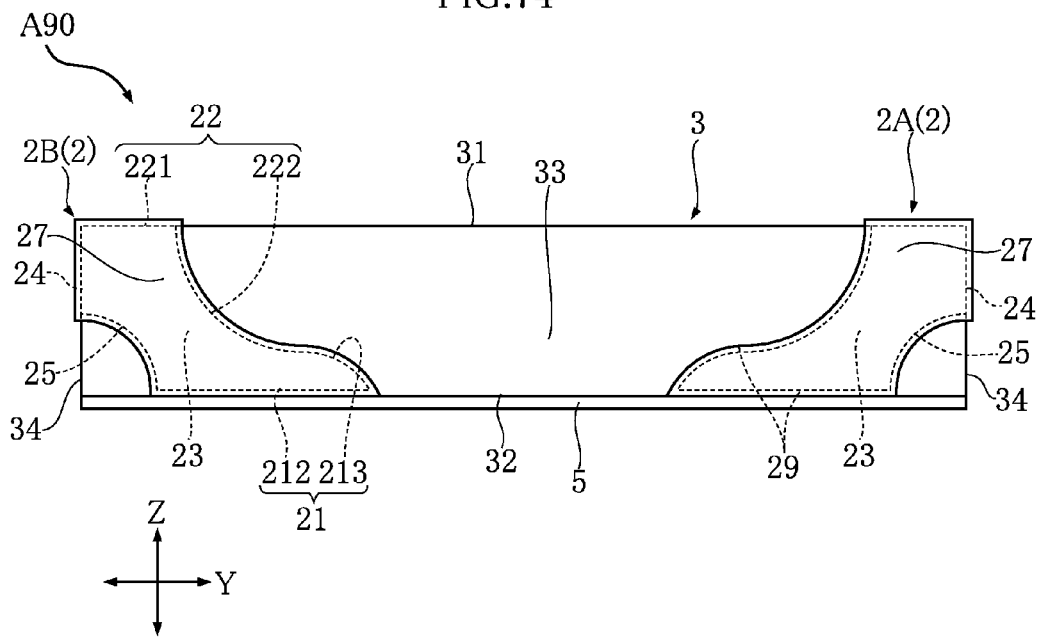
FIG. 74 is a right side view of the semiconductor device shown in FIG. 72.
Figure 75:
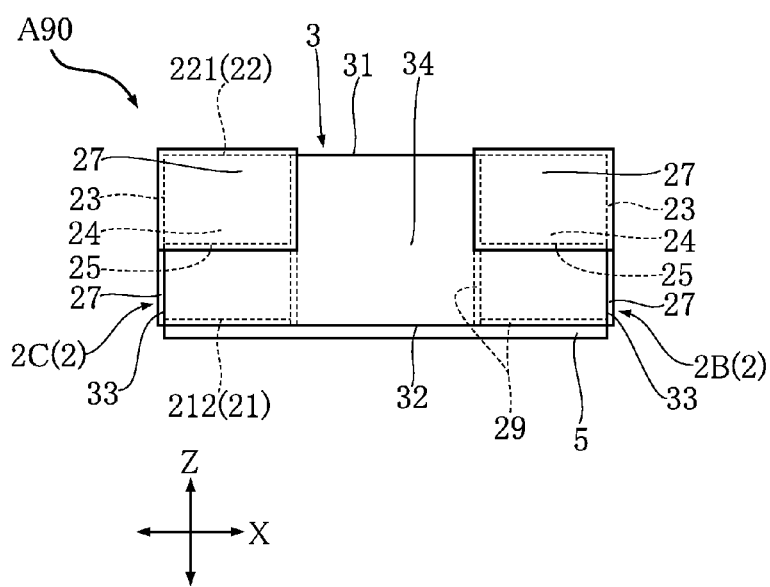
FIG. 75 is a front view of the semiconductor device shown in FIG. 72.
Figure 76:
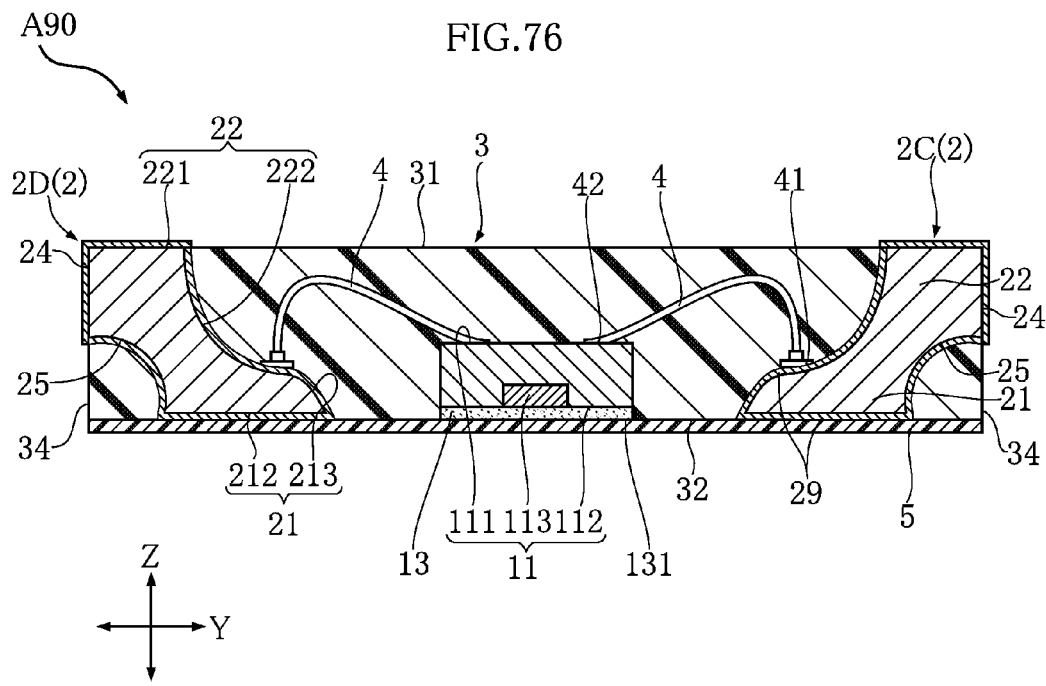
FIG. 76 is a cross-sectional view along a LXXVI-LXXVI line of FIG. 72.

A semiconductor device A90 according to a ninth embodiment of the present disclosure will be described, based on FIG. 72 to FIG. 77. Here, FIG. 72 is a plan view of the semiconductor device A90, with the sealing resin 3 being shown as see-through and the internal conductive layer 29 being omitted, for convenience of understanding. FIG. 76 is a cross-sectional view along a LXXVI-LXXVI line (one-dot chain line shown in FIG. 72) of FIG. 72. Also, in FIG. 72 to FIG. 76, the reference signs of similar constituent elements that are duplicated with regard to the terminals 2 are omitted.

The semiconductor device A90 differs to the aforementioned semiconductor device A70 in the configuration of the plurality of terminals 2. As shown in FIG. 72, the semiconductor device A90 is rectangular in plan view. In the present embodiment, the terminals 2 are also disposed, like the semiconductor device A70, so that both the first side surface 23 and the second side surface 24 contact the corner of the semiconductor device A90 where the first direction X and the second direction Y intersect in plan view.

As shown in FIG. 72 to FIG. 76, in the present embodiment, the configuration of the terminals 2 excluding the external conductive layer 27 is the same as the configuration (composition) of the terminals 2 of the semiconductor device A60 excluding the main surface conductive layer 281. The external conductive layer 27 covers the first side surface 23, the second side surface 24, and the main surface 221 of the projecting part 22. Note that the configuration of the internal conductive layer 29 is the same as the semiconductor device A60.

The present embodiment has a configuration in which a heat dissipation layer 13 is provided. A configuration may be adopted in which an insulation layer 12 is provided, like the semiconductor device A10, instead of the heat dissipation layer 13. Also, a configuration may be adopted in which the heat dissipation layer 13 and the insulation layer 12 are not provided, and the back surface 112 of the semiconductor element 11 contacts the insulation film 5.

Figure 77:
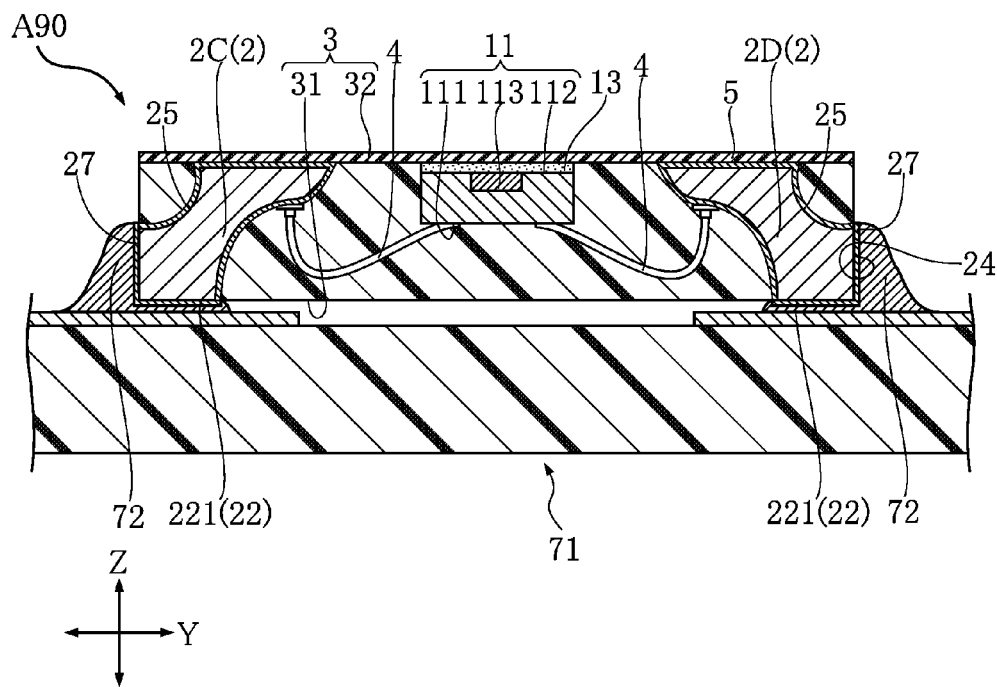
FIG. 77 is a cross-sectional view of the semiconductor device shown in FIG. 72 when mounted on a wiring board.

FIG. 77 shows the mounting structure of the semiconductor device A90 (the position of the cross section is the same as FIG. 76). When the semiconductor device A90 has been mounted on the wiring board 71 using a reflow method, the first surface 31 of the sealing resin 3 opposes the wiring board 71, and the conductive joining layer 72 contacts the external conductive layer 27. In the present embodiment, part of the conductive joining layer 72 tucks around directly under the external conductive layer 27 covering the main surface 221 of the projecting part 22, and, furthermore, the conductive joining layer 72 reaches to the external conductive layer 27 that is located on the opposite side of both the first side surfaces 23 and the second side surfaces 24, with respect to the main surface 221.

The semiconductor device A90, like the aforementioned semiconductor device A70, includes an insulation film 5, a semiconductor element 11 mounted on the insulation film 5, a plurality of terminals 2 that are mounted on the insulation film 5 and are disposed at a distance from the semiconductor element 11, and a sealing resin 3 that covers the semiconductor element 11. The sealing resin 3 has a third surface 33 and a fourth surface 34. In this case, the terminals 2 are exposed from one of the third surface 33 and the fourth surface 34. Accordingly, it also becomes possible to achieve an even lower profile with the semiconductor device A90.

The terminals 2 of the semiconductor device A90 are provided with an external conductive layer 27 that covers the first side surface 23, the second side surface 24, and the main surface 221 of the projecting part 22. By adopting this configuration, the mounting structure of the semiconductor device A90 shown in FIG. 77 can be adopted as a result of the conductive joining layer 72 contacting the external conductive layer 27.

According to the mounting structure of the semiconductor device A90, when the semiconductor device A90 has been mounted on the wiring board 71, the first surface 31 of the sealing resin 3 opposes the wiring board 71, and the conductive joining layer 72 contacts the external conductive layer 27. By adopting this configuration, the mounting strength of the semiconductor device A90 to the wiring board 71 can be made comparable with the mounting structure of the semiconductor device A70 shown in FIG. 64, while suppressing the amount of the conductive joining layer 72 that tucks around directly under the external conductive layer 27 covering the main surface 221.

The present disclosure is not limited to the aforementioned embodiments. Various design modifications can be made to the specific compositions of the respective parts of the present disclosure. Technical configurations of the semiconductor devices and the like provided in the present disclosure are described below.

Supplementary Note 1A
A semiconductor device including:
a semiconductor element that has a front surface and aback surface, the front surface and the back surface facing in opposite directions to each other in the thickness direction of the semiconductor element;
a plurality of terminals that are each provided with a base part and a projecting part, the base part being at a distance from the semiconductor element and electrically connected to the front surface of the semiconductor element, the projecting part projecting from the base part in the direction in which the front surface faces and having a main surface, and one of the plurality of terminals being provided with a main surface conductive layer covering the main surface of the projecting part; and
a sealing resin that has a first surface facing in the same direction as the direction in which the front surface faces, and covers the semiconductor element, the first surface of the sealing resin being flush with the main surface of the projecting part.

Supplementary Note 2A
The semiconductor device according to supplementary note 1A, in which the base part has a terminal surface and a bottom surface, the terminal surface faces in the same direction as the direction in which the front surface of the semiconductor element faces, and the bottom surface faces in the opposite direction to the direction in which the terminal surface faces, and
the project ing part projects from the terminal surface.

Supplementary Note 3A
The semiconductor device according to supplementary note 2A, in which the sealing resin has a second surface that faces in the opposite direction to the direction in which the first surface faces, and
the second surface is flush with the bottom surface.

Supplementary Note 4A
The semiconductor device according to supplementary note 3A, further including a bottom surface conductive layer that is formed on one of the plurality of terminals and covers the bottom surface of the base part.

Supplementary Note 5A
The semiconductor device according to supplementary note 4A, in which the composition of the bottom surface conductive layer is the same as the composition of the main surface conductive layer.

Supplementary Note 6A
The semiconductor device according to any of supplementary notes 3A to 5A, provided with an insulation layer that contacts the back surface of the semiconductor element, and is an electrical insulator, and
the insulation layer is exposed from the second surface of the sealing resin.

Supplementary Note 7A
The semiconductor device according to any of supplementary notes 2A to 6A, in which one of the plurality of terminals has a first side surface and a second side surface, the first side surface facing in a first direction which is at a right angle to the thickness direction of the semiconductor element, and the second side surface facing in a second direction which is at a right angle to both the thickness direction of the semiconductor element and the first direction,
the sealing resin has a third surface that faces in the first direction and a fourth surface that faces in the second direction,
the first side is flush with the third surface, and
the second side surface is flush with the fourth surface.

Supplementary Note 8A

The semiconductor device according to supplementary note 7A, in which the second side surface has an internal surface and an external surface, the internal surface being connected to the main surface of the projecting part, and the external surface projecting further outside than the internal surface and being connected to the bottom surface, and the semiconductor device further includes aside surface conductive layer that is formed on one of the plurality of terminals and that covers the internal surface.

Supplementary Note 9A

The semiconductor device according to supplementary note 8A, in which the composition of the side surface conductive layer is the same as the composition of the main surface conductive layer.

Supplementary Note 10A

The semiconductor device according to supplementary note 8A or 9A, in which the internal surface and the external surface are each smoothly connected to the fourth surface.

Supplementary Note 11A

The semiconductor device according to any of supplementary notes 7A to 10A, in which both the first side surface and the second side surface contact the corner where the first direction and the second direction intersect, when viewed in the thickness direction of the semiconductor element.

Supplementary Note 12A

The semiconductor device according to supplementary note 11A, in which the semiconductor element is a Hall element.

Supplementary Note 13A

The semiconductor device according to supplementary note 12A, further including a magnetosensitive layer that is in proximity to the back surface of the semiconductor element, and detects change in magnetic flux density.

Supplementary Note 14A

The semiconductor device according to any of supplementary notes 2A to 13A, further including a wire that electrically connects the front surface of the semiconductor element and the terminal surface of the base part to each other.

Supplementary Note 15A

The semiconductor device according to supplementary note 14A, further including an internal conductive layer that is formed on one of the plurality of terminals and that covers the terminal surface of the base part.

Supplementary Note 16A

The semiconductor device according to supplementary note 15A, in which the internal conductive layer is an Ag layer.

Supplementary Note 17A

The semiconductor device according to any of supplementary notes 1A to 16A, in which a principal part of one of the plurality of terminals is constituted from an alloy whose main component is Cu.

Supplementary Note 18A

The semiconductor device according to any of supplementary notes 1A to 17A, in which the main surface conductive layer includes an alloy layer containing Sn.

Supplementary Note 19A

The semiconductor device according to supplementary note 18A, in which the main surface conductive layer includes a Ni layer and an alloy layer laminated one on the other, and the alloy layer contains Sn.

Supplementary Note 20A

The semiconductor device according to any of supplementary notes 1A to 17A, in which the main surface conductive layer includes an Au layer.

Supplementary Note 21A

The semiconductor device according to supplementary note 20A, in which the main surface conductive layer includes a Pd layer and an Au layer laminated one on the other.

Supplementary Note 22A

The semiconductor device according to supplementary note 21A, in which the main surface conductive layer includes a Ni layer, a Pd layer and an Au layer laminated one on the other.

Supplementary Note 23A

The semiconductor device according to any of supplementary notes 1A to 22A, in which the sealing resin is an epoxy resin containing glass frit.

Supplementary Note 24A

A manufacturing method of a semiconductor device, including preparing a first base material and a second base material, the first base material including a base part, a projecting part and a through part, and being composed of a conductive body, the first base material having a front surface and a back surface that face in opposite directions to each other in the thickness direction, the base part having part of the back surface, the projecting part projecting from the base part in the direction in which the front surface faces and having part of the front surface, the through part reaching from the front surface to the back surface, the second base material supporting the first base material from the back surface and having an exposed part that is exposed through the through part, and the second base material being an electrical insulator;

mounting the semiconductor element on the exposed part of the second base material;

forming a sealing resin that covers the first base material and the semiconductor element;

removing part of both the projecting part of the first base material and the sealing resin and exposing the project ing part from the sealing resin; and forming a conductive layer that covers the projecting part of the first base material exposed from the sealing resin.

Supplementary Note 25A

The manufacturing method of a semiconductor device according to supplementary note 24A, in which in the preparing of the first base material and the second base material, the base part, the projecting part and the through part are formed in the first base material by removing part of the first base material from the front surface.

Supplementary Note 26A

The manufacturing method of a semiconductor device according to supplementary note 25A, in which in the preparing of the first base material and the second base material, a recessed part that is recessed from the front surface is formed in the first base material by primary removal, and the base part, the projecting part and the through part are formed in the first base material by secondary removal.

Supplementary Note 27A

The manufacturing method of a semiconductor device according to supplementary note 26A, in which the primary removal and the secondary removal are both performed by wet etching.

Supplementary Note 28A

The manufacturing method of a semiconductor device according to any of supplementary notes 24A to 27A, in which in the exposing of the projecting part of the first base material from the sealing resin, part of both the projecting part and the sealing resin are removed by mechanical polishing.

Supplementary Note 29A
The manufacturing method of a semiconductor device according to any of supplementary notes 24A to 28A, in which in the forming of the conductive layer, the conductive layer is formed by electrolytic plating.

Supplementary Note 30A
The manufacturing method of a semiconductor device according to supplementary note 29A further including forming, in the first base material from an opposite side to the back surface, a groove that extends in a first direction that is at a right angle to the thickness direction of the first base material, between the exposing of the projecting part of the first base material from the sealing resin and the forming of the conductive layer.

Supplementary Note 31A
A manufacturing method of a semiconductor device according to supplementary note 30A, in which in the forming of the groove, part of the projecting part of the first base material is removed.

Supplementary Note 32A
The manufacturing method of a semiconductor device according to any of supplementary notes 24A to 31A, in which in the mounting of the semiconductor element, the semiconductor element is mounted on the exposed part, by interposing a joining material which is an electrical insulator between the exposed part of the second base material and the semiconductor element.

Supplementary Note 33A
The manufacturing method of a semiconductor device according to any of supplementary notes 24A to 32A, further including forming, by wire bonding, a wire that electrically connects the semiconductor element and the base part of the first base material, between the mounting of the semiconductor element and the forming of the sealing resin.

Supplementary Note 34A
The manufacturing method of a semiconductor device according to any of supplementary notes 24A to 33A, including removing the second base material from the first base material, between the exposing of the projecting part from the sealing resin and the forming of the conductive layer.

Supplementary Note 35A
A mounting structure of a semiconductor device, including:
the semiconductor device according to supplementary note 12A or 13A; and
a wiring board on which the semiconductor device is mounted,
the main surface of the projecting part and the first surface of the sealing resin both opposing the wiring board.

Supplementary Note 1B
A semiconductor device including:
an insulation film that has insulating properties;
a semiconductor element that is mounted on the insulation film and has a front surface and a back surface, the back surface opposing the insulation film and the front surface facing in the opposite direction to the direction in which the back surface faces;
a plurality of terminals that are mounted on the insulation film and that are at a distance from the semiconductor element and electrically connected to the front surface,
a sealing resin that has a third surface and a fourth surface and covers the semiconductor element, the third surface facing in a first direction that is orthogonal to the thickness direction of the semiconductor element, the fourth surface facing in a second direction that is orthogonal to both the thickness direction of the semiconductor element and the first direction, and one of the plurality of terminals being exposed from one of the third surface and the fourth surface.

Supplementary Note 2B
The semiconductor device according to supplementary note 1B, in which one of the plurality of terminals is exposed from both the third surface and the fourth surface.

Supplementary Note 3B
The semiconductor device according to supplementary note 1B or 2B, in which one of the plurality of terminals includes a portion that is exposed from the sealing resin, the portion being covered by the external conductive layer.

Supplementary Note 4B
The semiconductor device according to supplementary note 3B, in which the external conductive layer includes an alloy containing Sn.

Supplementary Note 5B
The semiconductor device according to supplementary note 3B or 4B, further including a heat dissipation layer that contacts the back surface,
the sealing resin having a second surface that faces in the opposite direction to the direction in which the front surface faces, and
the heat dissipation layer being exposed from the second surface.

Supplementary Note 6B
The semiconductor device according to supplementary note 5B, in which the heat dissipation layer has electrical conductivity.

Supplementary Note 7B
The semiconductor device according to supplementary note 5B or 6B, in which the heat dissipation layer has an exposed surface exposed from the sealing resin, the exposed surface being flush with the second surface.

Supplementary Note 8B
The semiconductor device according to any of supplementary notes 3B or 7B, in which the semiconductor element is a Hall element, and
one of the plurality of terminals contacts a corner where the first direction and the second direction intersect, when viewed in the thickness direction of the semiconductor element.

Supplementary Note 9B
The semiconductor device according to supplementary note 8B, in which one of the plurality of terminals includes a base part and a projecting part, the base part being electrically connected to the back surface, and the projecting part projecting from the base part in the direction in which the front surface faces,
the sealing resin has a first surface that faces in the same direction as the direction in which the front surface faces,
the projecting part has a main surface which is flush with the first surface, and
the main surface is covered by the external conductive layer.

Supplementary Note 10B
The semiconductor device according to supplementary note 9B, in which one of the plurality of terminals has a first side surface that faces outside in the first direction and a second side surface that faces outside in the second direction and intersects the first side surface,
the base part has a bottom surface that faces in the same direction as the direction in which the back surface faces,
a recessed part is formed in one of the plurality of terminals, the recessed part being recessed from both the bottom surface and the second side surface, and passing through the one of the plurality of terminals in the first direction, and the sealing resin opposes the recessed part.

Supplementary Note 11B

The semiconductor device according to supplementary note 9B or 10B, in which the projecting part further has a first inner surface, the first inner surface being at a distance from the second side surface in the second direction and intersecting the main surface, the base part has a second inner surface that is at a distance from the second side surface in the second direction, and is connected to the first inner surface, and the first inner surface and the second inner surface are respectively a first curved surface and a second curved surface.

Supplementary Note 12B

The semiconductor device according to supplementary note 11B, in which the first curved surface and the second curved surface are continuously connected to each other, and one of the plurality of terminals includes a point of inflection located at a boundary between the first inner surface and the second inner surface that intersect the first side surface.

Supplementary Note 13B

The semiconductor device according to supplementary note 12B, further including a wire that electrically connects the front surface and the first inner surface to each other.

Supplementary Note 14B

A mounting structure of a semiconductor device, including:

the semiconductor device according to supplementary notes 3B to 13B;

a wiring board on which the semiconductor device is mounted; and a conductive joining layer that joins the semiconductor device to the wiring board, the insulation film opposing the wiring board, and the conductive joining layer contacting the external conductive layer.

Supplementary Note 15B

A mounting structure of a semiconductor device, including:

the semiconductor device according to supplementary notes 9B to 13B;

a wiring board on which the semiconductor device is mounted; and a conductive joining layer that joins the semiconductor device to the wiring board, the main surface opposing the wiring board, and the conductive joining layer contacting the external conductive layer.

What is claimed is:

1. A semiconductor device comprising:
a semiconductor element that has a front surface and a back surface, the front surface and the back surface facing in opposite directions to each other in a thickness direction of the semiconductor element;
a plurality of terminals that are disposed at a distance from the semiconductor element and are electrically connected to the front surface; and
a sealing resin that has a first surface facing in a same direction as the direction in which the front surface faces, each of the plurality of terminals having a main surface and a bottom surface that face in opposite directions to each other, the main surface being exposed from the first surface,
wherein one of the terminals includes a surface that is connected to the main surface and the bottom surface, that faces the sealing resin, and that includes a curved portion.

2. The semiconductor device according to claim 1, wherein the main surface is flush with the first surface.

3. The semiconductor device according to claim 1, wherein one of the plurality of terminals includes a main surface conductive layer covering the main surface.

4. The semiconductor device according to claim 3, further comprising:
a heat dissipation layer that contacts the back surface,
wherein the sealing resin has a second surface that faces in an opposite direction to the direction in which the first surface faces, and
the heat dissipation layer is exposed from the second surface.

5. The semiconductor device according to claim 4, wherein the heat dissipation layer has electrical conductivity.

6. The semiconductor device according to claim 4, wherein the heat dissipation layer and the semiconductor element each have a periphery, and
the periphery of the heat dissipation layer has a section located inside the periphery of the semiconductor element, when viewed in the thickness direction of the semiconductor element.

7. The semiconductor device according to claim 4, wherein the heat dissipation layer has an exposed surface exposed from the sealing resin, the exposed surface being flush with the second surface.

8. A semiconductor device comprising:
a semiconductor element that has a front surface and a back surface, the front surface and the back surface facing in opposite directions to each other in a thickness direction of the semiconductor element;
a plurality of terminals that are disposed at a distance from the semiconductor element and are electrically connected to the front surface; and
a sealing resin that has a first surface facing in a same direction as the direction in which the front surface faces, each of the plurality of terminals having a main surface exposed from the first surface,
wherein one of the plurality of terminals includes a main surface conductive layer covering the main surface,
the semiconductor device further comprises a heat dissipation layer that contacts the back surface,
the sealing resin has a second surface that faces in an opposite direction to the direction in which the first surface faces,
the heat dissipation layer is exposed from the second surface,
one of the plurality of terminals has a first side surface and a second side surface, the first side surface facing an outside of the semiconductor device in a first direction orthogonal to the thickness direction of the semiconductor element, and the second side surface facing the outside in a second direction orthogonal to both the thickness direction of the semiconductor element and the first direction,
the sealing resin has a third surface facing in the first direction and a fourth surface facing in the second direction,
the first side surface is flush with the third surface, and the second side surface is flush with the fourth surface.

9. The semiconductor device according to claim 8,
wherein each of the plurality of terminals has a base part and a projecting part, the base part having a bottom surface facing in a same direction as the back surface, and the projecting part projecting from the base part toward the first surface and having the main surface.

10. The semiconductor device according to claim 9,
wherein one of the plurality of terminals is provided with a recessed part, the recessed part being recessed from both the bottom surface and the second side surface, and passing through the one of the plurality of terminals in the first direction, and
the sealing resin opposes the recessed part.

11. The semiconductor device according to claim 9,
wherein the projecting part has a first curved surface, the first curved surface being at a distance from the second side surface in the second direction and intersecting the main surface, and
the base part has a second curved surface, the second curved surface being at a distance from the second side surface in the second direction, and connected to the first curved surface.

12. The semiconductor device according to claim 11,
wherein the first curved surface and the second curved surface are continuously connected to each other, and
one of the plurality of terminals includes a point of inflection located at a boundary between the first curved surface and the second curved surface that intersect the first side surface.

13. The semiconductor device according to claim 12, further comprising a wire that electrically connects the front surface and the first curved surface to each other.

14. The semiconductor device according to claim 13,
wherein one of the plurality of terminals includes an internal conductive layer covering the first curved surface and the second curved surface.

15. The semiconductor device according to claim 9, further comprising an insulation film that contacts the second surface and has insulating properties,
wherein the bottom surface of the base parts and the exposed surface of the heat dissipation layer are covered by the insulation film.

16. The semiconductor device according to claim 15,
wherein one of the plurality of terminals includes an external conductive layer that covers the first side surface, the second side surface, and the main surface conductive layer.

17. The semiconductor device according to claim 16,
wherein the external conductive layer includes an alloy containing Sn.

18. The semiconductor device according to claim 9,
wherein the semiconductor element is a Hall element,
both the first side surface and the second side surface contact a corner where the first direction and the second direction intersect, when viewed in the thickness direction of the semiconductor element.

19. A mounting structure of a semiconductor device, comprising:
the semiconductor device according to claim 16;
a wiring board on which the semiconductor device is mounted; and
a conductive joining layer that joins the semiconductor device to the wiring board,
wherein the insulation film opposes the wiring board, and the conductive joining layer contacts the external conductive layer.

20. A mounting structure of a semiconductor device, comprising:
the semiconductor device according to claim 18,
a wiring board on which the semiconductor device is mounted; and
a conductive joining layer that joins the semiconductor device to the wiring board,
wherein the first surface opposes the wiring board, and the conductive joining layer contacts the external conductive layer.

21. A semiconductor device comprising:
a semiconductor element;
a first electrical conductor spaced apart from the semiconductor element, the first electrical conductor being electrically connected to the semiconductor element;
a second electrical conductor spaced apart from each of the semiconductor element and the first electrical conductor, the second electrical conductor being electrically connected to the semiconductor element;
a sealing resin covering a part of the first electrical conductor and a part of the second electrical conductor,
wherein the sealing resin includes a first surface and a second surface that faces an opposite side of the first surface,
the first electrical conductor includes:
a first end exposed from the first surface of the sealing resin, the first end of the first electrical conductor being flush with the first surface of the sealing resin;
a second end exposed from the second surface of the sealing resin, the second end of the first electrical conductor being flush with the second surface of the sealing resin; and
a connecting surface connecting the first end and the second end, the connecting surface of the first electrical conductor including a curved portion that is covered by the sealing resin, and
the second electrical conductor includes:
a first end exposed from the first surface of the sealing resin, the first end of the second electrical conductor being flush with the first surface of the sealing resin;
a second end exposed from the second surface of the sealing resin, the second end of the second electrical conductor being flush with the second surface of the sealing resin; and
a connecting surface connecting the first end and the second end, the connecting surface of the second electrical conductor including a curved portion that is covered by the sealing resin.

22. The semiconductor device according to claim 21, wherein the curved portion of the connecting surface of the first electrical conductor includes at least one point of inflection.

23. The semiconductor device according to claim 22, wherein each of the at least one point of inflection overlaps the semiconductor element as viewed in a first direction that is parallel to the first surface of the sealing resin.

24. The semiconductor device according to claim 21, further comprising a first electrical insulator,
wherein a part of the semiconductor element includes a portion exposed from the first surface of the sealing resin,
the exposed portion of the semiconductor element is covered by the first electrical insulator.

25. The semiconductor device according to claim 24, further comprising:
a first metal layer located on the second end of the first electrical conductor; and a second metal layer located on the second end of the second electrical conductor.

26. The semiconductor device according to claim 21, further comprising a first wire and a second wire,
wherein the semiconductor element is electrically connected to the first electrical conductor via the first wire, and
the semiconductor element is electrically connected to the second electrical conductor via the second wire.

27. The semiconductor device according to claim 26, wherein the connecting surface of the first electrical conductor includes a first part to which the first wire is bonded, and the first part overlaps the semiconductor element as viewed in a first direction that is parallel to the first surface of the sealing resin, and
the connecting surface of the second electrical conductor includes a second part to which the second wire is bonded, and the second part overlaps the semiconductor element as viewed in the first direction.

28. The semiconductor device according to claim 21, wherein the curved portion of the connecting surface of the first electrical conductor includes two curvatures that are different from each other, and
the curved portion of the connecting surface of the second electrical conductor includes two curvatures that are different from each other.

29. The semiconductor device according to claim 21, wherein the second end of the first electrical conductor is smaller in area as viewed in a second direction perpendicular to the first surface of the sealing resin than the first end of the first electrical conductor, and
the second end of the second electrical conductor is smaller in area as viewed in the second direction than the first end of the second electrical conductor.

30. The semiconductor device according to claim 21, wherein the semiconductor device is rectangular as viewed in a second direction perpendicular to the first surface of the sealing resin, the semiconductor including a plurality of linear edges,
the second end of the first electrical conductor include an edge that has an angle of smaller than 90 degrees as viewed in the second direction relative to one of the edges of the semiconductor device, and
the second end of the second electrical conductor include an edge that has an angle of smaller than 90 degrees as viewed in the second direction relative to one of the edges of the semiconductor device.

31. The semiconductor device according to claim 21, wherein the first end of the first electrical conductor overlaps the second end of the first electrical conductor as viewed in a second direction perpendicular to the first surface of the sealing resin.

32. The semiconductor device according to claim 21, wherein the second end of the first electrical conductor is located inside a periphery of the first end of the first electrical conductor as viewed in a second direction perpendicular to the first surface of the sealing resin.

33. The semiconductor device according to claim 21, wherein the first electrical conductor includes an electrically conductive layer exposed to an outside of the semiconductor device, and
the second electrical conductor includes an electrically conductive layer exposed to the outside of the semiconductor device.

34. The semiconductor device according to claim 21, wherein the semiconductor device is rectangular as viewed in a second direction perpendicular to the first surface of the sealing resin, the semiconductor including a plurality of linear edges, and
the semiconductor element includes an edge that has an angle of smaller than 90 degrees as viewed in the second direction relative to one of the edges of the semiconductor device.

35. The semiconductor device according to claim 21, wherein the semiconductor device is rectangular as viewed in a second direction perpendicular to the first surface of the sealing resin, the semiconductor including four linear edges,
the four edges of the semiconductor include first and second edges of the four edges of the semiconductor that are closer to the first end of the first electrical conductor than the other two edges of the four edges of the semiconductor are,
the first edge of the semiconductor is held in contact with the first end of the first electrical conductor as viewed in the second direction, and
the second edge of the semiconductor is spaced apart from the first end of the first electrical conductor as viewed in the second direction.

* * * * *